United States Patent
Shimizu et al.

(10) Patent No.: US 8,012,669 B2
(45) Date of Patent: Sep. 6, 2011

(54) RESIST COMPOSITION AND METHOD OF FORMING RESIST PATTERN

(75) Inventors: Hiroaki Shimizu, Kawasaki (JP); Yasuhiro Yoshii, Kawasaki (JP); Yoshiyuki Utumi, Kawasaki (JP); Hideo Hada, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 207 days.

(21) Appl. No.: 12/400,203

(22) Filed: Mar. 9, 2009

(65) Prior Publication Data

US 2009/0226842 A1   Sep. 10, 2009

(30) Foreign Application Priority Data

Mar. 10, 2008  (JP) ................................. 2008-060065
Feb. 27, 2009  (JP) ................................. 2009-046064

(51) Int. Cl.
   *G03F 7/00*   (2006.01)
   *G03F 7/004*  (2006.01)

(52) U.S. Cl. .................................................. 430/270.1

(58) Field of Classification Search ............... 430/270.1, 430/913
   See application file for complete search history.

(56) References Cited

U.S. PATENT DOCUMENTS

| | | | |
|---|---|---|---|
| 5,945,517 A | 8/1999 | Nitta et al. | |
| 6,153,733 A | 11/2000 | Yukawa et al. | |
| 7,252,924 B2 * | 8/2007 | Yamanaka et al. | 430/270.1 |
| 7,323,287 B2 | 1/2008 | Iwai et al. | |
| 7,335,454 B2 * | 2/2008 | Kanna et al. | 430/270.1 |
| 7,384,726 B2 * | 6/2008 | Lin et al. | 430/311 |
| 7,579,497 B2 * | 8/2009 | Harada et al. | 560/1 |
| 7,682,772 B2 * | 3/2010 | Seshimo et al. | 430/270.1 |
| 7,713,679 B2 * | 5/2010 | Ishiduka et al. | 430/270.1 |
| 7,767,984 B2 * | 8/2010 | Lin et al. | 250/492.1 |
| 7,771,914 B2 * | 8/2010 | Hatakeyama et al. | 430/270.1 |
| 2008/0096134 A1 * | 4/2008 | Sugimoto et al. | 430/287.1 |
| 2009/0042131 A1 * | 2/2009 | Shiono et al. | 430/285.1 |
| 2009/0068591 A1 * | 3/2009 | Kawaue et al. | 430/285.1 |
| 2009/0197197 A1 * | 8/2009 | Shimizu et al. | 430/270.1 |
| 2009/0253081 A1 * | 10/2009 | Abdallah et al. | 430/324 |

FOREIGN PATENT DOCUMENTS

| | | |
|---|---|---|
| EP | 1600437 A1 * | 11/2005 |
| JP | H09-208554 | 8/1997 |
| JP | H11-035551 | 2/1999 |
| JP | H11-035552 | 2/1999 |
| JP | H11-035573 | 2/1999 |
| JP | H11-322707 | 11/1999 |
| JP | 2003-241385 | 8/2003 |
| JP | 2005-037888 | 2/2005 |
| WO | WO 2004-074242 | 9/2004 |

* cited by examiner

*Primary Examiner* — Amanda C. Walke
(74) *Attorney, Agent, or Firm* — Knobbe, Martens, Olson & Bear, LLP

(57) ABSTRACT

A resist composition including a base component (A) which exhibits changed solubility in an alkali developing solution under action of acid and an acid-generator component (B) which generates acid upon exposure, the acid-generator component (B) including an acid generator (B1) consisting of a compound represented by general formula (b1) shown below (wherein $Q^1$ represents a divalent linkage group containing an oxygen atom; $Y^1$ represents a fluorinated alkylene group of 1 to 4 carbon atoms which may have a substituent, with the proviso that the carbon atom adjacent to the sulfur atom within the $-SO_3^-$ group has a fluorine atom bonded thereto; X represents a hydrocarbon group of 3 to 30 carbon atoms which may have a substituent; and $A^+$ represents an organic cation), and the resist composition further including an organic compound (C) which generates an acid exhibiting a weaker acid strength than the acid generated from the acid generator (B1) upon exposure.

[Chemical Formula 1]

$$X\text{-}Q^1\text{-}Y^1\text{—}SO_3^-A^+ \qquad (b1)$$

8 Claims, No Drawings

RESIST COMPOSITION AND METHOD OF FORMING RESIST PATTERN

TECHNICAL FIELD

The present invention relates to a resist composition and a method of forming a resist pattern using the resist composition.

Priority is claimed on Japanese Patent Application No. 2008-060065, filed Mar. 10, 2008, and Japanese Patent Application No. 2009-46064, filed Feb. 27, 2009, the contents of which are incorporated herein by reference.

BACKGROUND ART

In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film.

A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have lead to rapid progress in the field of pattern miniaturization.

Typically, these miniaturization techniques involve shortening the wavelength of the exposure light source. Conventionally, ultraviolet radiation typified by g-line and i-line radiation has been used, but nowadays KrF excimer lasers and ArF excimer lasers are starting to be introduced in mass production. Furthermore, research is also being conducted into lithography techniques that use an exposure light source having a wavelength shorter than these excimer lasers, such as $F_2$ excimer lasers, electron beam, extreme ultraviolet radiation (EUV), and X ray.

Resist materials for use with these types of exposure light sources require lithography properties such as a high resolution capable of reproducing patterns of minute dimensions, and a high level of sensitivity to these types of exposure light sources.

As a resist material that satisfies these conditions, a chemically amplified composition is used, which includes a base material component that exhibits a changed solubility in an alkali developing solution under the action of acid and an acid generator that generates acid upon exposure.

For example, as a positive chemically amplified resist composition, a composition containing a resin component (a base resin) that exhibits increased solubility in an alkali developing solution under the action of acid and an acid generator component is commonly used. If the resist film formed using the resist composition is selectively exposed during formation of a resist pattern, then within the exposed portions, acid is generated from the acid generator, and the action of this acid causes an increase in the solubility of the resin component in an alkali developing solution, making the exposed portions soluble in the alkali developing solution.

Resins that contain structural units derived from (meth) acrylate esters within the main chain (acrylic resins) are now widely used as base resins for resists that use ArF excimer laser lithography, as they exhibit excellent transparency in the vicinity of 193 nm (for example, see Patent Document 1).

Here, the term "(meth)acrylic acid" is a generic term that includes either or both of acrylic acid having a hydrogen atom bonded to the α-position and methacrylic acid having a methyl group bonded to the α-position. The term "(meth) acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position.

On the other hand, as acid generators usable in a chemically amplified resist composition, various types have been proposed including, for example, onium salt-based acid generators such as iodonium salts and sulfonium salts; oxime sulfonate-based acid generators; diazomethane-based acid generators; nitrobenzylsulfonate-based acid generators; iminosulfonate-based acid generators; and disulfone-based acid generators.

Currently, as acid generators, onium salt-based acid generators having an onium ion such as triphenylsulfonium as the cation moiety are used. As the anion moiety for onium salt-based acid generators, an alkylsulfonate ion or a fluorinated alkylsulfonate ion in which a part or all of the hydrogen atoms within the aforementioned alkylsulfonate ion has been substituted with fluorine atoms is typically used (for example, see Patent Document 2).

PRIOR ART DOCUMENT

[Patent Document]
[Patent Document 1] Japanese Unexamined Patent Application, First Publication No. 2003-241385
[Patent Document 2] Japanese Unexamined Patent Application, First Publication No. 2005-37888

SUMMARY OF THE INVENTION

In recent years, as requirements for high resolution increase with progress in the miniaturization of resist patterns, formation of resist patterns having excellent shape has been demanded. Further, improvement in various lithography properties has also been demanded.

The present invention takes the above circumstances into consideration, with an object of providing a resist composition and a method of forming a resist pattern which enable formation of a resist pattern having an excellent shape, and exhibit excellent lithography properties.

For solving the above-mentioned problems, the present invention employs the following aspects.

Specifically, a first aspect of the present invention is a resist composition including a base component (A) which exhibits changed solubility in an alkali developing solution under action of acid and an acid-generator component (B) which generates acid upon exposure, the acid-generator component (B) including an acid generator (B1) consisting of a compound represented by general formula (b1) shown below, and the resist composition further including an organic compound (C) which generates an acid exhibiting a weaker acid strength than the acid generated from the acid generator (B1) upon exposure.

[Chemical Formula 1]

$$X\text{-}Q^1\text{-}Y^1\text{—}SO_3^-A^+ \tag{b1}$$

wherein $Q^1$ represents a divalent linkage group containing an oxygen atom; $Y^1$ represents a fluorinated alkylene group of 1 to 4 carbon atoms which may have a substituent, with the proviso that the carbon atom adjacent to the sulfur atom within the —$SO_3^-$ group has a fluorine atom bonded thereto; X represents a hydrocarbon group of 3 to 30 carbon atoms which may have a substituent; and $A^+$ represents an organic cation.

A second aspect of the present invention is a method of forming a resist pattern, including forming a resist film using a resist composition according to the first aspect, subjecting the resist film to exposure, and subjecting the resist film to alkali developing to form a resist pattern.

In the present description and claims, an "alkyl group" includes linear, branched or cyclic, monovalent saturated hydrocarbon, unless otherwise specified.

The term "alkylene group" includes linear, branched or cyclic divalent saturated hydrocarbon, unless otherwise specified.

A "lower alkyl group" is an alkyl group of 1 to 5 carbon atoms.

A "halogenated alkyl group" is a group in which a part or all of the hydrogen atoms of an alkyl group is substituted with halogen atoms. Examples of halogen atoms include fluorine atoms, chlorine atoms, bromine atoms and iodine atoms.

The term "aliphatic" is a relative concept used in relation to the term "aromatic", and defines a group or compound that has no aromaticity.

The term "structural unit" refers to a monomer unit that contributes to the formation of a polymeric compound (polymer, copolymer).

The term "exposure" is used as a general concept that includes irradiation with any form of radiation.

According to the present invention, there are provided a resist composition and a method of forming a resist pattern which enable formation of a resist pattern having an excellent shape, and exhibit excellent lithography properties.

DETAILED DESCRIPTION OF THE INVENTION

<<Resist Composition>>

The resist composition according to the first aspect of the present invention includes a base component (A) which exhibits changed solubility in an alkali developing solution under action of acid, and an acid-generator component (B) which generates acid upon exposure.

With respect to a resist film formed using the resist composition, when a selective exposure is conducted during formation of a resist pattern, acid is generated from the component (B), and the generated acid acts on the component (A) to change the solubility of the component (A) in an alkali developing solution. As a result, the solubility of the exposed portions in an alkali developing solution is changed, whereas the solubility of the unexposed portions in an alkali developing solution remains unchanged. Therefore, the exposed portions are dissolved and removed by alkali developing in the case of a positive resist composition, whereas unexposed portions are dissolved and removed in the case of a negative resist composition, and hence, a resist pattern can be formed.

The resist composition of the present invention may be either a negative resist composition or a positive resist composition.

<Component (A)>

As the component (A), an organic compound typically used as a base component for a chemically amplified resist composition can be used alone, or two or more of such organic compounds can be mixed together.

Here, the term "base component" refers to an organic compound capable of forming a film, and is preferably an organic compound having a molecular weight of 500 or more. When the organic compound has a molecular weight of 500 or more, the film-forming ability is improved, and a resist pattern of nano level can be easily formed.

The organic compounds having a molecular weight of 500 or more are broadly classified into low molecular weight organic compounds having a molecular weight of 500 to less than 2,000 (hereafter, frequently referred to as "low molecular weight compounds") and high molecular weight resins (polymeric materials) having a molecular weight of 2,000 or more. Generally, as the aforementioned low molecular weight compound, a non-polymer is used. With respect to the aforementioned resin (polymer or copolymer), the molecular weight is the polystyrene equivalent value determined by gel permeation chromatography (GPC). Hereafter, a "resin" refers to a resin having a molecular weight of 2,000 or more.

As the component (A), a resin which exhibits changed solubility in an alkali developing solution under action of acid may be used. Alternatively, as the component (A), a low molecular weight material which exhibits changed solubility in an alkali developing solution under action of acid may be used.

When the resist composition of the present invention is a negative resist composition, for example, as the component (A), a base component that is soluble in an alkali developing solution is used, and a cross-linking agent is blended in the negative resist composition.

In the negative resist composition, when acid is generated from the component (B) upon exposure, the action of the generated acid causes cross-linking between the base component and the cross-linking agent, and the cross-linked portion becomes insoluble in an alkali developing solution. Therefore, in the formation of a resist pattern, by conducting selective exposure of a resist film formed by applying the negative resist composition onto a substrate, the exposed portions become insoluble in an alkali developing solution, whereas the unexposed portions remain soluble in an alkali developing solution, and hence, a resist pattern can be formed by alkali developing.

Generally, as the component (A) for a negative resist composition, a resin that is soluble in an alkali developing solution (hereafter, referred to as "alkali-soluble resin") is used.

As the alkali-soluble resin, it is preferable to use a resin having a structural unit derived from at least one of α-(hydroxyalkyl)acrylic acid and a lower alkyl ester of α-(hydroxyalkyl)acrylic acid, or a resin having a fluorinated alcohol as disclosed in Japanese Unexamined Patent Application, First Publication No. 2005-336452 or 2006-259582, as it enables formation of a satisfactory resist pattern with minimal swelling. Here, the term "α-(hydroxyalkyl) acrylic acid" refers to one or both of acrylic acid in which a hydrogen atom is bonded to the carbon atom on the α-position having the carboxyl group bonded thereto, and α-hydroxyalkylacrylic acid in which a hydroxyalkyl group (preferably a hydroxyalkyl group of 1 to 5 carbon atoms) is bonded to the carbon atom on the α-position.

As the cross-linking agent, typically, an amino-based cross-linking agent such as a glycoluril having a methylol group or alkoxymethyl group is preferable, as it enables formation of a resist pattern with minimal swelling. The amount of the cross-linking agent added is preferably within the range from 1 to 50 parts by weight, relative to 100 parts by weight of the alkali-soluble resin.

When the resist composition of the present invention is a positive resist composition, as the component (A), a base component (A') which exhibits increased solubility in an alkali developing solution by action of acid (hereafter, referred to as "component (A')") is used. The component (A') is insoluble in an alkali developing solution prior to exposure, and when acid is generated from the component (B) upon exposure, the solubility of the component (A') in an alkali developing solution increases. Therefore, in the formation of a resist pattern, by conducting selective exposure of a resist film formed by applying the positive resist composition onto a substrate, the exposed portions changes from an insoluble state to a soluble state in an alkali developing solution, whereas the unexposed portions remain insoluble in an alkali developing solution, and hence, a resist pattern can be formed by alkali developing.

In the resist composition of the present invention, the component (A) is preferably a base component (A') which exhibits increased solubility in an alkali developing solution under action of acid. That is, the resist composition of the present invention is preferably a positive resist composition.

The component (A') may be a resin component (A1) which exhibits increased solubility in an alkali developing solution under action of acid (hereafter, referred to as "component (A1)"), a low molecular weight compound (A2) which exhibits increased solubility in an alkali developing solution under action of acid (hereafter, referred to as "component (A2)"), or a mixture of the component (A1) and the component (A2).

[Component (A1)]

As the component (A1), a resin component (base resin) typically used as a base component for a chemically amplified resist composition can be used alone, or two or more of such resin components can be mixed together.

In the present invention, it is preferable that the component (A1) include a structural unit derived from an acrylate ester.

In the present descriptions and the claims, the term "structural unit derived from an acrylate ester" refers to a structural unit which is formed by the cleavage of the ethylenic double bond of an acrylate ester.

The term "acrylate ester" is a generic term that includes acrylate esters having a hydrogen atom bonded to the carbon atom on the α-position, and acrylate esters having a substituent (an atom other than a hydrogen atom or a group) bonded to the carbon atom on the α-position. As the substituent, a lower alkyl group or a halogenated lower alkyl group can be used.

With respect to the "structural unit derived from an acrylate ester", the "α-position (the carbon atom on the α-position)" refers to the carbon atom having the carbonyl group bonded thereto, unless specified otherwise.

With respect to the acrylate ester, specific examples of the lower alkyl group for the substituent at the α-position include linear or branched alkyl groups such as a methyl group, ethyl group, propyl group, isopropyl group, n-butyl group, isobutyl group, tert-butyl group, pentyl group, isopentyl group, and neopentyl group.

Specific examples of the halogenated lower alkyl group include groups in which some or all of the hydrogen atoms of the aforementioned "lower alkyl group for the substituent at the α-position" are substituted with halogen atoms. Examples of halogen atoms include fluorine atoms, chlorine atoms, bromine atoms and iodine atoms, and fluorine atoms are particularly desirable.

In the present invention, it is preferable that a hydrogen atom, a lower alkyl group or a halogenated lower alkyl group is bonded to the α-position of the acrylate ester, more preferably a hydrogen atom, a lower alkyl group or a fluorinated lower alkyl group. In terms of industrial availability, a hydrogen atom or a methyl group is particularly desirable.

It is particularly desirable that the component (A1) have a structural unit (a1) derived from an acrylate ester containing an acid dissociable, dissolution inhibiting group.

Further, it is preferable that the component (A1) have a structural unit (a2) derived from an acrylate ester containing a lactone-containing cyclic group, as well as the structural unit (a1).

Furthermore, it is preferable that the component (A1) have a structural unit (a3) derived from an acrylate ester containing a polar group-containing aliphatic hydrocarbon group, as well as the structural unit (a1), or the structural unit (a1) and the structural unit (a2).

Still further, it is preferable that the component (A1) have a structural unit (a0) represented by general formula (a0-1) shown below, as well as the structural unit (a1).

Still further, it is preferable that the component (A1) have a structural unit (a3), as well as the structural unit (a1) and the structural unit (a0).

Structural Unit (a1)

As the acid dissociable, dissolution inhibiting group in the structural unit (a1), any of the groups that have been proposed as acid dissociable, dissolution inhibiting groups for the base resins of chemically amplified resists can be used, provided the group has an alkali dissolution-inhibiting effect that renders the entire component (A1) insoluble in an alkali developing solution prior to dissociation, and then following dissociation by action of acid, increases the solubility of the entire component (A1) in the alkali developing solution.

Generally, groups that form either a cyclic or chain-like tertiary alkyl ester with the carboxyl group of the (meth) acrylic acid, and acetal-type acid dissociable, dissolution inhibiting groups such as alkoxyalkyl groups are widely known.

Here, a tertiary alkyl ester describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(O)—O—). In tis tertiary alkyl ester, the action of acid causes cleavage of the bond between the oxygen atom and the tertiary carbon atom.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable, dissolution inhibiting groups".

Examples of tertiary alkyl ester-type acid dissociable, dissolution inhibiting groups include aliphatic branched, acid dissociable, dissolution inhibiting groups and aliphatic cyclic group-containing acid dissociable, dissolution inhibiting groups.

The term "aliphatic branched" refers to a branched structure having no aromaticity.

The "aliphatic branched, acid dissociable, dissolution inhibiting group" is not limited to be constituted of only carbon atoms and hydrogen atoms (not limited to hydrocarbon groups), but is preferably a hydrocarbon group.

Further, the "hydrocarbon group" may be either saturated or unsaturated, but is preferably saturated.

Examples of aliphatic branched, acid dissociable, dissolution inhibiting groups include tertiary alkyl groups of 4 to 8 carbon atoms, and specific examples include a tert-butyl group, tert-pentyl group and ten-heptyl group.

The term "aliphatic cyclic group" refers to a monocyclic group or polycyclic group that has no aromaticity.

The "aliphatic cyclic group" within the structural unit (a1) may or may not have a substituent. Examples of substituents include lower alkyl groups of 1 to 5 carbon atoms, fluorine atom, fluorinated lower alkyl groups of 1 to 5 carbon atoms, and oxygen atom (=O).

The basic ring of the "aliphatic cyclic group" exclusive of substituents is not limited to be constituted from only carbon and hydrogen (not limited to hydrocarbon groups), but is preferably a hydrocarbon group. Further, the "hydrocarbon group" may be either saturated or unsaturated, but is preferably saturated. Furthermore, the "aliphatic cyclic group" is preferably a polycyclic group.

As such aliphatic cyclic groups, groups in which one or more hydrogen atoms have been removed from a monocycloalkane or a polycycloalkane such as a bicycloalkane, tricycloalkane or tetracycloalkane which may or may not be substituted with a lower alkyl group, a fluorine atom or a fluorinated lower alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

As the aliphatic cyclic group-containing acid dissociable, dissolution inhibiting group, for example, a group which has a tertiary carbon atom on the ring structure of the cycloalkyl group can be used. Specific examples include 2-methyl-2-adamantyl group and a 2-ethyl-2-adamantyl group. Further, groups having an aliphatic cyclic group such as an adamantyl group, cyclohexyl group, cyclopentyl group, norbornyl group, tricyclodecanyl group or tetracyclododecanyl group, and a branched alkylene group having a tertiary carbon atom bonded thereto, as the groups bonded to the oxygen atom of the carbonyl group (—C(O)—O—) within the structural units represented by general formulas (a1"-1) to (a1"-6) shown below, can be used.

[Chemical Formula 2]

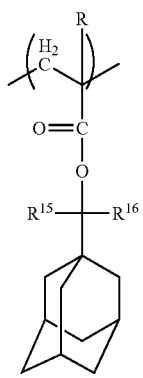

(a1"-1)

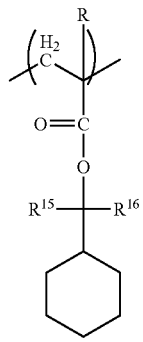

(a1"-2)

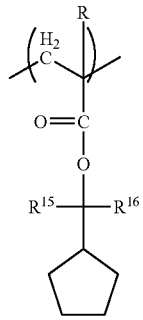

(a1"-3)

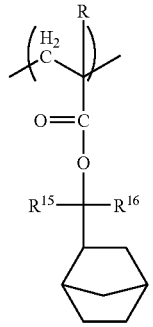

(a1"-4)

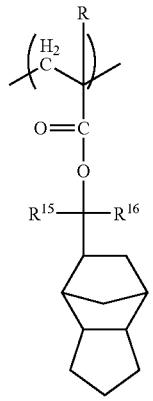

(a1"-5)

(a1″-6)

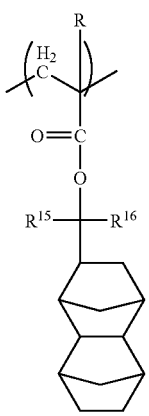

wherein R represents a hydrogen atom, a lower alkyl group or a halogenated lower alkyl group; and $R^{15}$ and $R^{16}$ each independently represents an alkyl group (which may be linear or branched, and preferably has 1 to 5 carbon atoms).

In general formulas (a1″-1) to (a1″-6) above, the lower alkyl group or halogenated lower alkyl group for R are the same as the lower alkyl group or halogenated lower alkyl group which can be bonded to the α-position of the aforementioned acrylate ester.

An "acetal-type acid dissociable, dissolution inhibiting group" generally substitutes a hydrogen atom at the terminal of an alkali-soluble group such as a carboxy group or hydroxyl group, so as to be bonded with an oxygen atom. When acid is generated upon exposure, the generated acid acts to break the bond between the acetal-type acid dissociable, dissolution inhibiting group and the oxygen atom to which the acetal-type, acid dissociable, dissolution inhibiting group is bonded.

Examples of acetal-type acid dissociable, dissolution inhibiting groups include groups represented by general formula (p1) shown below.

[Chemical Formula 3]

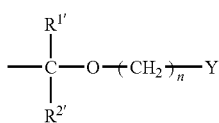

(p1)

wherein $R^{1\prime}$ and $R^{2\prime}$ each independently represents a hydrogen atom or a lower alkyl group; n represents an integer of 0 to 3; and Y represents a lower alkyl group or an aliphatic cyclic group.

In general formula (p1) above, n is preferably an integer of 0 to 2, more preferably 0 or 1, and most preferably 0.

As the lower alkyl group for $R^{1\prime}$ and $R^{2\prime}$, the same as the lower alkyl groups for R above can be used. As the lower alkyl group for $R^{1\prime}$ and $R^{2\prime}$, a methyl group or ethyl group is preferable, and a methyl group is particularly desirable.

In the present invention, it is preferable that at least one of $R^{1\prime}$ and $R^{2\prime}$ be a hydrogen atom. That is, it is preferable that the acid dissociable, dissolution inhibiting group (p1) is a group represented by general formula (p1-1) shown below.

[Chemical Formula 4]

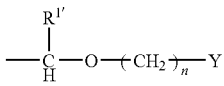

(p1-1)

wherein $R^{1\prime}$, n and Y are as defined above.

As the lower alkyl group for Y, the same as the lower alkyl groups for R above can be used.

As the aliphatic cyclic group for Y, any of the aliphatic monocyclic/polycyclic groups which have been proposed for conventional ArF resists and the like can be appropriately selected for use. For example, the same groups described above in connection with the "aliphatic cyclic group" can be used.

Further, as the acetal-type, acid dissociable, dissolution inhibiting group, groups represented by general formula (p2) shown below can also be used.

[Chemical Formula 5]

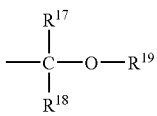

(p2)

wherein $R^{17}$ and $R^{18}$ each independently represents a linear or branched alkyl group or a hydrogen atom; and $R^{19}$ represents a linear, branched or cyclic alkyl group; or $R^{17}$ and $R^{19}$ each independently represents a linear or branched alkylene group, wherein the terminal of $R^{17}$ is bonded to the terminal of $R^{19}$ to form a ring.

The alkyl group for $R^{17}$ and $R^{18}$ preferably has 1 to 15 carbon atoms, and may be either linear or branched. As the alkyl group, an ethyl group or a methyl group is preferable, and a methyl group is most preferable.

It is particularly desirable that either one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cycloalkyl group, it preferably has 4 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane. Of these, a group in which one or more hydrogen atoms have been removed from adamantane is preferable.

In general formula (p2) above, $R^{17}$ and $R^{19}$ may each independently represent a linear or branched alkylene group (preferably an alkylene group of 1 to 5 carbon atoms), and the terminal of $R^{19}$ may be bonded to the terminal of $R^{17}$.

In such a case, a cyclic group is formed by $R^{17}$, $R^{19}$, the oxygen atom having $R^{19}$ bonded thereto and the carbon atom having the oxygen atom and $R^{17}$ bonded thereto. Such a cyclic group is preferably a 4 to 7-membered ring, and more preferably a 4 to 6-membered ring. Specific examples of the cyclic group include tetrahydropyranyl group and tetrahydrofuranyl group.

As the structural unit (a1), it is preferable to use at least one member selected from the group consisting of structural units represented by formula (a1-0-1) shown below and structural units represented by formula (a1-0-2) shown below.

[Chemical Formula 6]

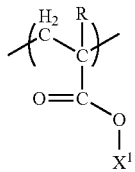

(a1-0-1)

wherein R represents a hydrogen atom, a lower alkyl group or a halogenated lower alkyl group; and $X^1$ represents an acid dissociable, dissolution inhibiting group.

[Chemical Formula 7]

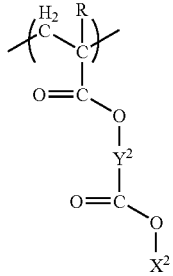

(a1-0-2)

wherein R represents a hydrogen atom, a lower alkyl group or a halogenated lower alkyl group; $X^2$ represents an acid dissociable, dissolution inhibiting group; and $Y^2$ represents a divalent linkage group.

In general formula (a1-0-1) shown above, lower alkyl group and halogenated lower alkyl group for R are the same as the lower alkyl group and halogenated lower alkyl group which can be bonded to the α-position of the aforementioned acrylate ester.

$X^1$ is not particularly limited as long as it is an acid dissociable, dissolution inhibiting group. Examples thereof include the aforementioned tertiary alkyl ester-type acid dissociable, dissolution inhibiting groups and acetal-type acid dissociable, dissolution inhibiting groups, and tertiary alkyl ester-type acid dissociable, dissolution inhibiting groups are preferable.

In general formula (a1-0-2), R is as defined above.

$X^2$ is the same as $X^1$ in general formula (a1-0-1).

As the divalent linkage group for $Y^2$, an alkylene group, a divalent aliphatic cyclic group or a divalent linkage group containing a hetero atom can be used.

As the aliphatic cyclic group, the same as those used above in connection with the explanation of "aliphatic cyclic group" can be used, except that two hydrogen atoms have been removed therefrom.

When $Y^2$ represents an alkylene group, it preferably has 1 to 10 carbon atoms, more preferably 1 to 6, still more preferably 1 to 4, and most preferably 1 to 3.

When $Y^2$ represents a divalent aliphatic cyclic group, it is particularly desirable that the divalent aliphatic cyclic group be a group in which two or more hydrogen atoms have been removed from cyclopentane, cyclohexane, norbornane, isobornane, adamantane, tricyclodecane or tetracyclododecane.

When $Y^2$ represents a divalent linkage group containing a hetero atom, for example, —O—, —C(=O)—O—, —C(=O)—, —O—C(=O)—O—, —C(=O)—NH—, —NH— (wherein H may be substituted with an alkyl group, acyl group or the like), —S—, —S(=O)$_2$—, —S(=O)$_2$—O—, or -A-O—B— (wherein each of A and B independently represents a divalent hydrocarbon group which may have a substituent, and O is an oxygen atom) can be used.

When $Y^2$ is —NH—, the substituent for H (an alkyl group, an acyl group or the like) preferably has 1 to 10 carbon atoms, more preferably 1 to 8, and most preferably 1 to 5.

When $Y^2$ is "A-O—B", each of A and B independently represents a divalent hydrocarbon group which may have a substituent.

When a hydrocarbon "has a substituent", it means that a part or all of the hydrogen atoms within the hydrocarbon group is substituted with groups or atoms other than hydrogen atom.

The hydrocarbon group for A may be either an aliphatic hydrocarbon group, or an aromatic hydrocarbon group.

An "aliphatic hydrocarbon group" refers to a hydrocarbon group that has no aromaticity.

The aliphatic hydrocarbon group for A may be either saturated or unsaturated. In general, the aliphatic hydrocarbon group is preferably saturated.

As specific examples of the aliphatic hydrocarbon group for A, a linear or branched aliphatic hydrocarbon group, and an aliphatic hydrocarbon group having a ring in the structure thereof can be given.

The linear or branched aliphatic hydrocarbon group preferably has 1 to 10 carbon atoms, more preferably 1 to 8, still more preferably 2 to 5, and most preferably 2.

As the linear aliphatic hydrocarbon group, a linear alkylene group is preferable, and specific examples include a methylene group, an ethylene group [—(CH$_2$)$_2$—], a trimethylene group [—(CH$_2$)$_3$—], a tetramethylene group [—(CH$_2$)$_4$—] and a pentamethylene group [—(CH$_2$)$_5$—].

As the branched aliphatic hydrocarbon groups a branched alkylene group is preferable, and specific examples include alkylalkylene groups, e.g., alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$; alkylethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$— and —CH(CH$_2$CH$_3$)CH$_2$—; alkyltrimethylene groups such as —CH(CH$_3$)CH$_2$CH$_2$— and —CH$_2$CH(CH$_3$)CH$_2$—; and alkyltetramethylene groups such as —CH(CH$_3$)CH$_2$CH$_2$CH$_2$— and —CH$_2$CH(CH$_3$)CH$_2$CH$_2$—. As the alkyl group within the alkylalkylene group, a linear alkyl group of 1 to 5 carbon atoms is preferable.

The linear or branched aliphatic hydrocarbon group (chain-like aliphatic hydrocarbon group) may or may not have a substituent. Examples of substituents include a fluorine atom, a fluorinated lower alkyl group of 1 to 5 carbon atoms, and an oxygen atom (=O).

As examples of the hydrocarbon group containing a ring, a cyclic aliphatic hydrocarbon group (a group in which two hydrogen atoms have been removed from an aliphatic hydrocarbon ring), and a group in which the cyclic aliphatic hydrocarbon group is bonded to the terminal of the aforementioned chain-like aliphatic hydrocarbon group or interposed within the aforementioned chain-like aliphatic hydrocarbon group, can be given.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two hydrogen atoms have been removed from a monocycloalkane of 3 to 6 carbon atoms is preferable. Examples of the monocycloalkane include cyclopentane and cyclohexane.

As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent. Examples of substituents include a lower alkyl group of 1 to 5 carbon atoms, a fluorine atom, a fluorinated lower alkyl group of 1 to 5 carbon atoms, and an oxygen atom (=O).

As A, a linear aliphatic hydrocarbon group is preferable, more preferably a linear alkylene group, still more preferably a linear alkylene group of 2 to 5 carbon atoms, and most preferably an ethylene group.

As the hydrocarbon group for B, the same divalent hydrocarbon groups as those described above for A can be used.

As B, a linear or branched aliphatic hydrocarbon group is preferable, and a methylene group or an alkylmethylene group is particularly desirable.

The alkyl group within the alkyl methylene group is preferably a linear alkyl group of 1 to 5 carbon atoms, more preferably a linear alkyl group of 1 to 3 carbon atoms, and most preferably a methyl group.

Specific examples of the structural unit (a1) include structural units represented by general formulas (a1-1) to (a1-4) shown below.

[Chemical Formula 8]

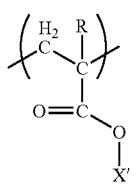
(a1-1)

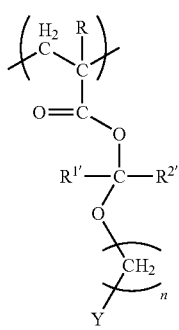
(a1-2)

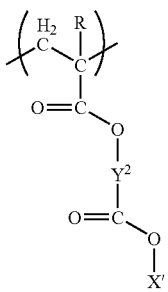
(a1-3)

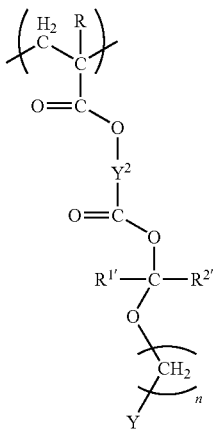
(a1-4)

wherein X' represents a tertiary alkyl ester-type acid dissociable, dissolution inhibiting group; Y represents a lower alkyl group of 1 to 5 carbon atoms or an aliphatic cyclic group; n represents an integer of 0 to 3; $Y^2$ represents an alkylene groups a divalent aliphatic cyclic group or "A-O—B" (wherein A and B are as defined above); R is as defined above; and each of $R^{1\prime}$ and $R^{2\prime}$ independently represents a hydrogen atom or a lower alkyl group of 1 to 5 carbon atoms.

Examples of the tertiary alkyl ester-type acid dissociable, dissolution inhibiting group for X' include the same tertiary alkyl ester-type acid dissociable, dissolution inhibiting groups as those described above for $X^1$.

As $R^{1\prime}$, $R^{2\prime}$, n and Y, the same as $R^{1\prime}$, $R^{2\prime}$, n and Y defined for general formula (p1) described above in connection with the "acetal-type acid dissociable, dissolution inhibiting group" may be used.

As $Y^2$, the same as $Y^2$ defined for general formula (a1-0-2) above may be used.

Specific examples of structural units represented by general formula (a1-1) to (a1-4) are shown below.

[Chemical Formula 9]

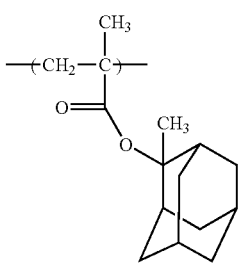
(a1-1-1)

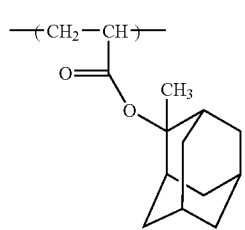 (a1-1-2)
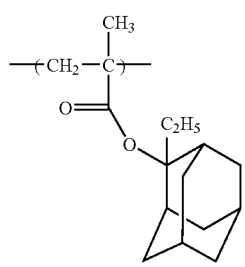 (a1-1-3)
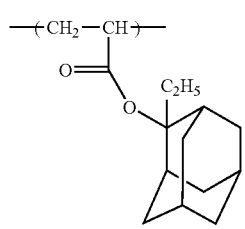 (a1-1-4)
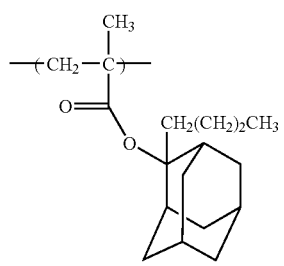 (a1-1-5)
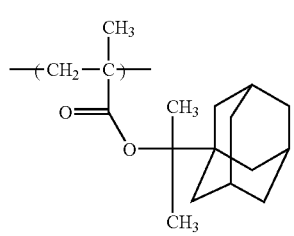 (a1-1-6)
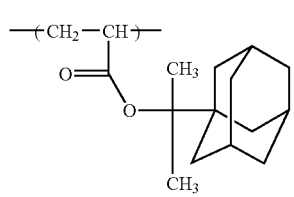 (a1-1-7)
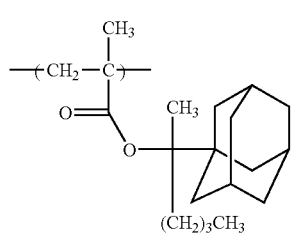 (a1-1-8)
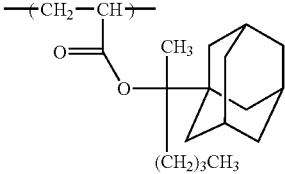 (a1-1-9)
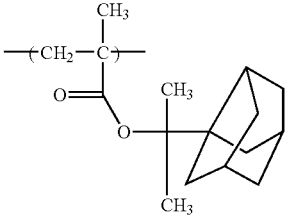 (a1-1-10)
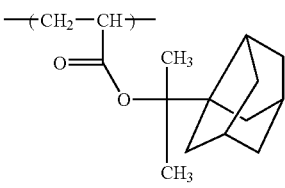 (a1-1-11)
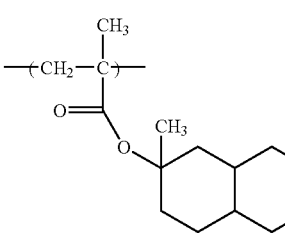 (a1-1-12)
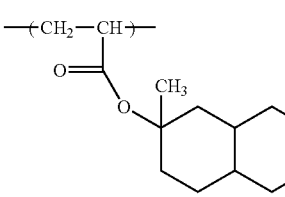 (a1-1-13)
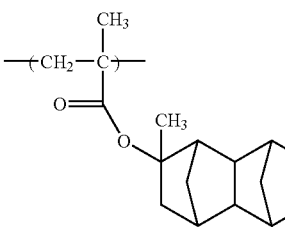 (a1-1-14)
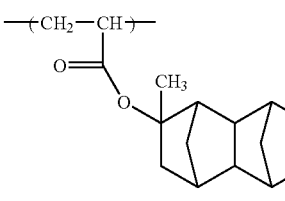 (a1-1-15)

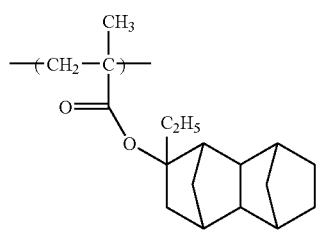 (a1-1-16)
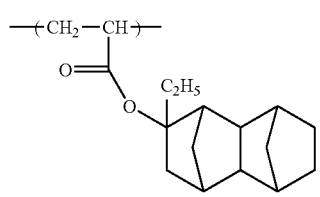 (a1-1-17)
[Chemical Formula 10]
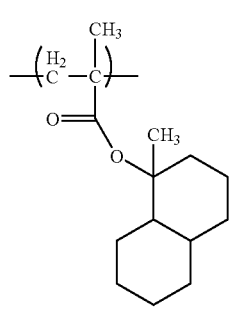 (a1-1-18)
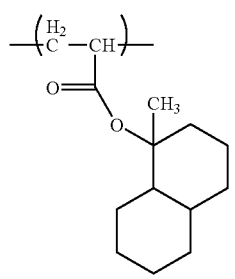 (a1-1-19)
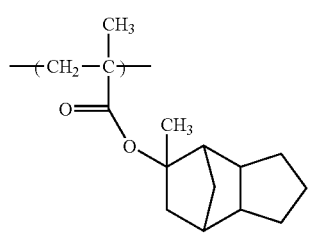 (a1-1-20)
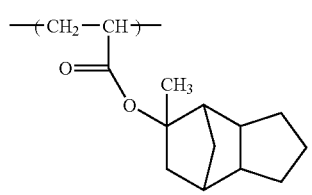 (a1-1-21)
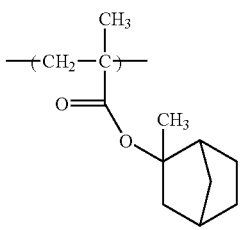 (a1-1-22)
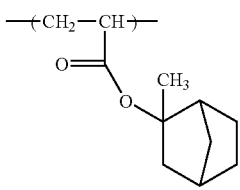 (a1-1-23)
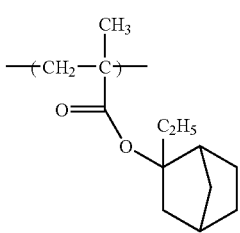 (a1-1-24)
(a1-1-25)
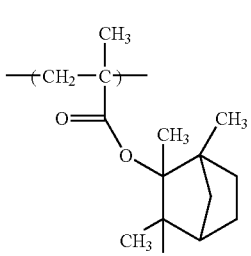 (a1-1-26)
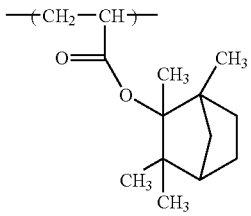 (a1-1-27)
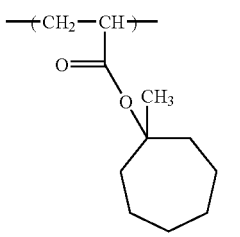 (a1-1-28)

(a1-1-29)
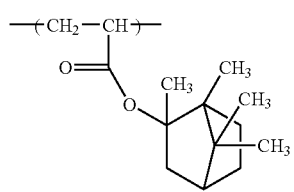
(a1-1-30)
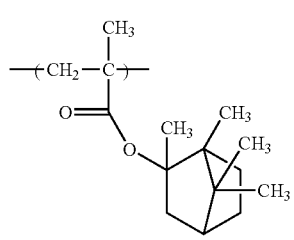
(a1-1-31)
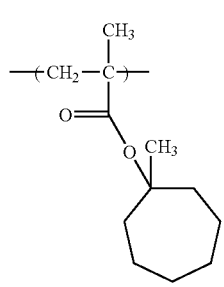
(a1-1-32)
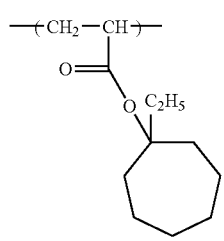
(a1-1-33)
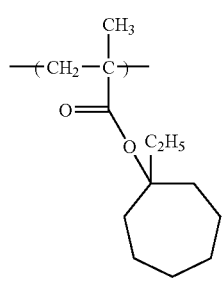
[Chemical Formula 11]
(a1-1-34)
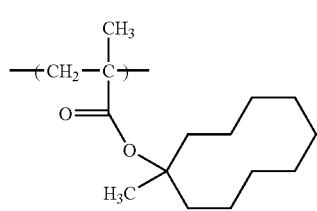
(a1-1-35)
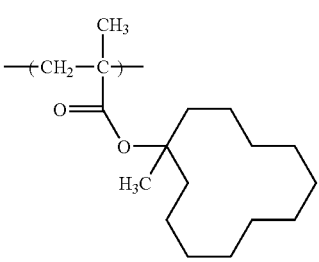
(a1-1-36)
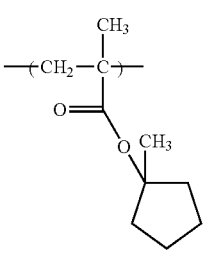
(a1-1-37)
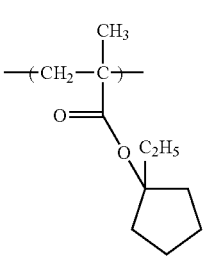
(a1-1-38)
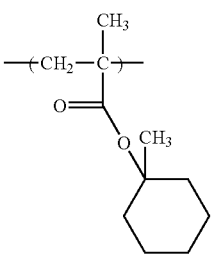
(a1-1-39)
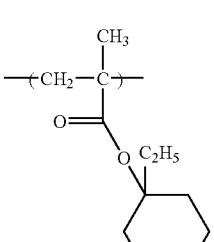
(a1-1-40)
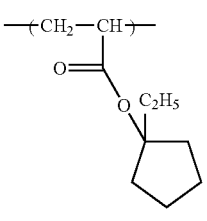

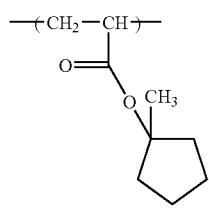 (a1-1-41)
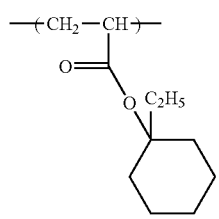 (a1-1-42)
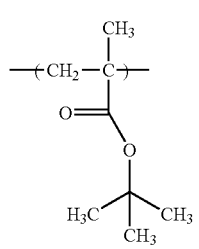 (a1-1-43)
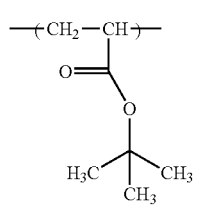 (a1-1-44)
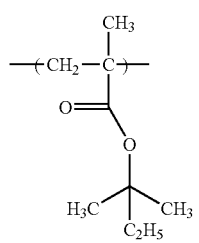 (a1-1-45)
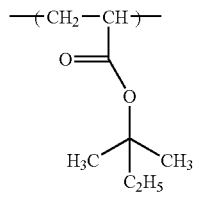 (a1-1-46)
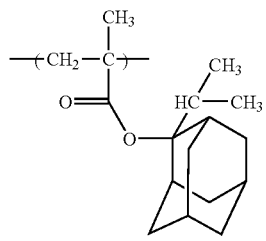 (a1-1-47)
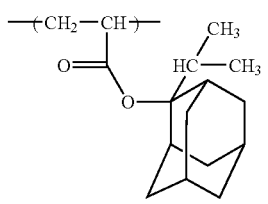 (a1-1-48)
[Chemical Formula 12]
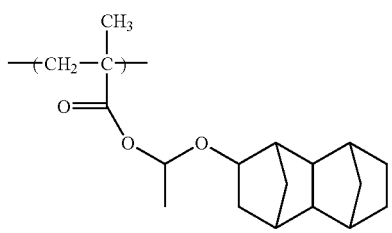 (a1-2-1)
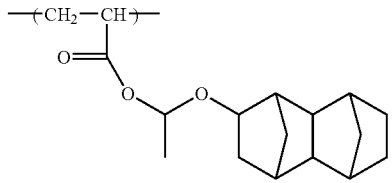 (a1-2-2)
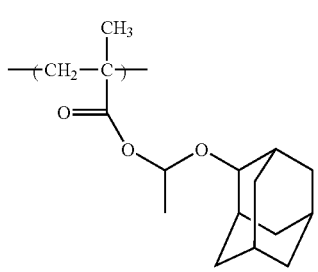 (a1-2-3)
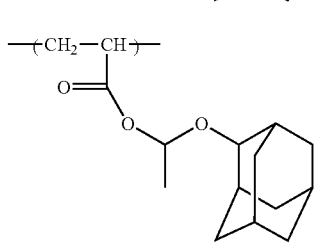 (a1-2-4)
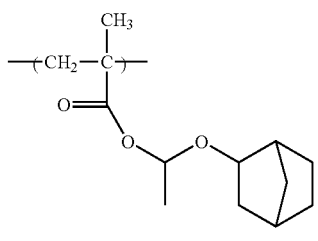 (a1-2-5)
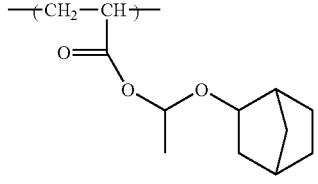 (a1-2-6)

[Chemical Formula 13]
(a1-2-7)
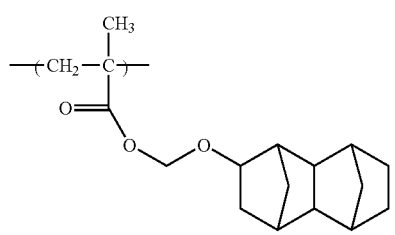
(a1-2-8)
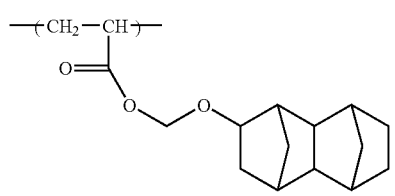
(a1-2-9)
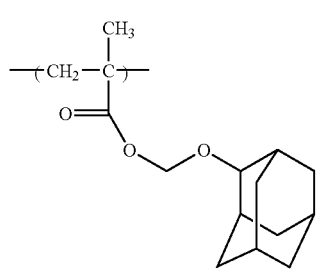
(a1-2-10)
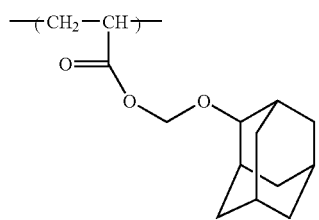
(a1-2-11)
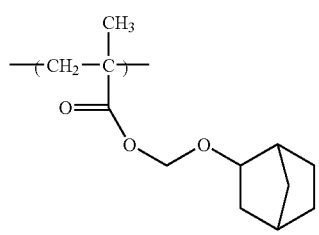
(a1-2-12)
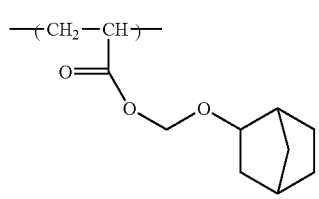
(a1-2-13)
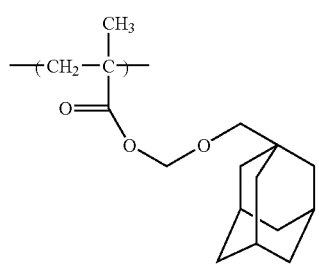
(a1-2-14)
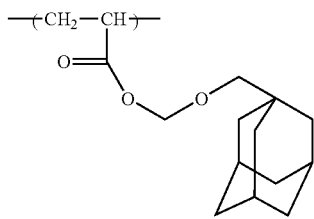
(a1-2-15)
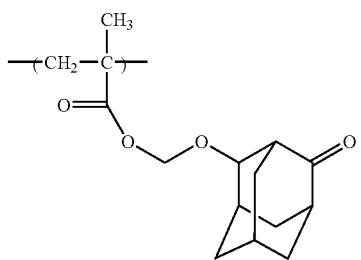
(a1-2-16)
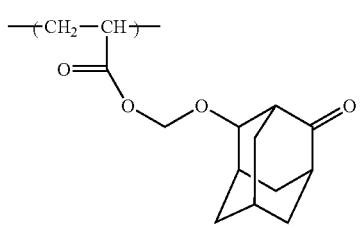
(a1-2-17)
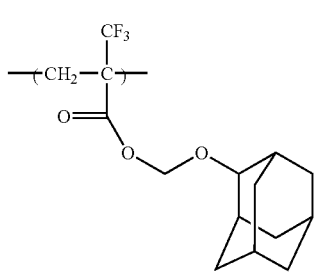
(a1-2-18)
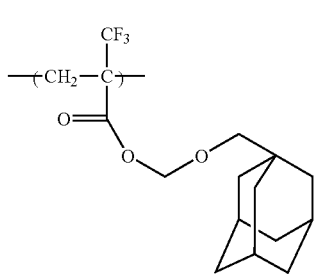
(a1-2-19)
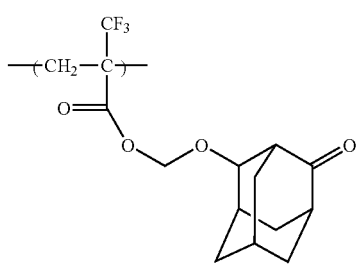

[Chemical Formula 14]
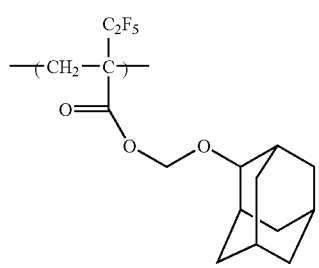 (a1-2-20)
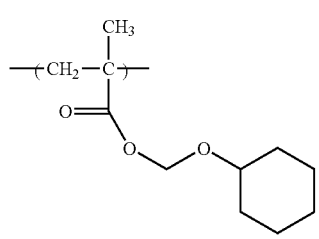 (a1-2-21)
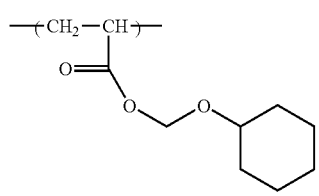 (a1-2-22)
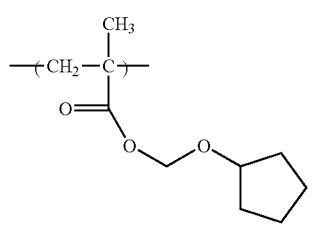 (a1-2-23)
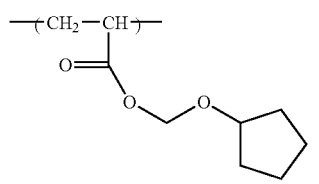 (a1-2-24)
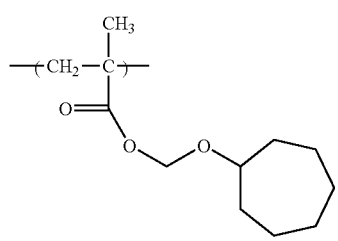 (a1-2-25)
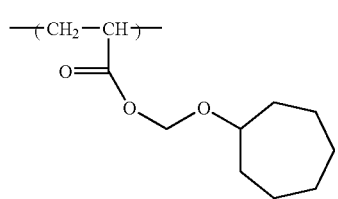 (a1-2-26)
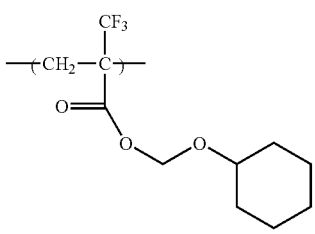 (a1-2-27)
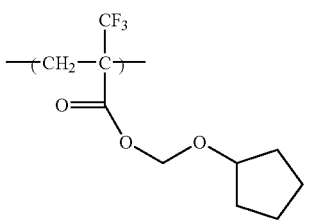 (a1-2-28)
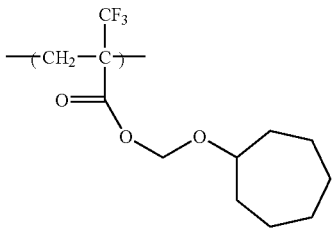 (a1-2-29)
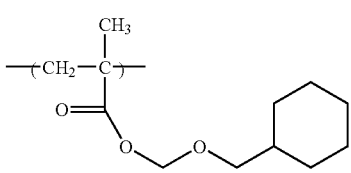 (a1-2-30)
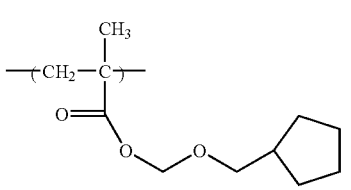 (a1-2-31)
[Chemical Formula 15]
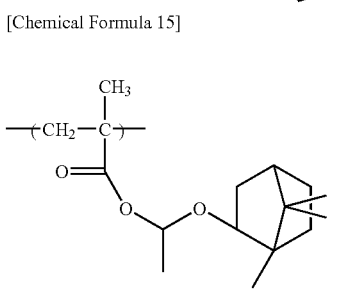 (a1-2-32)
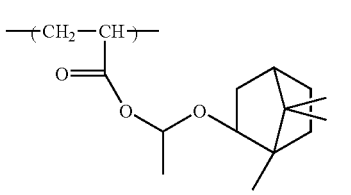 (a1-2-33)

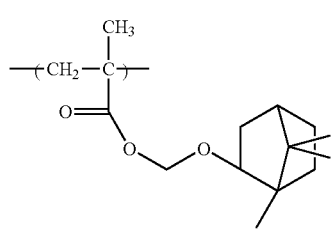 (a1-2-34)
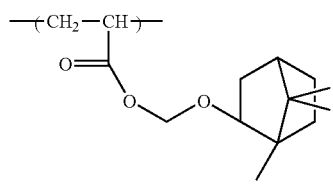 (a1-2-35)
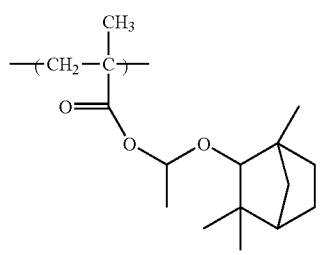 (a1-2-36)
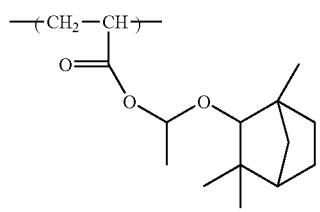 (a1-2-37)
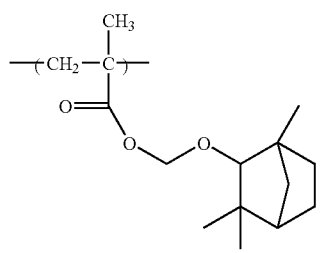 (a1-2-38)
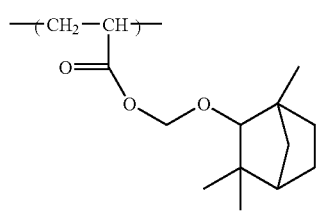 (a1-2-39)
[Chemical Formula 16]
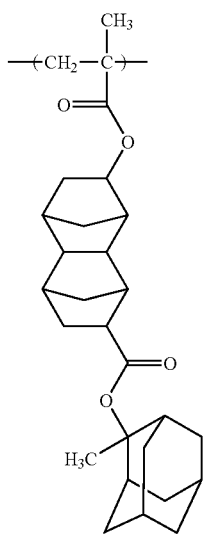 (a1-3-1)
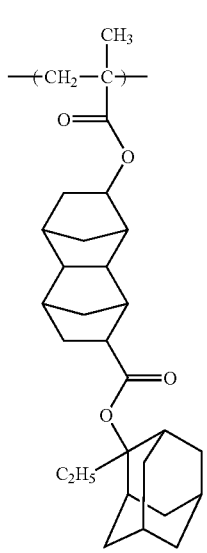 (a1-3-2)
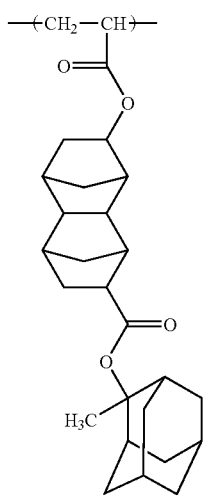 (a1-3-3)

(a1-3-4) 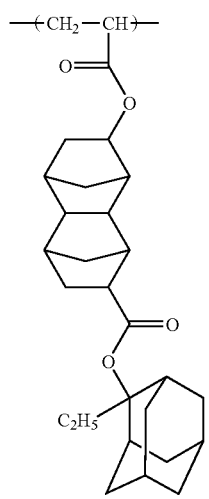
(a1-3-5) 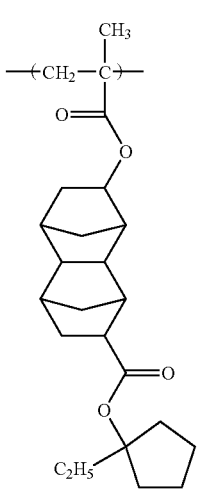
(a1-3-6) 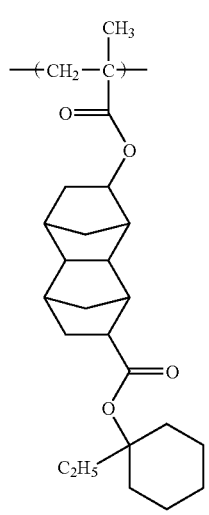
(a1-3-7) 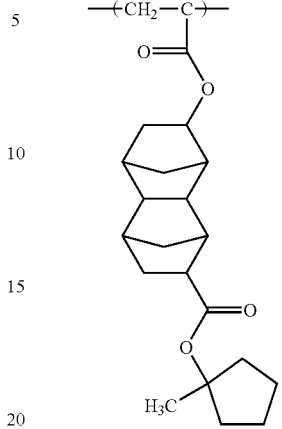
(a1-3-8) 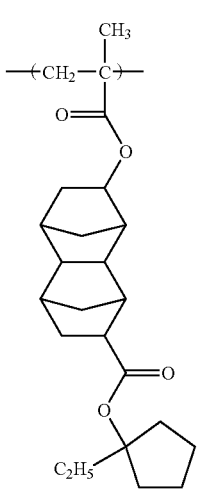
(a1-3-9) 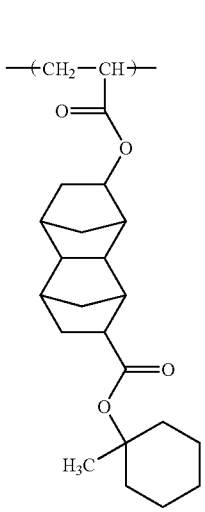

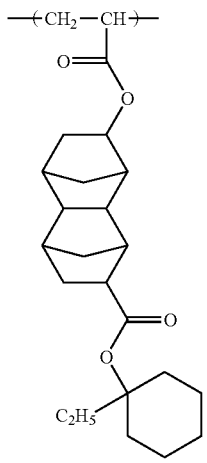
(a1-3-10)
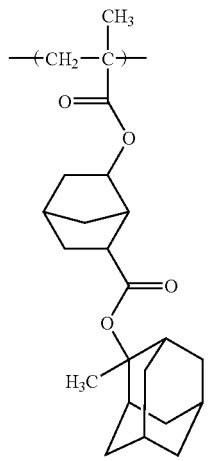
(a1-3-13)
(a1-3-11)
(a1-3-14)
(a1-3-12)
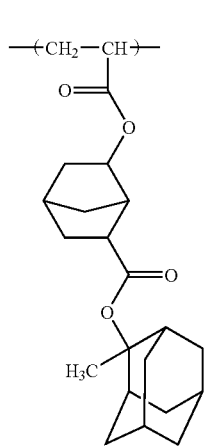
(a1-3-15)

[Chemical Formula 17]

(a1-3-16)

(a1-3-17)

(a1-3-18)

(a1-3-19)

(a1-3-20)

(a1-3-21)

(a1-3-22)

-continued
(a1-3-23)
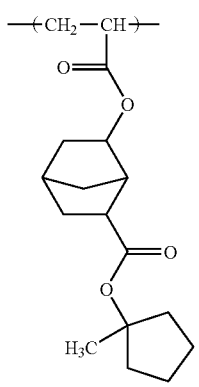
(a1-3-24)
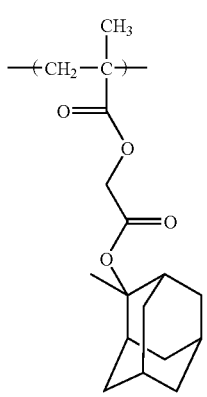
[Chemical Formula 18]
(a1-3-25)
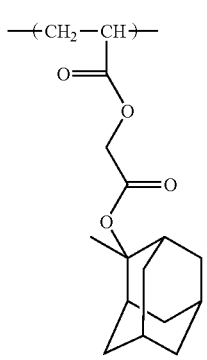
(a1-3-26)
(a1-3-27)
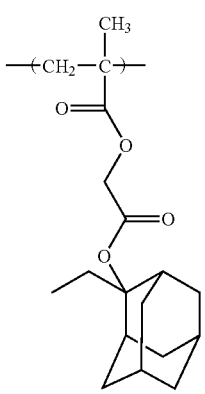
(a1-3-28)
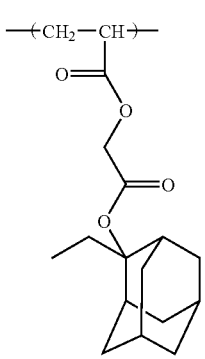
(a1-3-29)
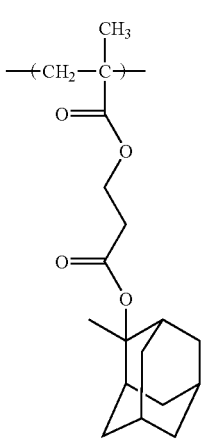
(a1-3-30)
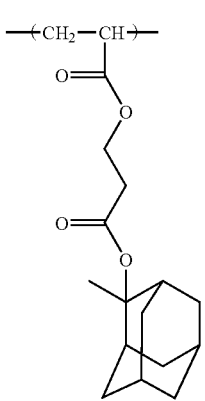

(a1-3-31)
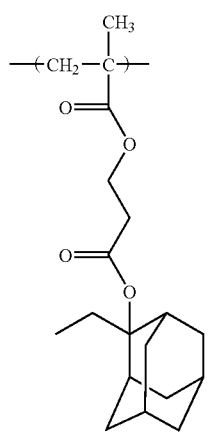
(a1-3-32)
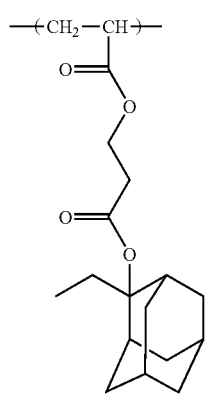
(a1-3-33)
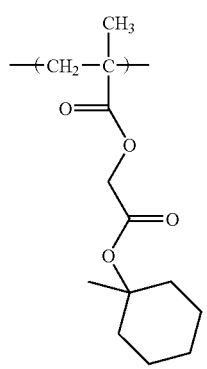
(a1-3-34)
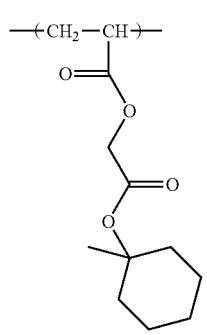
(a1-3-35)
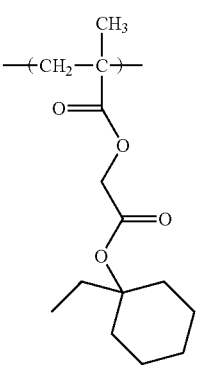
(a1-3-36)
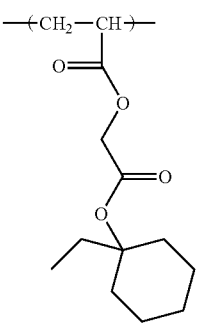
[Chemical Formula 19]
(a1-3-37)
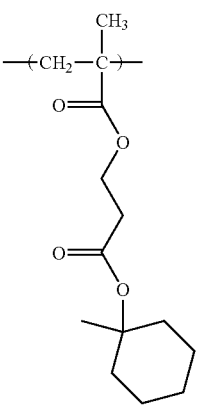
(a1-3-38)
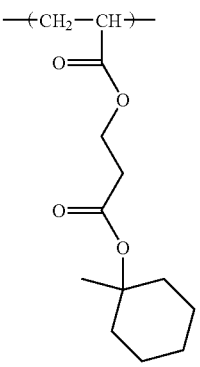

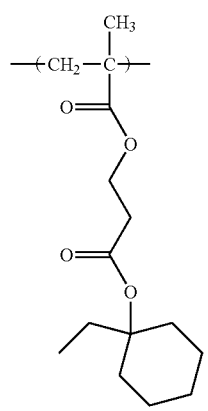 (a1-3-39)
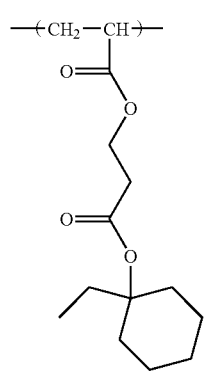 (a1-3-40)
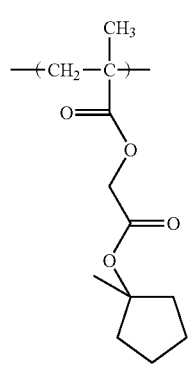 (a1-3-41)
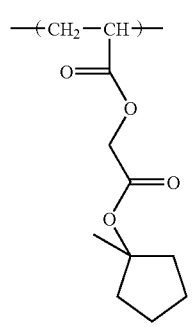 (a1-3-42)
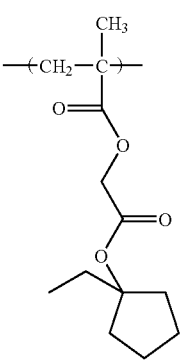 (a1-3-43)
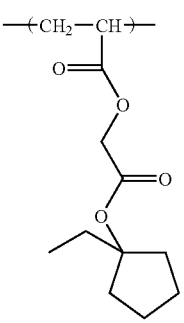 (a1-3-44)
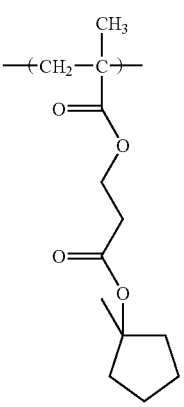 (a1-3-45)
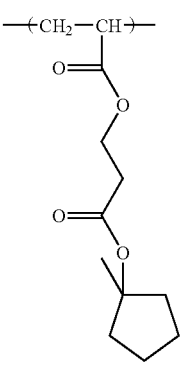 (a1-3-46)

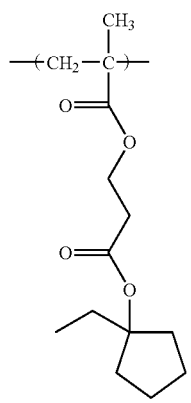
(a1-3-47)
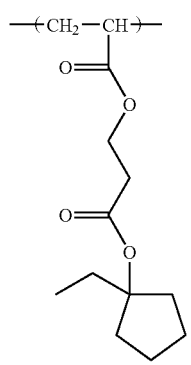
(a1-3-48)
[Chemical Formula 20]
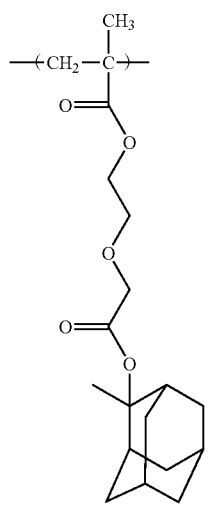
(a1-3-49)
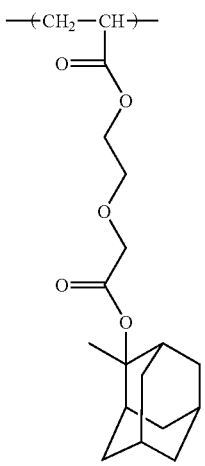
(a1-3-50)
(a1-3-51)
(a1-3-52)

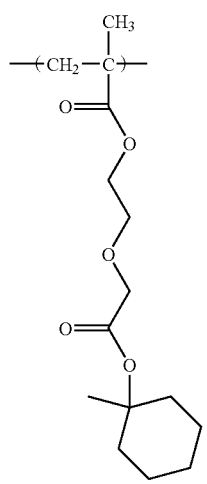 (a1-3-53)
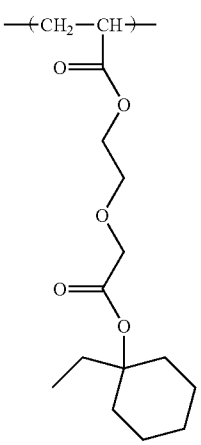 (a1-3-56)
[Chemical Formula 21]
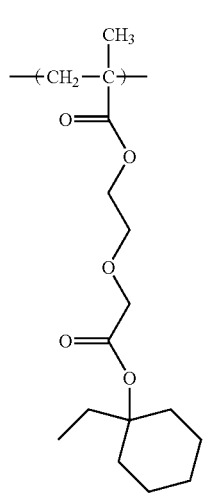 (a1-3-54)
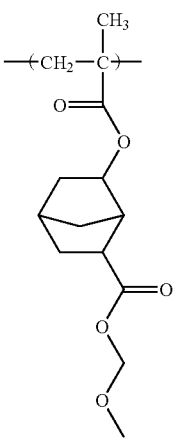 (a1-4-1)
(a1-3-55)
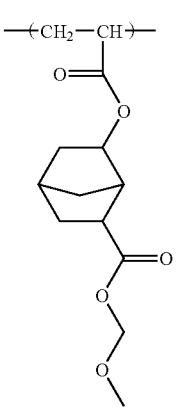 (a1-4-2)

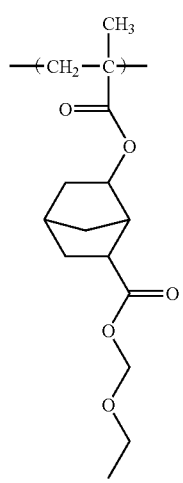
(a1-4-3)
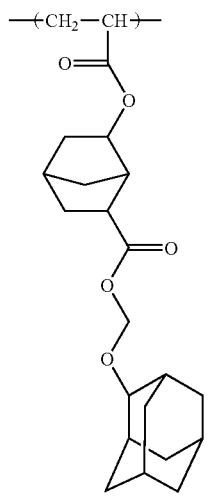
(a1-4-6)
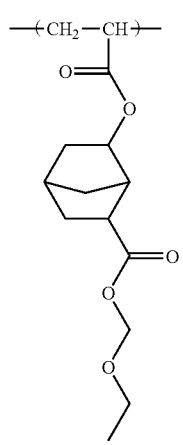
(a1-4-4)
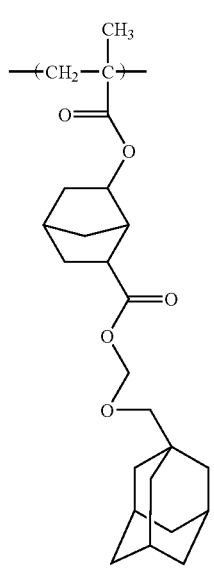
(a1-4-7)
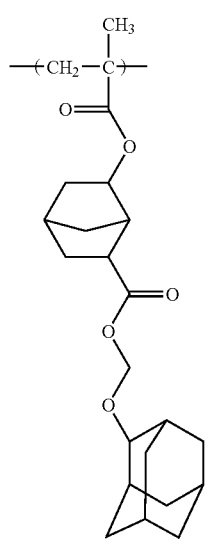
(a1-4-5)
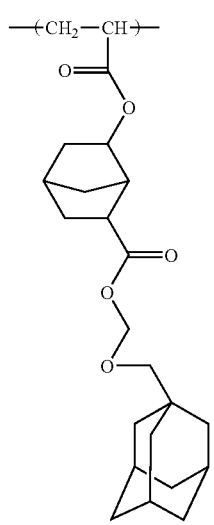
(a1-4-8)

(a1-4-9)
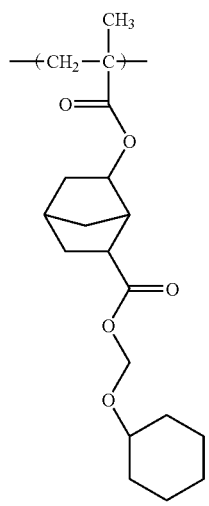
(a1-4-12)
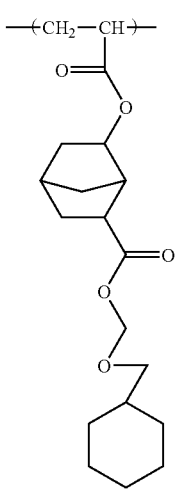
(a1-4-10)
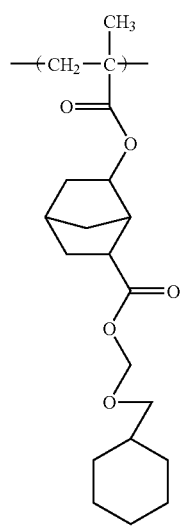
(a1-4-13)
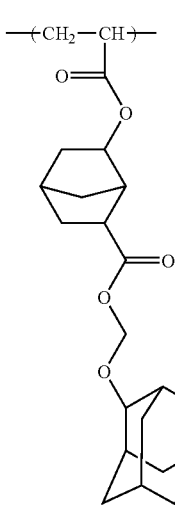
(a1-4-11)
(a1-4-14)
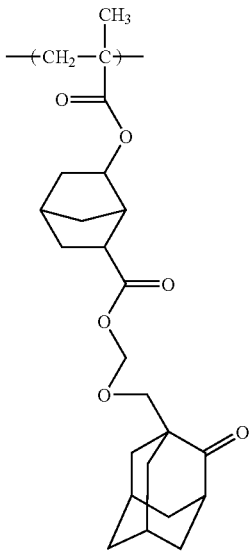

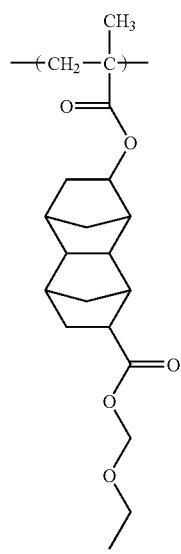 (a1-4-15)
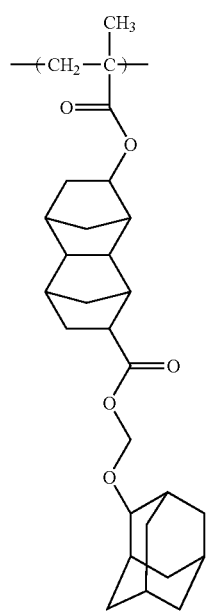 (a1-4-16)
(a1-4-17)
[Chemical Formula 22]
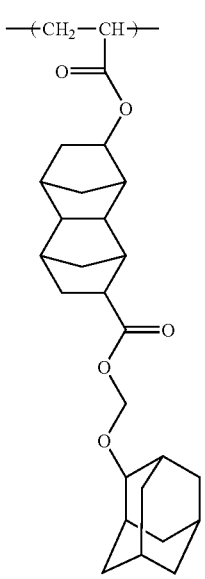 (a1-4-18)
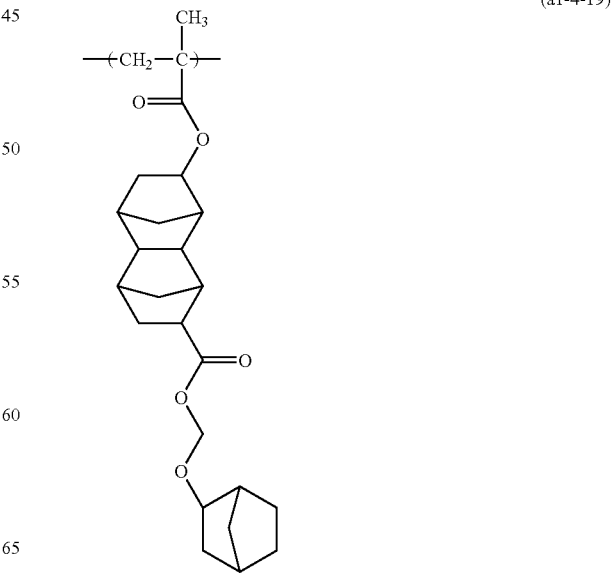 (a1-4-19)

51
-continued
(a1-4-20)
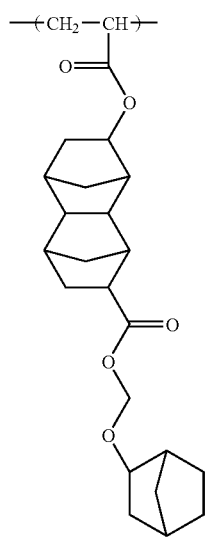
(a1-4-21)
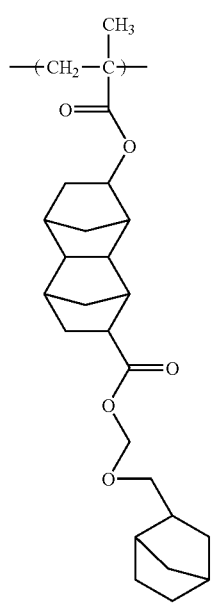
(a1-4-22)
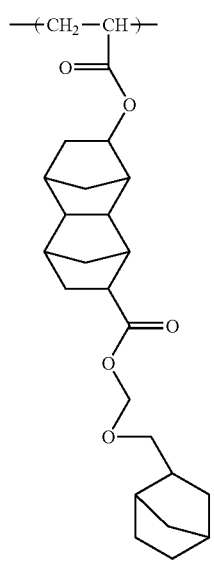
52
-continued
(a1-4-23)
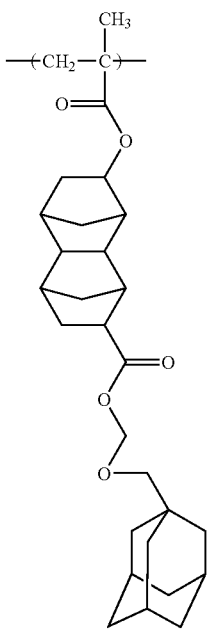
(a1-4-24)
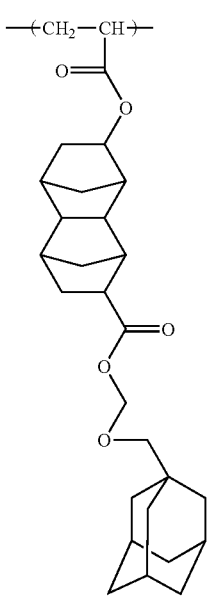

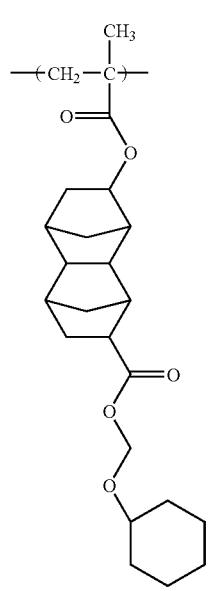
(a1-4-25)
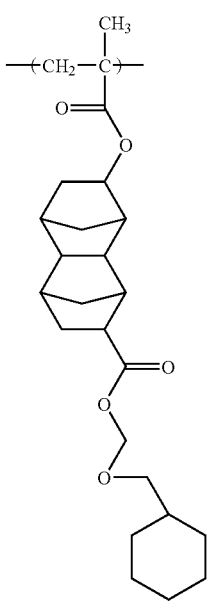
(a1-4-27)
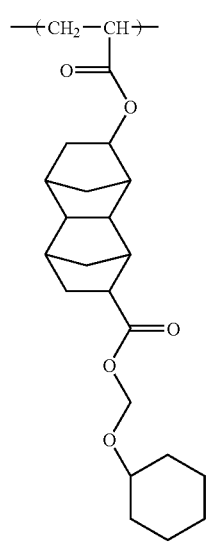
(a1-4-26)
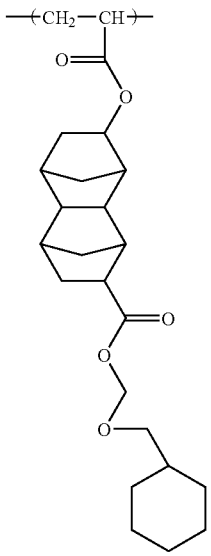
(a1-4-28)

-continued

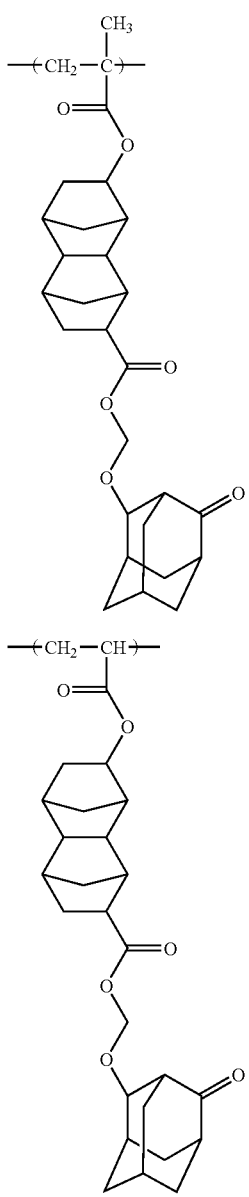

(a1-4-29)

(a1-4-30)

Among these, structural units represented by general formula (a1-1) or (a1-3) are preferable. More specifically, at least one structural unit selected from the group consisting of structural units represented by formulas (a1-1-1) to (a-1-1-7), (a1-1-36) to (a1-1-42), (a1-1-47), (a1-1-48) and (a1-3-49) to (a1-3-56) is more preferable.

Further, as the structural unit (a1), structural units represented by general formula (a1-1-01) shown below which includes the structural units represented by formulas (a1-1-1) to (a1-1-5), (a1-1-47) and (a1-1-48), structural units represented by general formula (a1-1-02) shown below which includes the structural units represented by formulas (a1-1-36) to (a1-1-42), structural units represented by general formula (a1-3-01) shown below which includes the structural units represented by formulas (a1-3-49) to (a1-3-52), and structural units represented by general formula (a1-3-02) shown below which includes the structural units represented by formulas (a1-3-53) to (a1-3-56) are also preferable.

[Chemical Formula 23]

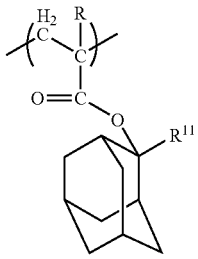

(a1-1-01)

wherein R represents a hydrogen atom, a lower alkyl group or a halogenated lower alkyl group; and $R^{11}$ represents a lower alkyl group.

[Chemical Formula 24]

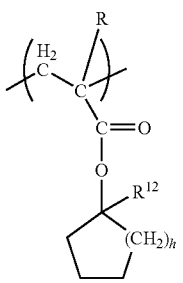

(a1-1-02)

wherein R represents a hydrogen atom, a lower alkyl group or a halogenated lower alkyl group; $R^{12}$ represents a lower alkyl group; and h represents an integer of 1 to 3.

In general formula (a1-1-01), R is as defined above.

The lower alkyl group for $R^{11}$ is the same as the lower alkyl group for R above, and is preferably a methyl group, an ethyl group or an isopropyl group.

In general formula (a1-1-02), R is as defined above.

The lower alkyl group for $R^{12}$ is the same as the lower alkyl group for R above, $R^{12}$ is preferably a methyl group or an ethyl group, and most preferably an ethyl group, h is preferably 1 or 2, and most preferably 2.

[Chemical Formula 25]

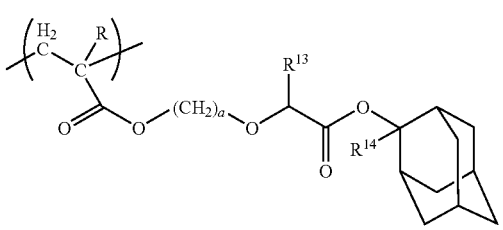

(a1-3-01)

wherein R represents a hydrogen atom, a lower alkyl group or a halogenated lower alkyl group; $R^{14}$ represents a lower alkyl group; $R^{13}$ represents a hydrogen atom or a methyl group; and a represents an integer of 1 to 10.

[Chemical Formula 26]

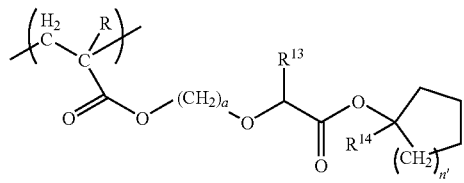

(a1-3-02)

wherein R represents a hydrogen atom, a lower alkyl group or a halogenated lower alkyl group; $R^{14}$ represents a lower alkyl group; $R^{13}$ represents a hydrogen atom or a methyl group, a represents an integer of 1 to 10; and n' represents an integer of 0 to 3.

In general formulas (a1-3-01) and (a1-3-02), R is as defined above.

$R^{13}$ is preferably a hydrogen atom.

The lower alkyl group for $R^{14}$ is the same as the lower alkyl group for R, and is preferably a methyl group or an ethyl group.

a is preferably an integer of 1 to 8, more preferably 2 to 5, and most preferably 2.

As the structural unit (a1), one type of structural unit may be used alone, or two or more types of structural units may be used in combination.

In the component (A1), the amount of the structural unit (a1) based on the combined total of all structural units constituting the component (A1) is preferably 10 to 80 mol %, more preferably 20 to 70 mol %, and still more preferably 25 to 50 mol %. By making the amount of the structural unit (a1) at least as large as the lower limit of the above-mentioned range, a pattern can be easily formed using a resist composition prepared from the component (A1). On the other hand, by making the amount of the structural unit (a1) no more than the upper limit of the above-mentioned range, a good balance can be achieved with the other structural units.

A monomer for deriving the structural unit represented by general formula (a1-3-01) above or the structural unit represented by general formula (a1-3-02) above (hereafter, this monomer is referred to as "monomer W") can be produced by a production method shown below.

Production Method of Monomer W:

A compound represented by general formula (X-2) shown below is added to a compound represented by general formula (X-1) shown below dissolved in a reaction solvent, in the presence of a base, and a reaction is effected to obtain a compound represented by general formula (X-3) shown below (hereafter, referred to as "compound (X-3)"). Then, a compound represented by general formula (X-4) shown below is added to the resulting solution having the compound (X-3) dissolved therein, in the presence of a base, and a reaction is effected to thereby obtain a monomer W.

Examples of the base include inorganic bases such as sodium hydride, $K_2CO_3$ and $Cs_2CO_3$, and organic bases such as triethylamine, 4-dimethylaminopyridine (DMAP) and pyridine.

As the reaction solvent, any reaction solvent capable of dissolving the compounds (X-1) and (X-2) as raw materials can be used, and specific examples include tetrahydrofuran (THF), acetone, dimethylformamide (DMF), dimethylacetamide, dimethylsulfoxide (DMSO) and acetonitrile.

[Chemical Formula 27]

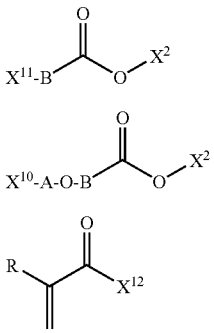

wherein R represents a hydrogen atom, a lower alkyl group or a halogenated lower alkyl group; each of A and B independently represents a divalent hydrocarbon group which may have a substituent; $X^2$ represents an acid dissociable, dissolution inhibiting group; each of $X^{10}$ and $X^{12}$ independently represents a hydroxyl group or a halogen atom, with the proviso that either one of $X^{10}$ and $X^{12}$ represents a hydroxyl group and the other represents a halogen atom; and $X^{11}$ represents a halogen atom.

In formulas (X-1) to (X-4) above, R, $X^2$, A and B are as defined above.

Examples of halogen atoms for $X^{10}$, $X^{11}$ and $X^{12}$ include a bromine atom, a chlorine atom, an iodine atom and a fluorine atom.

As the halogen atom for $X^{10}$ or $X^{12}$, in terms of reactivity, a chlorine atom or a bromine atom is preferable.

As $X^{11}$, in terms of reactivity, a bromine atom or a chlorine atom is preferable, and a bromine atom is particularly desirable.

Structural Unit (a2)

The structural unit (a2) is a structural unit derived from an acrylate ester containing a lactone-containing cyclic group.

The term "lactone-containing cyclic group" refers to a cyclic group including one ring containing a —O—C(O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings.

When the component (A1) is used for forming a resist film, the lactone-containing cyclic group of the structural unit (a2) is effective in improving the adhesion between the resist film and the substrate, and increasing the compatibility with the developing solution containing water.

As the structural unit (a2), there is no particular limitation, and an arbitrary structural unit may be used.

Specific examples of lactone-containing monocyclic groups include groups in which one hydrogen atom has been removed from γ-butyrolactone. Further, specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below.

[Chemical Formula 28]

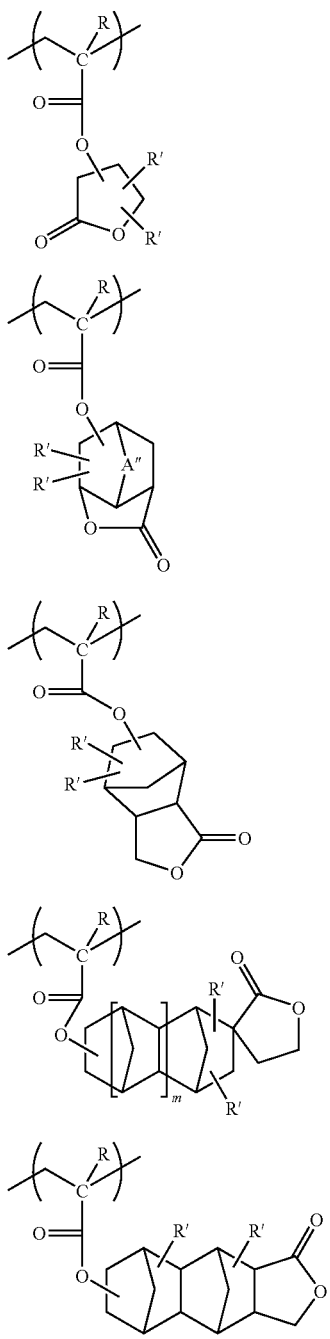

(a2-1)

(a2-2)

(a2-3)

(a2-4)

(a2-5)

wherein R represents a hydrogen atom, a lower alkyl group or a halogenated lower alkyl group; R' represents a hydrogen atom, a lower alkyl group, an alkoxy group of 1 to 5 carbon atoms or —COOR", wherein R" represents a hydrogen atom or a linear, branched or cyclic alkyl group of 1 to 15 carbon atoms; m represents 0 or 1; and A" represents an alkylene group of 1 to 5 carbon atoms which may contain an oxygen atom or a sulfur atom, an oxygen atom or a sulfur atom.

In general formulas (a2-1) to (a2-5), R is the same as R in the structural unit (a1).

The lower alkyl group for R' is the same as the lower alkyl group for R in the structural unit (a1).

When R" is a linear or branched alkyl group, it preferably has 1 to 10 carbon atoms, more preferably 1 to 5 carbon atoms.

When R" is a cyclic alkyl group, it preferably has 3 to 15 carbon atoms, more preferably 4 to 12 carbon atoms, and most preferably 5 to 10 carbon atoms. Examples thereof include groups in which one or more hydrogen atoms have been removed from a monocycloalkane or a polycycloalkane such as a bicycloalkane, tricycloalkane or tetracycloalkane, and which may or may not be substituted with fluorine atoms or fluorinated alkyl groups. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

In the structural units represented by general formulas (a2-1) to (a2-5), in consideration of industrial availability, R' is preferably a hydrogen atom.

Specific examples of alkylene groups of 1 to 5 carbon atoms for A" include a methylene group, ethylene group, n-propylene group, isopropylene group, —O—CH$_2$—, —CH$_2$—O—CH$_2$—, —S—CH$_2$— and —CH$_2$—S—CH$_2$—.

Specific examples of structural units represented by general formulas (a2-1) to (a2-5) above are shown below.

[Chemical Formula 29]

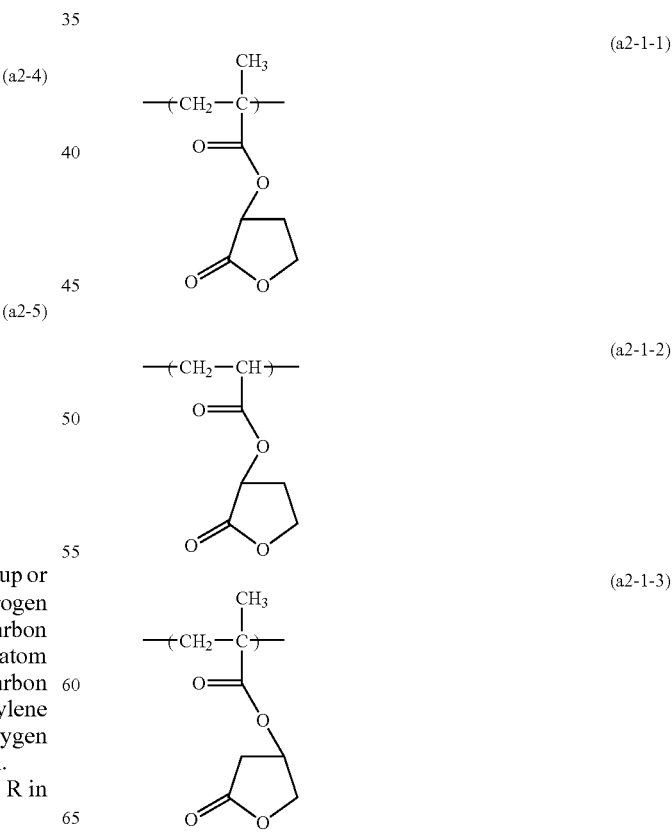

(a2-1-1)

(a2-1-2)

(a2-1-3)

(a2-1-4)
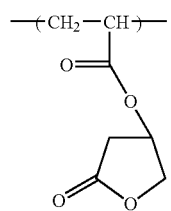
(a2-1-5)
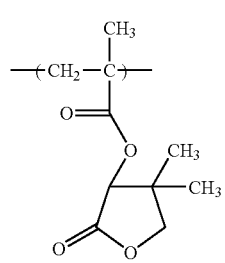
(a2-1-6)
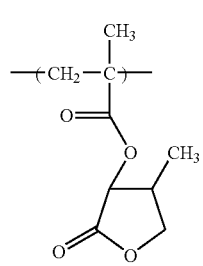
[Chemical Formula 30]
(a2-2-1)
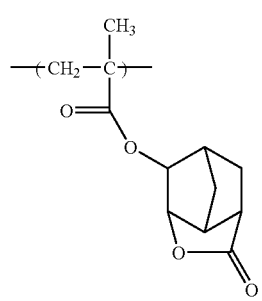
(a2-2-2)
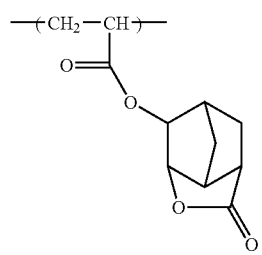
(a2-2-3)
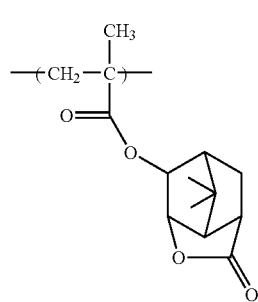
(a2-2-4)
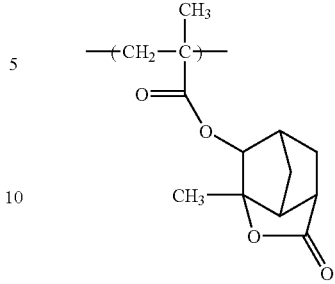
(a2-2-5)
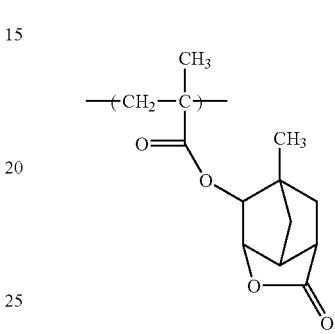
(a2-2-6)
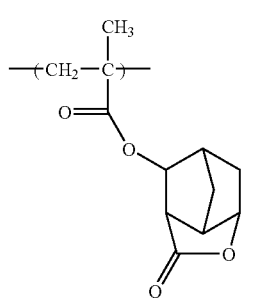
(a2-2-7)
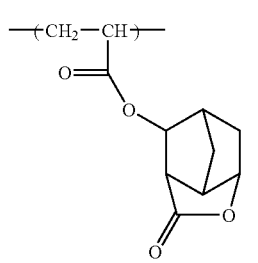
(a2-2-8)
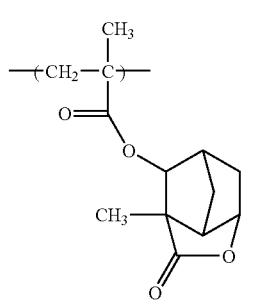

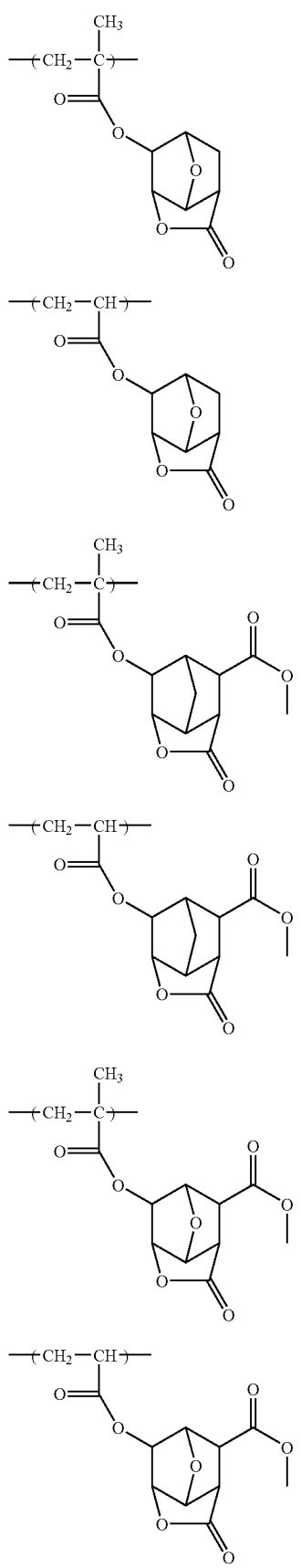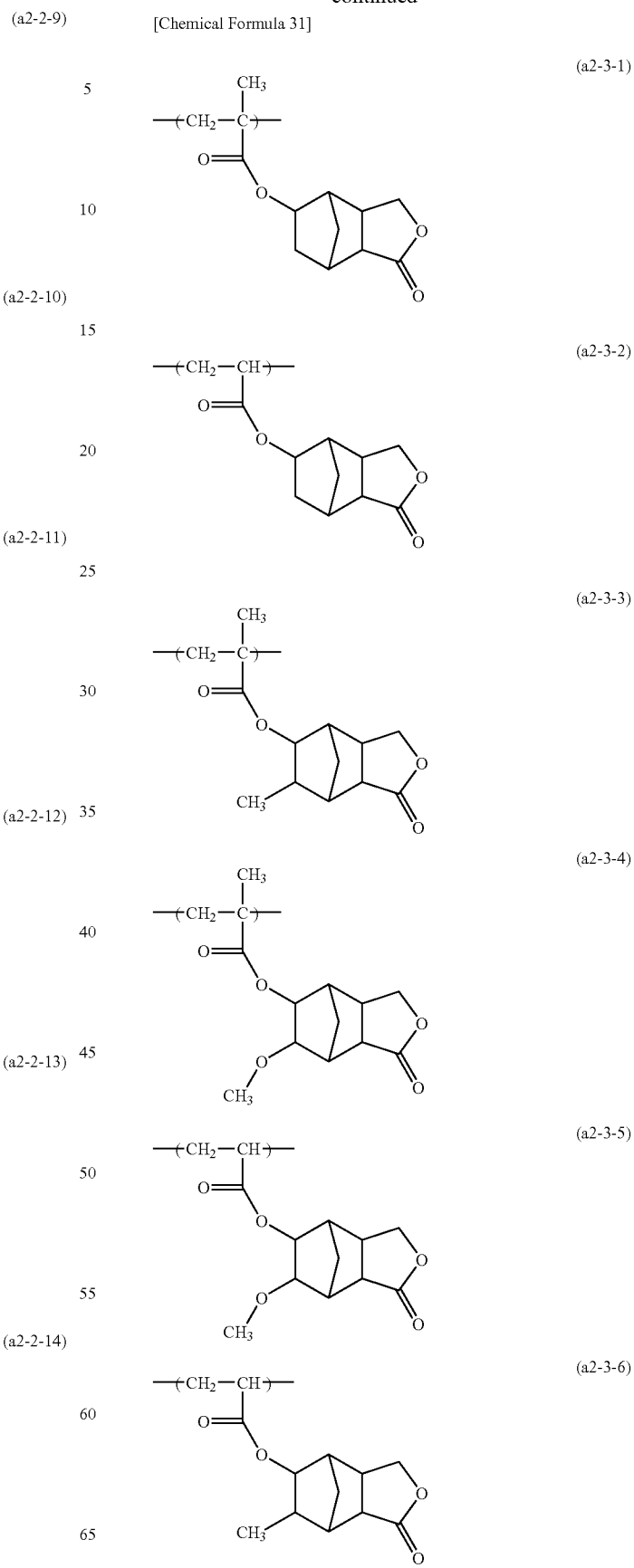

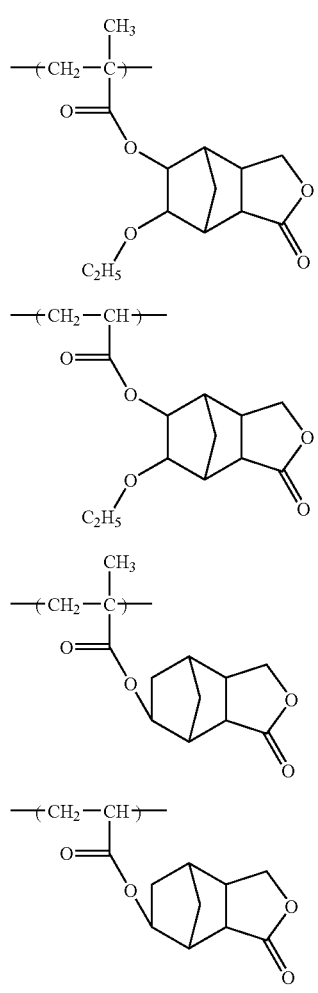
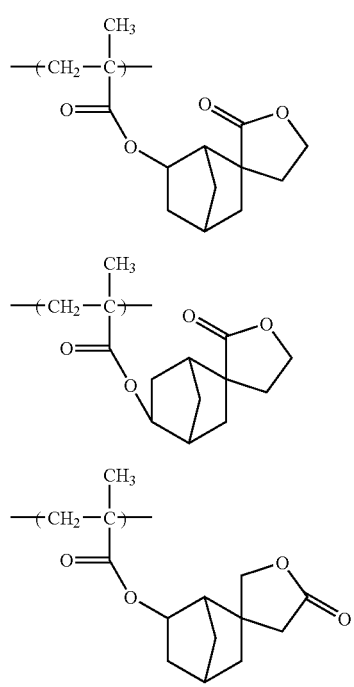
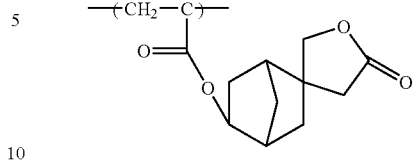
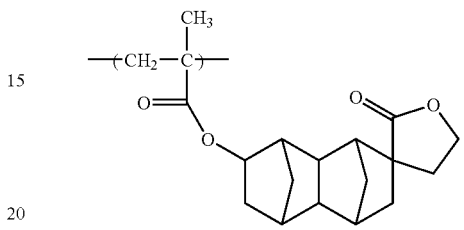
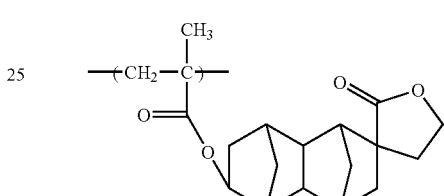
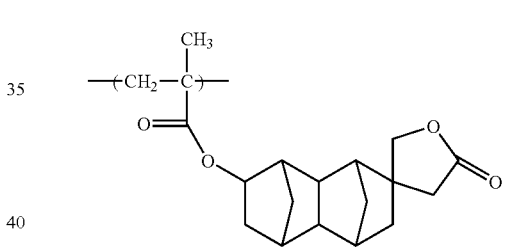
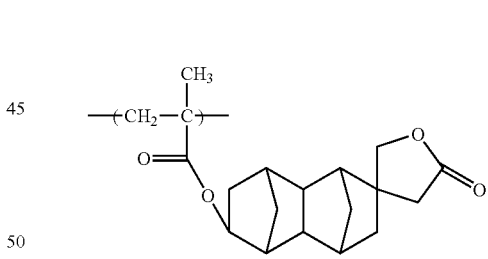
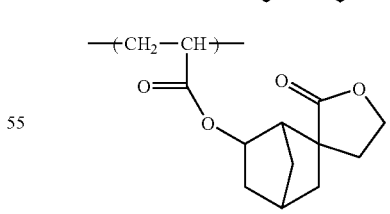
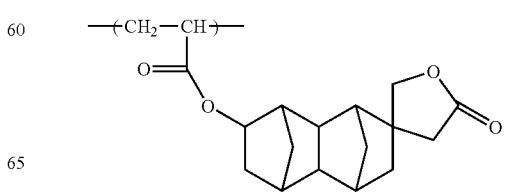

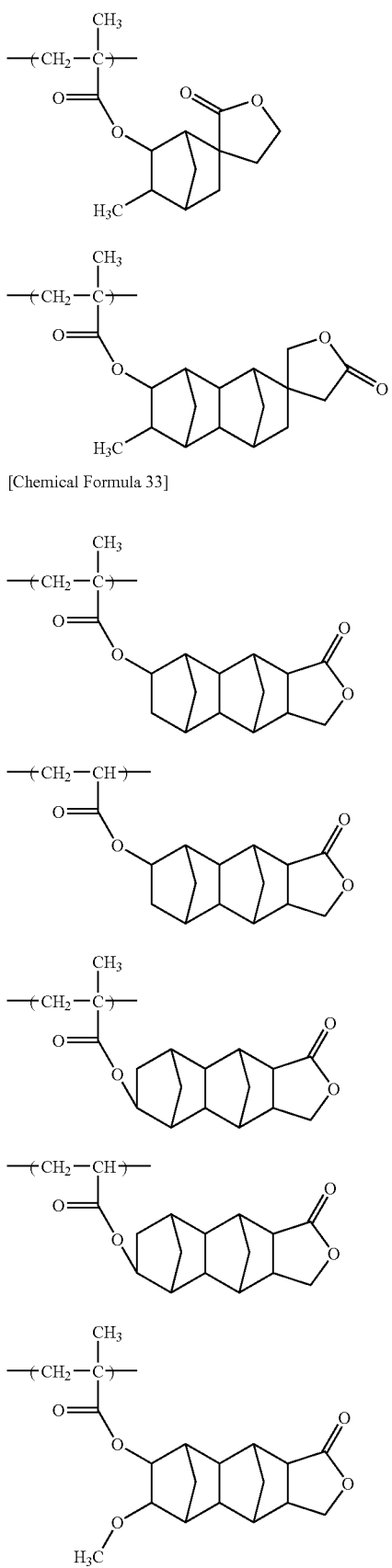
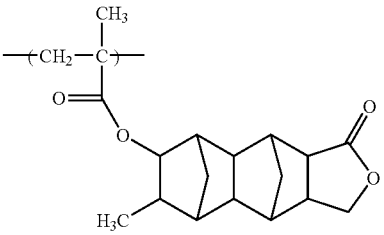

As the structural unit (a2), at least one structural unit selected from the group consisting of formulas (a2-1) to (a2-5) is preferable, and at least one structural unit selected from the group consisting of formulas (a2-1) to (a2-3) is more preferable. Specifically, it is preferable to use at least one structural unit selected from the group consisting of formulas (a2-1-1) to (a2-1-4), (a2-2-1), (a2-2-2), (a2-2-6), (a2-2-7), (a2-2-9), (a2-2-10), (a2-3-1), (a2-3-2), (a-3-9) and (a2-3-10), and it is particularly desirable to use at least one structural unit selected from the group consisting of formulas (a2-1-1) to (a2-1-4), (a2-2-6), (a2-2-7), (a2-3-1), (a2-3-2), (a2-3-9) and (a2-3-10).

As the structural unit (a), one type of structural unit may be used, or two or more types may be used in combination.

In the component (A1), the amount of the structural unit (a2) based on the combined total of all structural units constituting the component (A1) is preferably 5 to 60 mol %, more preferably 10 to 50 mol %, and still more preferably 20 to 50 mol %. By making the amount of the structural unit (a2) at least as large as the lower limit of the above-mentioned range, the effect of using the structural unit (a2) can be satisfactorily achieved. On the other hand, by making the amount of the structural unit (a2) no more than the upper limit of the above-mentioned range, a good balance can be achieved with the other structural units.

Structural Unit (a3)

The structural unit (a3) is a structural unit derived from an acrylate ester containing a polar group-containing aliphatic hydrocarbon group.

When the component (A1) includes the structural unit (a3), the hydrophilicity of the component (A1) is improved, and hence, the compatibility of the component (A1) with the developing solution is improved. As a result, the alkali solubility of the exposed portions improves, which contributes to favorable improvements in the resolution.

Examples of the polar group include a hydroxyl group, cyano group, carboxyl group, or hydroxyalkyl group in which some of the hydrogen atoms of the alkyl group have been substituted with fluorine atoms, although a hydroxyl group is particularly desirable.

Examples of the aliphatic hydrocarbon group include linear or branched hydrocarbon groups (and preferably alkylene groups) of 1 to 10 carbon atoms, and polycyclic aliphatic hydrocarbon groups (polycyclic groups). These polycyclic groups can be selected appropriately from the multitude of groups that have been proposed for the resins of resist compositions designed for use with ArF excimer lasers. The polycyclic group preferably has 7 to 30 carbon atoms.

Of the various possibilities, structural units derived from an acrylate ester that include an aliphatic polycyclic group that contains a hydroxyl group, cyano group, carboxyl group or a hydroxyalkyl group in which some of the hydrogen atoms of the alkyl group have been substituted with fluorine atoms are particularly desirable. Examples of polycyclic groups include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hands when the hydrocarbon group is a polycyclic group, structural units represented by formulas (a3-1), (a3-2), and (a3-3) shown below are preferable.

[Chemical Formula 34]

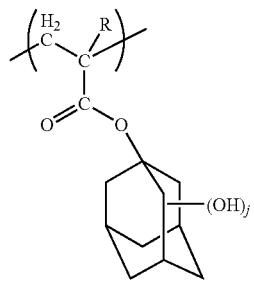

(a3-1)

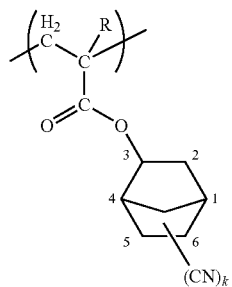

(a3-2)

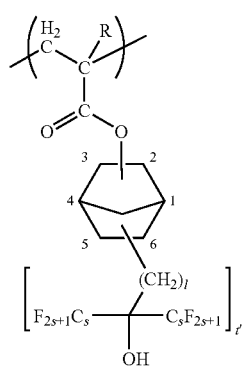

(a3-3)

wherein R is as defined above; j is an integer of 1 to 3; k is an integer of 1 to 3; t' is an integer of 1 to 3; l is an integer of 1 to 5; and s is an integer of 1 to 3.

In formula (a3-1) j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbornyl group.

In formula (a3-3), t' is preferably 1, l is preferably 1 and s is preferably 1. Further, in formula (a3-3), it is preferable that a 2-norbornyl group or 3-norbornyl group be bonded to the terminal of the carboxy group of the acrylic acid. The fluorinated alkyl alcohol is preferably bonded to the 5th or 6th position of the norbornyl group.

In the component (A1), as the structural unit (a3), one type of structural unit may be used, or two or more types may be used in combination.

When the component (A1) contains the structural unit (a3), the amount of structural unit (a3) based on the combined total of all structural units constituting the component (A1) is preferably 5 to 50 mol %, more preferably 5 to 40 mol %, and still more preferably 5 to 25 mol %. By making the amount of the structural unit (a3) at least as large as the lower limit of the above-mentioned ranges the effect of using the structural unit (a3) can be satisfactorily achieved. On the other hand, by making the amount of the structural unit (a3) no more than the upper limit of the above-mentioned range, a good balance can be achieved with the other structural units.

Structural Unit (a0)

The structural unit (a0) is represented by general formula (a0-1) shown below.

[Chemical Formula 35]

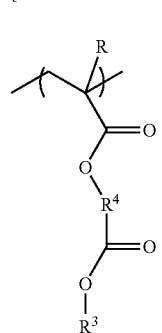

(a0-1)

wherein R represents a hydrogen atom, a lower alkyl group of 1 to 5 carbon atoms or a halogenated lower alkyl group of 1 to 5 carbon atoms; $R^4$ represents a divalent linkage group; and $R^3$ represents a cyclic group containing —$SO_2$— in the ring skeleton thereof.

In general formula (a0-1) above, R represents a hydrogen atom, a lower alkyl group of 1 to 5 carbon atoms or a halogenated lower alkyl group of 1 to 5 carbon atoms.

As the lower alkyl group for R, a linear or branched alkyl group of 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group and a neopentyl group.

The halogenated lower alkyl group for R is a group in which a part or all of the hydrogen atoms of the aforementioned lower alkyl group is substituted with halogen atoms. Examples of halogen atoms include a fluorine atom, a chlorine atom, a bromine atom and an iodine atom, and a fluorine atom is particularly desirable.

As R, a hydrogen atom, a lower alkyl group or a fluorinated alkyl group is preferable, and a hydrogen atom or a methyl group is particularly desirable in terms of industrial availability.

In general formula (a0-1) above, $R^4$ represents a divalent linkage group.

As preferable examples of $R^4$, a divalent hydrocarbon group which may have a substituent, and a divalent linkage group containing a hetero atom can be given.

Divalent Hydrocarbon Group which may Have a Substituent

With respect to $R^4$, when the hydrocarbon group "has a substituent", it means that a part or all of the hydrogen atoms within the hydrocarbon group has been substituted with a group or an atom other than a hydrogen atom.

The hydrocarbon group may be either an aliphatic hydrocarbon group or an aromatic hydrocarbon group. An aliphatic hydrocarbon group refers to a hydrocarbon group having no aromaticity.

The aliphatic hydrocarbon group may be saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

The linear or branched aliphatic hydrocarbon group preferably has 1 to 10 carbon atoms, more preferably 1 to 8, still more preferably 1 to 5, and most preferably 1 or 2.

As the linear aliphatic hydrocarbon group, a linear alkylene group is preferable, and specific examples include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, a branched alkylene group is preferable, and specific examples include alkylalkylene groups, e.g., alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$— and —$C(CH_2CH_3)_2$; alkylethylene groups such as —$CH(CH_3)CH_2$—, —$CH(CH_3)CH(CH_3)$—, —$C(CH_3)_2CH_2$—, —$CH(CH_2CH_3)CH_2$— and —$C(CH_2CH_3)_2$—$CH_2$—; alkyltrimethylene groups such as —$CH(CH_3)CH_2CH_2$— and —$CH_2CH(CH_3)CH_2$—; and alkyltetramethylene groups such as —$CH(CH_3)CH_2CH_2CH_2$— and —$CH_2CH(CH_3)CH_2CH_2$—. As the alkyl group within the alkylalkylene group, a linear alkyl group of 1 to 5 carbon atoms is preferable.

The linear or branched aliphatic hydrocarbon group (chain-like aliphatic hydrocarbon group) may or may not have a substituent. Examples of substituents include a fluorine atom, a fluorinated lower alkyl group of 1 to 5 carbon atoms, and an oxygen atom (=O).

As examples of the hydrocarbon group containing a ring in the structure thereof, a cyclic aliphatic hydrocarbon group (a group in which two hydrogen atoms have been removed from an aliphatic hydrocarbon ring), and a group in which the cyclic aliphatic hydrocarbon group is bonded to the terminal of the aforementioned chain-like aliphatic hydrocarbon group or interposed within the aforementioned chain-like aliphatic hydrocarbon group, can be given.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group.

As the monocyclic group, a group in which two hydrogen atoms have been removed from a monocycloalkane of 3 to 6 carbon atoms is preferable. Examples of the monocycloalkane include cyclopentane and cyclohexane.

As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent. Examples of substituents include a lower alkyl group of 1 to 5 carbon atoms, a fluorine atom, a fluorinated lower alkyl group of 1 to 5 carbon atoms, and an oxygen atom (=O).

Examples of aromatic hydrocarbon groups include a divalent aromatic hydrocarbon group in which one hydrogen atom has been removed from a benzene ring of a monovalent aromatic hydrocarbon group such as a phenyl group, a biphenyl group, a fluorenyl group, a naphthyl group, an anthryl group or a phenanthryl group; an aromatic hydrocarbon group in which a part of the carbon atoms constituting the ring of the aforementioned divalent aromatic hydrocarbon group has been substituted with a hetero atom such as an oxygen atom, a sulfur atom or a nitrogen atom; and an aromatic hydrocarbon group in which one hydrogen atom has been removed from a benzene ring of an arylalkyl group such as a benzyl group, a phenethyl group, a 1-naphthylmethyl group, a 2-naphthylmethyl group, a 1-naphthylethyl group or a 2-naphthylethyl group.

The aromatic hydrocarbon group may or may not have a substituent. Examples of substituents include a lower alkyl group of 1 to 5 carbon atoms, a fluorine atom, a fluorinated alkyl group of 1 to 5 carbon atoms, and an oxygen atom (=O).

Divalent Linkage Group Containing a Hetero Atom

With respect to the "divalent linkage group containing a hetero atom" for $R^4$, a hetero atom refers to an atom other than a carbon atom and a hydrogen atom, and examples thereof include an oxygen atom, a nitrogen atom, a sulfur atom and a halogen atom.

Specific examples of divalent linkage groups containing a hetero atom include —O—, —C(=O)—, —C(=O)—O—, a carbonate bond (—O—C(=O)—O—), —NH—, —$NR^{05}$— (wherein $R^{05}$ represents a substituent such as an alkyl group or an acyl group), —NH—C(=O)—, =N—, —S—, —S(=O)$_2$—, and —S(=O)$_2$—O—. Further, a combination of any one of these "divalent linkage groups containing a hetero atom" with a divalent hydrocarbon group can also be used. As the divalent hydrocarbon group, the same groups as those described above for the hydrocarbon group which may have a substituent can be used, and a linear or branched aliphatic hydrocarbon group is preferable.

In the —$NR^{05}$— group, $R^{05}$ represents a substituent such as an alkyl group or an acyl group. The substituent (an alkyl group, an acyl group or the like) preferably has 1 to 10 carbon atoms, more preferably 1 to 8, and most preferably 1 to 5.

$R^{04}$ may or may not have an acid dissociable portion in the structure thereof.

An "acid dissociable portion" refers to a portion within the $R^4$ group which is dissociated from the $R^4$ group by action of acid generated upon exposure. When the $R^4$ group has an acid dissociable portion, it preferably has an acid dissociable portion having a tertiary carbon atom.

In the present invention, as the divalent linkage group for $R^4$, an alkylene group, a divalent aliphatic cyclic group or a divalent linkage group containing a hetero atom is preferable. Among these, an alkylene group is particularly desirable.

When $R^4$ represents an alkylene group, the alkylene group preferably has 1 to 10 carbon atoms, more preferably 1 to 6, still more preferably 1 to 4, and most preferably 1 to 3. Specific examples of alkylene groups include the aforementioned linear alkylene groups and branched alkylene groups.

When $R^4$ represents a divalent aliphatic cyclic group, as the aliphatic cyclic group, the same aliphatic cyclic groups as those described above for the "aliphatic hydrocarbon group containing a ring in the structure thereof" can be used.

As the aliphatic cyclic group, a group in which two hydrogen atoms have been removed from cyclopentane, cyclohexane, norbornane, isobornane, adamantane, tricyclodecane or tetracyclododecane is particularly desirable.

When $R^4$ represents a divalent linkage group containing a hetero atom, preferable examples of linkage groups include —O—, —C(=O)—O—, —C(=O)—, —O—C(=O)—O—, —C(=O)—NH—, —NR$^{05}$— (wherein $R^{05}$ represents a substituent such as an alkyl group or an acyl group), —S—, —S(=O)$_2$—, —S(=O)$_2$—O—, a group represented by the formula: -A-O—B—, and a group represented by the formula: -[A-C(=O)—O]$_q$—B—. Herein, each of A and B independently represents a divalent hydrocarbon group which may have a substituent, and q represents an integer of 0 to 3.

In the formula -A-O—B— and -[A-C(=O)—O$_q$]—B—, each of A and B independently represents a divalent hydrocarbon group which may have a substituent.

Examples of divalent hydrocarbon groups which may have a substituent include the same groups as those described above for the "divalent hydrocarbon group which may have a substituent" for A and B in the case where $Y^2$ represents "A-O—B".

As A, a linear aliphatic hydrocarbon group is preferable, more preferably a linear alkylene group, still more preferably a linear alkylene group of 1 to 5 carbon atoms, and a methylene group or an ethylene group is particularly desirable.

As B, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the formula -[A-C(=O)—O]$_q$—B—, q represents an integer of 0 to 3, preferably an integer of 0 to 2, more preferably 0 or 1, and most preferably 1.

In general formula (a0-1) above, $R^3$ represents a cyclic group containing —SO$_2$— in the ring skeleton thereof.

The cyclic group for $R^3$ refers to a cyclic group including a ring that contains —SO$_2$— in the ring skeleton thereof, and this ring is counted as the first ring. A cyclic group in which the only ring structure is the ring that contains —SO$_2$— in the ring skeleton thereof is referred to as a monocyclic group, and a group containing other ring structures is described as a polycyclic group regardless of the structure of the other rings. The cyclic group for $R^3$ may be either a monocyclic group or a polycyclic group.

As $R^3$, a cyclic group containing —O—SO$_2$— in the ring structure thereof, i.e., a sultone ring is particularly desirable.

The cyclic group for $R^3$ preferably has 3 to 30 carbon atoms, more preferably 4 to 20, still more preferably 4 to 15, and most preferably 4 to 12.

Herein, the number of carbon atoms refers to the number of carbon atoms constituting the ring skeleton, excluding the number of carbon atoms within a substituent.

The cyclic group for $R^3$ may be either an aliphatic cyclic group or an aromatic cyclic group.

Examples of aliphatic cyclic groups for $R^3$ include the aforementioned cyclic aliphatic hydrocarbon groups in which a part of the carbon atoms constituting the ring skeleton thereof has been substituted with —SO$_2$— or —O—SO$_2$—.

More specifically, examples of monocyclic groups include a monocycloalkane in which one hydrogen atom have been removed therefrom and a —CH$_2$— group constituting the ring skeleton thereof has been substituted with —SO$_2$—; and a monocycloalkane in which one hydrogen atom have been removed therefrom and a —CH$_2$—CH$_2$— group constituting the ring skeleton thereof has been substituted with —O—SO$_2$—. Examples of polycyclic groups include a polycycloalkane (a bicycloalkane, a tricycloalkane, a tetracycloalkane or the like) in which one hydrogen atom have been removed therefrom and a —CH$_2$— group constituting the ring skeleton thereof has been substituted with —SO$_2$—; and a polycycloalkane in which one hydrogen atom have been removed therefrom and a —CH$_2$—CH$_2$— group constituting the ring skeleton thereof has been substituted with —O—SO$_2$—.

The cyclic group for $R^3$ may have a substituent. Examples of substituents include an alkyl group, an alkoxy group, a halogen atom, a halogenated alkyl group, a hydroxy group, an oxygen atom (=O), —COOR", —OC(=O)R", a hydroxyalkyl group and a cyano group. R" represents a hydrogen atom or a linear, branched or cyclic alkyl group of 1 to 15 carbon atoms.

The alkyl group for the substituent is preferably an alkyl group of 1 to 6 carbon atoms. Further, the alkyl group is preferably a linear alkyl group or a branched alkyl group. Specific examples of alkyl groups include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or an ethyl group is preferable, and a methyl group is particularly desirable.

As the alkoxy group for the substituent, an alkoxy group of 1 to 6 carbon atoms is preferable. Further, the alkoxy group is preferably a linear alkoxy group or a branched alkyl group. Specific examples of the alkoxy groups include the aforementioned alkyl groups for the substituent having an oxygen atom (—O—) bonded thereto.

Examples of halogen atoms for the substituent include a fluorine atom, a chlorine atom, a bromine atom and an iodine atom, and a fluorine atom is preferable.

Examples of halogenated alkyl groups for the substituent include groups in which a part or all of the hydrogen atoms within the aforementioned alkyl groups has been substituted with the aforementioned halogen atoms. As a halogenated alkyl group for the substituent, a fluorinated alkyl group is preferable, and a perfluoroalkyl group is particularly desirable.

In the —COOR" group and the —OC(=O)R" group, R" represents a hydrogen atom or a linear, branched or cyclic alkyl group of 1 to 15 carbon atoms.

When R" represents a linear or branched alkyl group, it is preferably an alkyl group of 1 to 10 carbon atoms, more preferably an alkyl group of 1 to 5 carbon atoms, and most preferably a methyl group or an ethyl group.

When R" represents a cyclic alkyl group, it preferably has 3 to 15 carbon atoms, more preferably 4 to 12, and most preferably 5 to 10. Examples of cyclic alkyl groups include groups in which one or more hydrogen atoms have been removed from a monocycloalkane or a polycycloalkane such as a bicycloalkane, tricycloalkane or tetracycloalkane, and which may or may not be substituted with fluorine atoms or fluorinated alkyl groups. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

The hydroxyalkyl group for the substituent preferably has 1 to 6 carbon atoms, and specific examples thereof include the aforementioned alkyl groups for the substituent in which at least one hydrogen atom has been substituted with a hydroxy group.

More specific examples of $R^3$ include groups represented by general formulas (3-1) to (3-4) shown below.

[Chemical Formula 36]

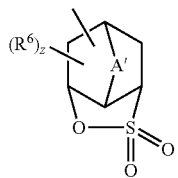
(3-1)

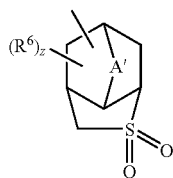
(3-2)

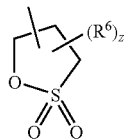
(3-3)

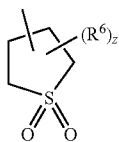
(3-4)

wherein A' represents an alkylene group of 1 to 5 carbon atoms which may contain an oxygen atom or a sulfur atom, an oxygen atom, or a sulfur atom; z represents an integer of 0 to 2; and $R^6$ represents an alkyl group, an alkoxy group, a halogenated alkyl group, a hydroxyl group, —COOR″, —OC(═O)R″, a hydroxyalkyl group or a cyano group, wherein R″ represents a hydrogen atom or a linear, branched or cyclic alkyl group of 1 to 15 carbon atoms.

In general formulas (3-1) to (3-4) above, A' represents an alkylene group of 1 to 5 carbon atoms which may contain an oxygen atom (—O—) or a sulfur atom (—S—), an oxygen atom, or a sulfur atom.

As the alkylene group of 1 to 5 carbon atoms for A', a linear or branched alkylene group is preferable, and examples thereof include a methylene group, an ethylene group, an n-propylene group and an isopropylene group.

Examples of alkylene groups that contain an oxygen atom or a sulfur atom include the aforementioned alkylene groups in which —O— or —S— is bonded to the terminal of the alkylene group or interposed within the alkyl group. Specific examples of such alkylene groups include —O—CH$_2$—, —CH$_2$—O—CH$_2$—, —S—CH$_2$— and —CH$_2$—S—CH$_2$—.

As A', an alkylene group of 1 to 5 carbon atoms or —O— is preferable, more preferably an alkylene group of 1 to 5 carbon atoms, and most preferably a methylene group.

z represents an integer of 0 to 2, and is most preferably 0.

If there are two or more of the $R^6$ group, as indicated by the value z, then the two or more of the $R^6$ group may be the same or different from each other.

As the alkyl group, alkoxy group, halogenated alkyl group, halogenated alkyl group, hydroxyl group, —COOR″, —OC(═O)R″, hydroxyalkyl group and cyano group for $R^6$, the same alkyl groups, alkoxy groups, halogenated alkyl groups, halogenated alkyl groups, hydroxyl groups, —COOR″, —OC(═O)R″, hydroxyalkyl groups and cyano groups as those described above as the substituent which the cyclic group for $R^3$ may have can be used.

Specific examples of the cyclic groups represented by general formulas (3-1) to (3-4) are shown below. In the formulas shown below, "Ac" represents an acetyl group.

[Chemical Formula 37]

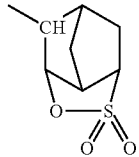
(3-1-1)

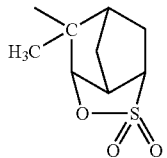
(3-1-2)

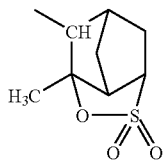
(3-1-3)

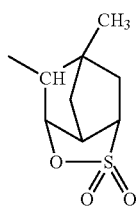
(3-1-4)

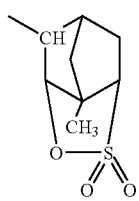
(3-1-5)

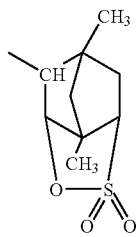
(3-1-6)

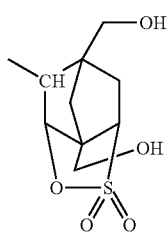 (3-1-7)
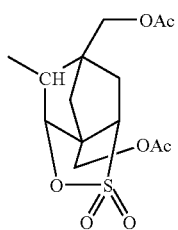 (3-1-8)
[Chemical Formula 38]
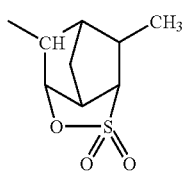 (3-1-9)
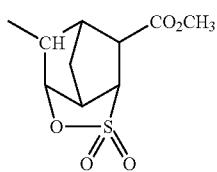 (3-1-10)
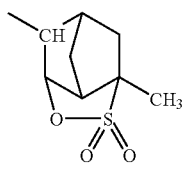 (3-1-11)
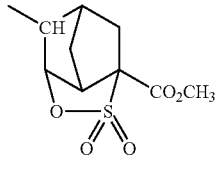 (3-1-12)
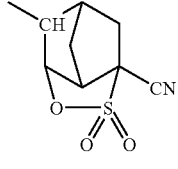 (3-1-13)
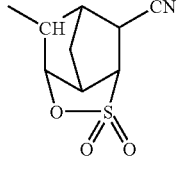 (3-1-14)
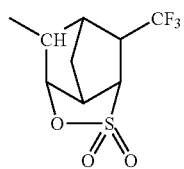 (3-1-15)
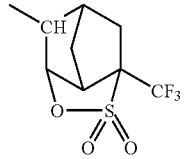 (3-1-16)
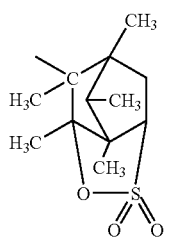 (3-1-17)
[Chemical Formula 39]
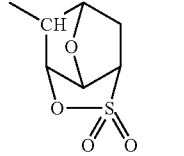 (3-1-18)
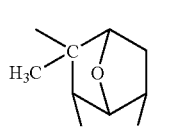 (3-1-19)
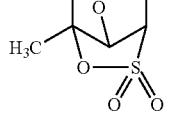 (3-1-20)
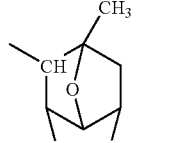 (3-1-21)
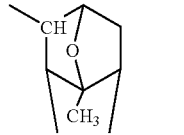 (3-1-22)

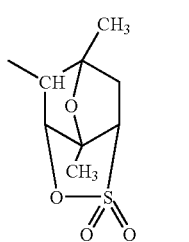 (3-1-23)

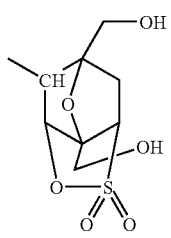 (3-1-24)

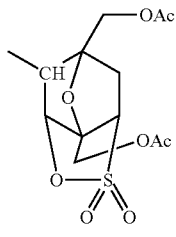 (3-1-25)

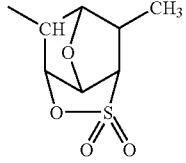 (3-1-26)

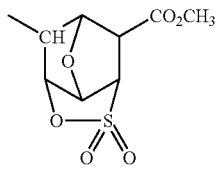 (3-1-27)

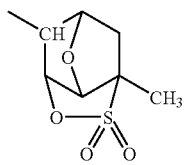 (3-1-28)

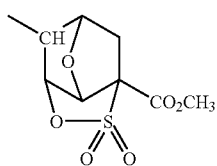 (3-1-29)

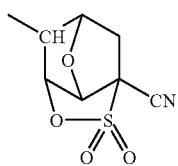 (3-1-30)

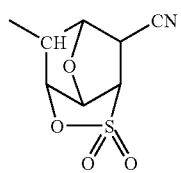 (3-1-31)

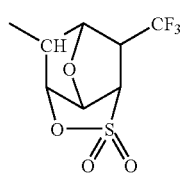 (3-1-32)

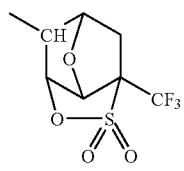 (3-1-33)

[Chemical Formula 40]

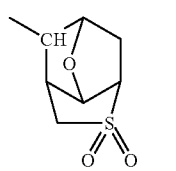 (3-2-1)

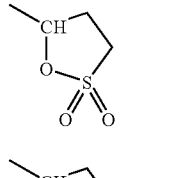 (3-2-2)

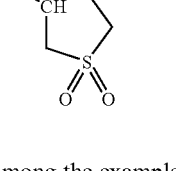 (3-3-1)

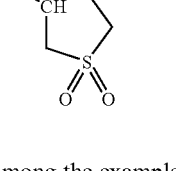 (3-4-1)

Among the examples shown above, as $R^3$, a cyclic group represented by general formula (3-1), (3-3) or (3-4) above is preferable, and a cyclic group represented by general formula (3-1) above is particularly desirable.

More specifically, as $R^3$, it is preferable to use at least one cyclic group selected from the group consisting of cyclic groups represented by chemical formulas (3-1-1), (3-1-18), (3-3-1) and (3-4-1) above, and a cyclic group represented by chemical formula (3-1-1) above is particularly desirable.

In the present invention, as the structural unit (a0), a structural unit represented by general formula (a0-1-11) shown below is particularly desirable.

[Chemical Formula 41]

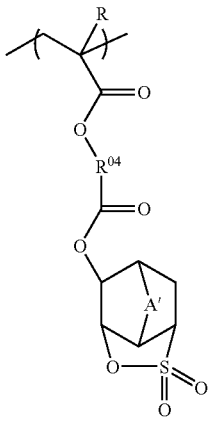

(a0-1-11)

wherein R is as defined above; R$^{04}$ represents a linear or branched alkylene group or -A-C(=O)—O—B— (wherein A and B are as defined above); and A' is as defined above.

The linear or branched alkylene group for R$^{04}$ preferably has 1 to 10 carbon atoms, more preferably 1 to 8, still more preferably 1 to 5, still more preferably 1 to 3, and most preferably 1 or 2.

In the -A-C(=O)—O—B— group, each of A and B preferably represents a linear or branched alkylene group, more preferably an alkylene group of 1 to 5 carbon atoms, and most preferably a methylene group or an ethylene group. Specific examples of groups represented by the formula -A-C(=O)—O—B— include —(CH$_2$)$_2$—C(=O)—O—(CH$_2$)$_2$— and —(CH$_2$)$_2$—O—C(=O)—(CH$_2$)$_2$—.

A' is preferably a methylene group, an oxygen atom (—O—) or a sulfur atom (—S—).

As the structural unit (a0), one type of structural unit may be used alone, or two or more types of structural units may be used in combination.

In terms of achieving excellent lithography properties such as exposure margin (EL margin), line width roughness (LWR) and the like in the formation of a resist pattern using a resist composition containing the component (A1), the amount of the structural unit (a0) within the component (A1), based on the combined total of all structural units constituting the component (A1) is preferably 1 to 60 mol %, more preferably 5 to 50 mol %, still more preferably 10 to 40 mol %, and most preferably 15 to 40 mol %.

Structural Unit (a4)

The component (A1) may also have a structural unit (a4) which is other than the above-mentioned structural units (a1) to (a3) and (a0), as long as the effects of the present invention are not impaired.

As the structural unit (a4), any other structural unit which cannot be classified as one of the above structural units (a1) to (a3) and (a0) can be used without any particular limitations, and any of the multitude of conventional structural units used within resist resins for ArF excimer lasers or KrF excimer lasers (and particularly for ArF excimer lasers) can be used.

As the structural unit (a4), a structural unit which contains a non-acid-dissociable aliphatic polycyclic group, and is also derived from an acrylate ester is preferable. Examples of this polycyclic group include the same groups as those described above in connection with the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecanyl group, adamantyl group, tetracyclododecanyl group, isobornyl group, and norbornyl group is particularly desirable. These polycyclic groups may be substituted with a linear or branched alkyl group of 1 to 5 carbon atoms.

Specific examples of the structural unit (a4) include units with structures represented by general formulas (a4-1) to (a4-5) shown below.

[Chemical Formula 42]

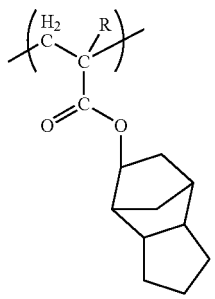

(a4-1)

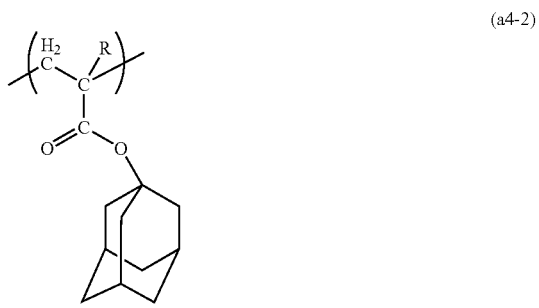

(a4-2)

(a4-3)

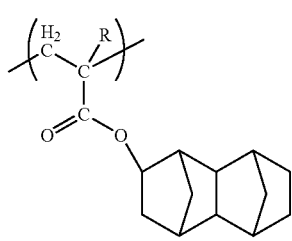

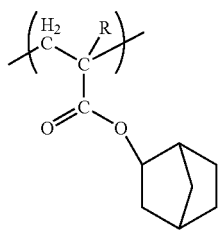

(a4-4)

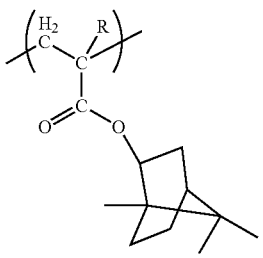

(a4-5)

wherein R is as defined above.

When the structural unit (a4) is included in the component (A1), the amount of the structural unit (a4) based on the combined total of all the structural units that constitute the component (A1) is preferably within the range from 1 to 30 mol %, and more preferably from 10 to 20 mol %.

In the present invention, the component (A1) preferably contains a copolymer having the structural units (a1), (a2) and (a3). Examples of such copolymers include a copolymer consisting of the structural units (a1) and (a2) and (a3), and a copolymer consisting of the structural units (a1), (a2), (a3) and (ad) Among these, as the component (A1), a copolymer consisting of the structural units (a1) and (a2) and (a3) is preferable.

Further, in the present invention, the component (A1) preferably contains a copolymer having the structural units (a0) and (a1). Examples of such copolymers include a copolymer consisting of the structural units (a0) and (a1), a copolymer consisting of the structural units (a0), (a1) and (a3), a copolymer consisting of the structural units (a0), (a1) and (a2), and a copolymer consisting of the structural units (a0), (a1), (a2) and (a3).

The component (A1) can be obtained, for example, by a conventional radical polymerization or the like of the monomers corresponding with each of the structural units, using a radical polymerization initiator such as azobisisobutyronitrile (AIBN).

Furthermore, in the component (A1), by using a chain transfer agent such as HS—$CH_2$—$CH_2$—$CH_2$—$C(CF_3)_2$—OH, a —$C(CF_3)_2$—OH group can be introduced at the terminals of the component (A1). Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

As the monomers for deriving the corresponding structural units, commercially available monomers may be used, or the monomers may be synthesized by a convention method.

For example, as a monomer for deriving the structural unit (a0), a compound represented by general formula (a0-1-0) shown below (hereafter, referred to as "compound (a0-1-0)") can be used.

[Chemical Formula 43]

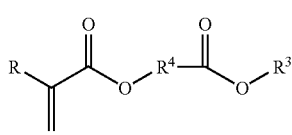

(a0-1-0)

wherein R, $R^3$ and $R^4$ are respectively as defined above.

The method for producing the compound (a0-1-0) is not particularly limited, and the compound (a0-1-0) can be produced by a conventional method.

For example, in the presence of a base, a compound (X-2) represented by general formula (X-2) shown below is added to a solution obtained by dissolving a compound (X-1) represented by general formula (X-1) shown below in a reaction solvent, and a reaction is effected to thereby obtain a compound (a0-1-0).

Examples of bases include inorganic bases such as $K_2CO_3$ and $Cs_2CO_3$; and organic bases such as triethylamine, 4-dimethylaminopyridine (DMAP) and pyridine. Examples of condensation agents include carbodiimide reagents such as ethyldiisopropylaminocarbodiimide hydrochloride (EDCI), dicyclohexylcarboxyimide (DCC), diisopropylcarbodiimide and carbodiimidazole, as well as tetraethyl pyrophosphate and benzotriazole-N-hydroxytrisdimethylatninophosphonium hexafluorophosphate (Bop reagent).

If desired, an acid may be used. As the acid, any of those which are typically used in dehydration/condensation can be used. Specific examples of such acids include inorganic acids such as hydrochloric acid, sulfuric acid and phosphoric acid, and organic acids such as methanesulfonic acid, trifluoromethanesulfonic acid, benzenesulfonic acid and p-toluenesulfonic acid. These acids can be used individually, or in a combination of two or more.

[Chemical Formula 44]

$R^3$—OH (X-1)

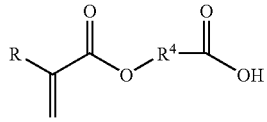

(X-2)

The weight average molecular weight (Mw) (the polystyrene equivalent value determined by gel permeation chromatography) of the component (A1) is not particularly limited, but is preferably 2,000 to 50,000, more preferably 3,000 to 30,000, and most preferably 5,000 to 20,000. By making the weight average molecular weight no more than the upper limit of the above-mentioned range, the component (A1) exhibits satisfactory solubility in a resist solvent when used as a resist. On the other hand, by making the weight average molecular weight at least as large as the lower limit of the above-mentioned range, dry etching resistance and cross-sectional shape of the resist pattern becomes satisfactory.

Further, the dispersity (Mw/Mn) is preferably 1.0 to 5.0, more preferably 1.0 to 3.0, and most preferably 1.2 to 2.5. Here, Mn is the number average molecular weight.

[Component (A2)]

As the component (A2), it is preferable to use a compound that has a molecular weight of at least 500 and less than 2,000, contains a hydrophilic group, and also contains an acid dissociable, dissolution inhibiting group used above in connection with the component (A1). Specific examples include compounds containing a plurality of phenol skeletons in which a part of the hydrogen atoms within hydroxyl groups have been substituted with the aforementioned acid dissociable, dissolution-inhibiting groups.

Examples of the component (A2) include low molecular weight phenolic compounds in which a portion of the hydroxyl group hydrogen atoms have been substituted with an aforementioned acid dissociable, dissolution inhibiting group, and these types of compounds are known, for example, as sensitizers or heat resistance improvers for use in non-chemically amplified g-line or i-line resists.

Examples of these low molecular weight phenol compounds include bis(4-hydroxyphenyl)methane, bis(2,3,4-trihydroxyphenyl)methane, 2-(4-hydroxyphenyl)-2-(4'-hydroxyphenyl)propane, 2-(2,3,4-trihydroxyphenyl)-2-(2',3',4'-trihydroxyphenyl)propane, tris(4-hydroxyphenyl)methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl)isopropyl]-4-[1,1-bis(4-hydroxyphenyl)ethyl]benzene, and dimers, trimers and tetramers of formalin condensation products of phenols such as phenol, m-cresol, p-cresol and xylenol. Needless to say, the low molecular weight phenol compound is not limited to these examples. Among these, in terms of achieving excellent lithography properties with respect to resolution, line width roughness (LWR), surface roughness and pattern shape, a compound having 2 to 6 triphenylmethane skeletons is preferable.

Also, there are no particular limitations on the acid dissociable, dissolution inhibiting group, and suitable examples include the groups described above.

As the component (A), one type may be used, or two or more types may be used in combination.

Of the examples shown above, as the component (A), it is preferable to use one containing the component (A1).

In the resist composition of the present invention, the amount of the component (A) can be appropriately adjusted depending on the thickness of the resist film to be formed, and the like.

<Component (B)>

The component (B) includes an acid generator (B1) consisting of a compound represented by general formula (b1) shown below (hereafter, this acid generator (B1) is referred to as "component (B1)").

[Chemical Formula 45]

$$X-Q^1-Y^1-SO_3^-A^+ \quad (b1)$$

wherein $Q^1$ represents a divalent linkage group containing an oxygen atom; $Y^1$ represents a fluorinated alkylene group of 1 to 4 carbon atoms which may have a substituent, with the proviso that the carbon atom adjacent to the sulfur atom within the —$SO_3^-$ group has a fluorine atom bonded thereto; X represents a hydrocarbon group of 3 to 30 carbon atoms which may have a substituent; and $A^+$ represents an organic cation.

In general formula (b1) above, $Q^1$ represents a divalent linkage group containing an oxygen atom.

$Q^1$ may contain an atom other than an oxygen atom. Examples of atoms other than an oxygen atom include a carbon atom, a hydrogen atom, a sulfur atom and a nitrogen atom.

Examples of divalent linkage groups containing an oxygen atom include non-hydrocarbon, oxygen atom-containing linkage groups such as an oxygen atom (an ether bond; —O—), an ester bond (—C(=O)—O—), an amido bond (—C(=O)—NH—), a carbonyl group (—C(=O)—) and a carbonate group (—O—C(=O)—O—); and a combination of any of the aforementioned non-hydrocarbon, oxygen atom-containing linkage groups with an alkylene group.

Specific examples of the combinations of the aforementioned non-hydrocarbon, oxygen atom-containing linkage groups with alkylene groups include —$R^{91}$—O—, —$R^{92}$—O—C(=O)— and —O—$R^{93}$—O—C(=O)— (wherein each of $R^{91}$ to $R^{93}$ independently represents an alkylene group).

The alkylene group for $R^{91}$ to $R^{93}$ is preferably a linear or branched alkylene group. The alkylene group preferably has 1 to 12 carbon atoms, more preferably 1 to 5, and most preferably 1 to 3.

Specific examples of the alkylene group include a methylene group [—$CH_2$—]; alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$—, and —C($CH_2CH_3$)$_2$; an ethylene group [—$CH_2CH_2$—]; alkylethylene groups such as —CH($CH_3$)$CH_2$—, —CH($CH_3$)CH($CH_3$)—, —C($CH_3$)$_2CH_2$—, —CH($CH_2CH_3$)$CH_2$— and —CH($CH_2CH_3$)$CH_2$—; a trimethylene group (n-propylene group) [—$CH_2CH_2CH_2$—]; alkyltrimethylene groups such as —CH($CH_3$)$CH_2CH_2$— and —$CH_2$CH($CH_3$)$CH_2$—; a tetramethylene group [—$CH_2CH_2CH_2CH_2$—]; alkyltetramethylene groups such as —CH($CH_3$)$CH_2CH_2CH_2$— and —$CH_2$CH($CH_3$)$CH_2CH_2$—; and a pentamethylene group [—$CH_2CH_2CH_2CH_2CH_2$—].

As $Q^1$, an ester bond, a divalent linkage group containing an ester bond, an ether bond or a divalent linkage group containing an ether bond is preferable, more preferably an ester bond, an ether bond, —$R^{91}$—O—, —$R^{92}$—O—C(=O)— or —O—$R^{93}$—O—C(=O)—, and most preferably an ester bond, —$R^{91}$—O— or —O—$R^{93}$—O—C(=O)—.

In general formula (b1) above, $Y^1$ represents a fluorinated alkylene group of 1 to 4 carbon atoms which may have a substituent.

As the alkylene group for $Y^1$, the same alkylene groups of 1 to 4 carbon atoms as those described above for $Q^1$ can be used.

As the fluorinated alkylene group, the aforementioned alkylene group in which a part or all of the hydrogen atoms has been substituted with fluorine atoms can be used, with the proviso that the carbon atom adjacent to the sulfur atom within the —$SO_3^-$ group has a fluorine atom bonded thereto. As a result, an acid having a strong acid strength is generated from the component (B1) upon exposure. In the present invention, by virtue of using the component (B1), the shape of a resist pattern formed can be improved, and the lithography properties are also improved.

Specific examples of $Y^1$ include —$CF_2$—, —$CF_2CF_2$—, —$CF_2CF_2CF_2$—, —CF($CF_3$)$CF_2$—, —CF($CF_2CF_3$)—, —$CF_2CF_2CF_2CF_2$—, —CF($CF_3$)$CF_2CF_2$—, —$CF_2$CF($CF_3$)$CF_2$—, —CF($CF_3$)CF($CF_3$)—, —C($CF_3$)$_2CF_2$—, —CF($CF_2CF_3$)$CF_2$—, —CF($CF_2CF_2CF_3$)—; —CHF—, —$CH_2CF_2$—, —$CH_2CH_2CF_2$—, —$CH_2CF_2CF_2$—, —$CH_2CH_2CH_2CF_2$—, and —$CH_2CH_2CF_2CF_2$—.

Of these, —$CF_2$—, —$CF_2CF_2$—, —$CF_2CF_2CF_2$—, —CF($CF_3$)$CF_2$—, —$CF_2CF_2CF_2CF_2$—, —CF($CF_3$)$CF_2CF_2$—, —$CF_2$CF($CF_3$)$CF_2$—, —CF($CF_3$)CF($CF_3$)—, —C($CF_3$)$_2CF_2$—, —CF($CF_2CF_3$)$CF_2$—; —$CH_2CF_2$—, —$CH_2CH_2CF_2$—, —$CH_2CF_2CF_2$—; —$CH_2CH_2CH_2CF_2$—, —$CH_2CH_2CF_2CF_2$—, or —$CF_2CF_2CF_2CF_2$, is preferable, more preferably —$CF_2$—, —$CF_2CF_2$—, —$CF_2CF_2CF_2$— or —$CH_2CF_2CF_2$—, still more preferably —$CF_2$—, —$CF_2CF_2$—, or —$CF_2CF_2CF_2$—, and most preferably —$CF_2$—.

The fluorinated alkylene group may have a substituent. When the fluorinated alkylene group "has a substituent", it means that a part or all of the hydrogen atoms and/or fluorine atoms within the fluorinated alkylene group has been substituted with atoms or groups other than a hydrogen atom or a fluorine atom.

Examples of substituents which the fluorinated alkylene group may have include an alkyl group of 1 to 4 carbon atoms, an alkoxy group of 1 to 4 carbon atoms and a hydroxyl group.

In general formula (b1) above, X represents a hydrocarbon group of 3 to 30 carbon atoms which may have a substituent.

The hydrocarbon group for X may be either an aromatic hydrocarbon group or an aliphatic hydrocarbon group.

The aromatic hydrocarbon group is a hydrocarbon group having an aromatic ring, and preferably has 3 to 30 carbon atoms, more preferably 5 to 30, still more preferably 5 to 20, still more preferably 6 to 15, and most preferably 6 to 12. Here, the number of carbon atoms within a substituent(s) is not included in the number of carbon atoms of the aromatic hydrocarbon group.

Specific examples of aromatic hydrocarbon groups include an aryl group which is an aromatic hydrocarbon ring having one hydrogen atom removed therefrom, such as a phenyl group, a biphenyl group, a fluorenyl group, a naphthyl group, an anthryl group or a phenanthryl group; and an alkylaryl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atom, more preferably 1 or 2, and most preferably 1.

The aromatic hydrocarbon group may have a substituent. For example, a part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

In the former example, a heteroaryl group in which a part of the carbon atoms constituting the ring within the aforementioned aryl group has been substituted with a hetero atom such as an oxygen atom, a sulfur atom or a nitrogen atom, and a heteroarylalkyl group in which a part of the carbon atoms constituting the aromatic hydrocarbon ring within the aforementioned arylalkyl group has been substituted with the aforementioned heteroatom can be used.

In the latter example, as the substituent for the aromatic hydrocarbon group, an alkyl group, an alkoxy group, a halogen atom, a halogenated alkyl group, a hydroxyl group, an oxygen atom ($=O$) or the like can be used.

The alkyl group as the substituent for the aromatic hydrocarbon group is preferably an alkyl group of 1 to 5 carbon atoms, and a methyl group, an ethyl group, a propyl group, an n-butyl group or a tert-butyl group is particularly desirable.

The alkoxy group as the substituent for the aromatic hydrocarbon group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Example of the halogenated alkyl group as the substituent for the aromatic hydrocarbon group includes a group in which a part or all of the hydrogen atoms within the aforementioned alkyl group have been substituted with the aforementioned halogen atoms.

The aliphatic hydrocarbon group for X may be either a saturated aliphatic hydrocarbon group, or an unsaturated aliphatic hydrocarbon group. Further, the aliphatic hydrocarbon group may be linear, branched or cyclic.

In the aliphatic hydrocarbon group for X, a part of the carbon atoms constituting the aliphatic hydrocarbon group may be substituted with a substituent group containing a hetero atom, or a part or all of the hydrogen atoms constituting the aliphatic hydrocarbon group may be substituted with a substituent group containing a hetero atom.

As the "hetero atom" for X, there is no particular limitation as long as it is an atom other than a carbon atom and a hydrogen atom. Examples of hetero atoms include a halogen atom, an oxygen atom, a sulfur atom and a nitrogen atom. Examples of halogen atoms include a fluorine atom, a chlorine atom, an iodine atom and a bromine atom.

The substituent group containing a hetero atom may consist of a hetero atom, or may be a group containing a group or atom other than a hetero atom.

Specific examples of the substituent group for substituting a part of the carbon atoms include —O—, —C($=O$)—O—, —C($=O$)—, —O—C($=O$)—O—, —C($=O$)—NH—, —NH— (wherein H may be substituted with an alkyl group, an acyl group or the like), —S—, —S($=O$)$_2$— and —S($=O$)$_2$—O—. When the aliphatic hydrocarbon group is cyclic, the aliphatic hydrocarbon group may contain any of these substituent groups in the ring structure.

Examples of the substituent group for substituting a part or all of the hydrogen atoms include an alkoxy group, a halogen atom, a halogenated alkyl group, a hydroxyl group, an oxygen atom ($=O$) and a cyano group.

The aforementioned alkoxy group is preferably an alkoxy group having 1 to 5 carbon atoms, more preferably a methoxy group, an ethoxy group, an n-propoxy group, an iso-propoxy group, an n-butoxy group or a ten-butoxy group, and most preferably a methoxy group or an ethoxy group.

Examples of the aforementioned halogen atom include a fluorine atom, a chlorine atom, a bromine atom and an iodine atom, and a fluorine atom is preferable.

Example of the aforementioned halogenated alkyl group includes a group in which a part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched saturated hydrocarbon group (alkyl group) preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The unsaturated hydrocarbon group preferably has 2 to 10 carbon atoms, more preferably 2 to 5, still more preferably 2 to 4, and most preferably 3. Examples of linear monovalent unsaturated hydrocarbon groups include a vinyl group, a propenyl group (an allyl group) and a butynyl group. Examples of branched monovalent unsaturated hydrocarbon groups include a 1-methylpropenyl group and a 2-methylpropenyl group.

Among the above-mentioned examples, as the unsaturated hydrocarbon group, a propenyl group is particularly desirable.

The aliphatic cyclic group may be either a monocyclic group or a polycyclic group. The aliphatic cyclic group preferably has 3 to 30 carbon atoms, more preferably 5 to 30, still more preferably 5 to 20, still more preferably 6 to 15, and most preferably 6 to 12.

As the aliphatic cyclic group, a group in which one or more hydrogen atoms have been removed from a monocycloalkane or a polycycloalkane such as a bicycloalkane, tricycloalkane or tetracycloalkane can be used. Specific examples include groups in which one or more hydrogen atoms have been removed from a monocycloalkane such as cyclopentane or cyclohexane; and groups in which one or more hydrogen atoms have been removed from a polycycloalkane such as adamantane norbornane, isobornane, tricyclodecane or tetracyclododecane.

When the aliphatic cyclic group does not contain a hetero atom-containing substituent group in the ring structure thereof, the aliphatic cyclic group is preferably a polycyclic group, more preferably a group in which one or more hydrogen atoms have been removed from a polycycloalkane, and a group in which one or more hydrogen atoms have been removed from adamantane is particularly desirable.

When the aliphatic cyclic group contains a hetero atom-containing substituent group in the ring structure thereof, the hetero atom-containing substituent group is preferably —O—, —C(=O)—O—, —S—, —S(=O)$_2$— or —S(=O)$_2$—O—. Specific examples of such aliphatic cyclic groups include groups represented by formulas (L1) to (L5) and (S1) to (S4) shown below.

[Chemical Formula 46]

(L1)

(L2)

(L3)

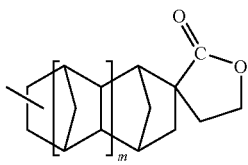
(L4)

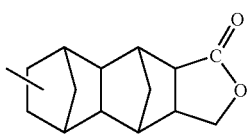
(L5)

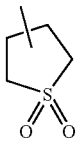
(S1)

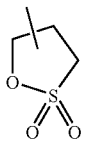
(S2)

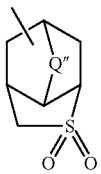
(S3)

(S4)

wherein Q″ represents an alkylene group of 1 to 5 carbon atoms, —O—, —S—, —O—R$^{94}$— or —S—R$^{95}$— (wherein each of R$^{94}$ and R$^{95}$ independently represents an alkylene group of 1 to 5 carbon atoms); and m represents 0 or 1.

As the alkylene group for Q″, the same alkylene groups as those for A″ above can be used.

As the alkylene group for and R$^{94}$ and R$^{95}$, the same alkylene groups of 1 to 5 carbon atoms as those described above for R$^{91}$ to R$^{93}$ can be used.

In these aliphatic cyclic groups, a part of the hydrogen atoms boned to the carbon atoms constituting the ring structure may be substituted with a substituent. Examples of substituents include an alkyl group, an alkoxy group, a halogen atom, a halogenated alkyl group, a hydroxyl group and an oxygen atom (=O).

As the alkyl group, an alkyl group of 1 to 5 carbon atoms is preferable, and a methyl group, an ethyl group, a propyl group, an n-butyl group or a tert-butyl group is particularly desirable.

As the alkoxy group and the halogen atom, the same groups as the substituent groups for substituting a part or all of the hydrogen atoms can be used.

In the present invention, as X, a cyclic group which may have a substituent is preferable. The cyclic group may be either an aromatic hydrocarbon group which may have a substituent, or an aliphatic cyclic group which may have a substituent, and an aliphatic cyclic group which may have a substituent is preferable.

As the aromatic hydrocarbon group, a naphthyl group which may have a substituent, or a phenyl group which may have a substituent is preferable.

As the aliphatic cyclic group which may have a substituent, an aliphatic polycyclic group which may have a substituent is preferable. As the aliphatic polycyclic group, the aforementioned group in which one or more hydrogen atoms have been removed from a polycycloalkane, and groups represented by formulas (L2) to (L5), (S3) and (S4) are preferable.

In terms of the effects of the present invention, in the component (B1), the fluorination ratio of the anion moiety (i.e., the percentage of the number of fluorine atoms within the anion moiety, based on the total number of fluorine atoms and hydrogen atoms within the anion moiety) is preferably 1 to 95%, more preferably 5 to 90%, and still more preferably 8 to 50%.

In general formula (b1) above, as the organic cation for $A^+$, there is no particular limitation, and any of those conventionally known as cation moiety for an onium salt-based acid generator can be appropriately selected for use. As the cation moiety, a sulfonium ion or an iodonium ion is preferable, and a sulfonium ion is particularly desirable.

More specifically, a cation moiety represented by general formula (I-1) or (I-2) show below can be used.

[Chemical Formula 47]

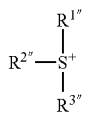

(I-1)

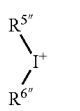

(I-2)

wherein each of $R^{1\prime\prime}$ to $R^{3\prime\prime}$ independently represents an aryl group which may have a substituent or an alkyl group which may have a substituent, with the proviso that at least one of $R^{1\prime\prime}$ to $R^{3\prime\prime}$ represents an aryl group, and wherein two of $R^{1\prime\prime}$ to $R^{3\prime\prime}$ in formula (I-1) may be bonded to each other to form a ring with the sulfur atom; and each of $R^{5\prime\prime}$ and $R^{6\prime\prime}$ independently represents an aryl group which may have a substituent or an alkyl group which may have a substituent, with the proviso that and at least one of $R^{5\prime\prime}$ and $R^{6\prime\prime}$ represents an aryl group.

In formula (I-1), each of $R^{1\prime\prime}$ to $R^{3\prime\prime}$ independently represents an aryl group or an alkyl group. In formula (I-1), two of $R^{1\prime\prime}$ to $R^{3\prime\prime}$ may be bonded to each other to form a ring with the sulfur atom.

Further, among $R^{1\prime\prime}$ to $R^{3\prime\prime}$, at least one group represents an aryl group. Among $R^{1\prime\prime}$ to $R^{3\prime\prime}$, two or more groups are preferably aryl groups, and it is particularly desirable that all of $R^{1\prime\prime}$ to $R^{3\prime\prime}$ are aryl groups.

The aryl group for $R^{1\prime\prime}$ to $R^{3\prime\prime}$ is not particularly limited. Examples thereof include an unsubstituted aryl group having 6 to 20 carbon atoms, a substituted aryl group in which a part or all of the hydrogen atoms of the aforementioned unsubstituted aryl group has been substituted with alkyl groups, alkoxy groups, alkoxyalkyloxy groups, alkoxycarbonylalkyloxy groups, halogen atoms or hydroxyl groups, and a group represented by the formula: $-(R^{4t})-C-(=O)-R^{5t}$. $R^{4t}$ represents an alkylene group of 1 to 5 carbon atoms. $R^{5t}$ represents an aryl group. As the aryl group for $R^{5t}$, the same aryl groups as those for $R^{1\prime\prime}$ to $R^{3\prime\prime}$ can be used.

The unsubstituted aryl group is preferably an aryl group having 6 to 10 carbon atoms because it can be synthesized at a low cost. Specific examples thereof include a phenyl group and naphthyl group.

The alkyl group as the substituent for the substituted aryl group is preferably an alkyl group having 1 to 5 carbon atoms, and a methyl group, an ethyl group, a propyl group, an n-butyl group, or a tert-butyl group is particularly desirable.

The alkoxy group as the substituent for the substituted aryl group is preferably an alkoxy group having 1 to 5 carbon atoms, and a methoxy group, an ethoxy group, an n-propoxy group, an iso-propoxy group, an n-butoxy group or a tert-butoxy group is particularly desirable.

The halogen atom as the substituent for the substituted aryl group is preferably a fluorine atom.

Examples of the alkoxyalkyloxy group as the substituent for the substituted aryl group include a group represented by a general formula: $-O-C(R^{47})(R^{48})-O-R^{49}$ (wherein each of $R^{47}$ and $R^{48}$ independently represents a hydrogen atom or a linear or branched alkyl group; and $R^{49}$ represents an alkyl group).

The alkyl group for $R^{47}$ and $R^{48}$ preferably has 1 to 5 carbon atoms, and may be either linear or branched, and is preferably an ethyl group or a methyl group, and most preferably a methyl group.

It is preferable that at least one of $R^{47}$ and $R^{48}$ be a hydrogen atom, and it is particularly desirable that either one of $R^{47}$ and $R^{48}$ be a hydrogen atom, and the other be a hydrogen atom or a methyl group.

The alkyl group for $R^{49}$ preferably has 1 to 15 carbon atoms, and may be linear, branched or cyclic.

The linear or branched alkyl group for $R^{49}$ preferably has 1 to 5 carbon atoms. Examples thereof include a methyl group, an ethyl group, a propyl group, an n-butyl group and a tert-butyl group.

The cyclic alkyl group for $R^{49}$ preferably has 4 to 15 carbon atoms, more preferably 4 to 12, and most preferably 5 to 10. Specific examples thereof include groups in which one or more hydrogen atoms have been removed from a monocycloalkane or a polycycloalkane such as a bicycloalkane, tricycloalkane or tetracycloalkane, and which may or may not be substituted with an alkyl group of 1 to 5 carbon atoms, a fluorine atom or a fluorinated alkyl group. Examples of the monocycloalkane include cyclopentane and cyclohexane. Examples of polycycloalkanes include adamantane, norbornane, isobornane, tricyclodecane and tetracyclododecane. Among these, a group in which one or more hydrogen atoms have been removed from adamantane is preferable.

An example of the alkoxycarbonylalkyloxy group as the substituent for the substituted aryl group includes a group represented by a general formula: $-O-R^{50}-C(=O)-O-R^{51}$ (wherein $R^{50}$ represents a linear or branched alkylene group; and $R^{51}$ represents a tertiary alkyl group).

The linear or branched alkylene group for $R^{50}$ preferably has 1 to 5 carbon atoms, and examples thereof include a methylene group, an ethylene group, a trimethylene group, a tetramethylene group and a 1,1-dimethylethylene group.

The alkyl group for $R^{51}$ is a tertiary alkyl group, and examples thereof include a 2-methyl-2-adamantyl group, a 2-ethyl-2-adamantyl group, a 1-methyl-1-cyclopentyl group, a 1-ethyl-1-cyclopentyl group, a 1-methyl-1-cyclohexyl group, a 1-ethyl-1-cyclohexyl group, a 1-(1-adamantyl)-1-methylethyl group, a 1-(1-adamantyl)-1-methylpropyl group, a 1-(1-adamantyl)-1-methylbutyl group, a 1-(1-adamantyl)-1-methylpentyl group, a 1-(1-cyclopentyl)-1-methylethyl group, a 1-(1-cyclopentyl)-1-methylpropyl group, a 1-(1-cyclopentyl)-1-methylbutyl group, a 1-(1-cyclopentyl)-1-methylpentyl group, a 1-(1-cyclohexyl)-1-methylethyl group, a 1-(1-cyclohexyl)-1-methylpropyl group, a 1-(1-cyclohexyl)-1-methylbutyl group, a 1-(1-cyclohexyl)-1-methylpentyl group, a tert-butyl group, a tert-pentyl group and a tert-hexyl group.

The aryl group for $R^{1\prime\prime}$ to $R^{3\prime\prime}$ is preferably a phenyl group or a naphthyl group.

The alkyl group for $R^{1\prime\prime}$ to $R^{3\prime\prime}$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group. Among these, a methyl group is most preferable because it is excellent in resolution and can be synthesized at a low cost.

When two of $R^{1\prime\prime}$ to $R^{3\prime\prime}$ are bonded to each other to form a ring with the sulfur atom, it is preferable that the two of $R^{1\prime\prime}$ to $R^{3\prime\prime}$ form a 3 to 10-membered ring including the sulfur atom, and it is particularly desirable that the two of $R^{1\prime\prime}$ to $R^{3\prime\prime}$ form a 5 to 7-membered ring including the sulfur atom.

When two of $R^{1\prime\prime}$ to $R^{3\prime\prime}$ are bonded to each other to form a ring with the sulfur atom, the remaining one of $R^{1\prime\prime}$ to $R^{3\prime\prime}$ is preferably an aryl group. As examples of the aryl group, the same aryl groups as those for $R^{1\prime\prime}$ to $R^{3\prime\prime}$ can be used.

Specific examples of cation moiety represented by general formula (I-1) include triphenylsulfonium, (3,5-dimethylphenyl)diphenylsulfonium, (4-(2-adamantoxymethyloxy)-3,5-dimethylphenyl)diphenylsulfonium, (4-(2-adamantoxymethyloxy)phenyl)diphenylsulfonium, (4-(tert-butoxycarbonylmethyloxy)phenyldiphenylsulfonium, (4-(tert-butoxycarbonylmethyloxy)-3,5-dimethylphenyl)diphenylsulfonium, (4-(2-methyl-2-adamantyloxycarbonylmethyloxy)phenyl)diphenylsulfonium, (4-(2-methyl-2-adamantyloxycarbonylmethyloxy)-3,5-dimethylphenyl)diphenylsulfonium, tri(4-methylphenyl)sulfonium, dimethyl(4-hydroxynaphthyl)sulfonium, monophenyldimethylsulfonium, diphenylmonomethylsulfonium, (4-methylphenyl)diphenylsulfonium, (4-methoxyphenyl)diphenylsulfonium, tri(4-tert-butyl)phenylsulfonium, diphenyl(1-(4-methoxy)naphthyl)sulfonium, di(1-naphthyl)phenylsulfonium, 1-phenyltetrahydrothiophenium, 1-(4-methylphenyl)tetrahydrothiophenium, 1-(3,5-dimethyl-4-hydroxyphenyl)tetrahydrothiophenium, 1-(4-methoxynaphthalene-1-yl)tetrahydrothiophenim, 1-(4-ethoxynaphthalene-1-yl)tetrahydrothiophenium, 1-(4-n-butoxynaphthalene-1-yl)tetrahydrothiophenium, 1-phenyltetrahydrothiopyranium, 1-(4-hydroxyphenyl)tetrahydrothiopyranium, 1-(3,5-dimethyl-4-hydroxyphenyl)tetrahydrothiopyranium and 1-(4-methylphenyl)tetrahydrothiopyranium.

In formula (I-2), each of $R^{5\prime\prime}$ and $R^{6\prime\prime}$ independently represents an aryl group or alkyl group. At least one of $R^{5\prime\prime}$ and $R^{6\prime\prime}$ represents an aryl group. It is preferable that both of $R^{5\prime\prime}$ and $R^{6\prime\prime}$ represent an aryl group.

As the aryl group for $R^{5\prime\prime}$ and $R^{6\prime\prime}$, the same aryl groups as those for $R^{1\prime\prime}$ to $R^{3\prime\prime}$ can be used.

As the alkyl group for $R^{5\prime\prime}$ and $R^{6\prime\prime}$, the same alkyl groups as those for $R^{1\prime\prime}$ to $R^{3\prime\prime}$ can be used.

It is particularly desirable that both of $R^{5\prime\prime}$ and $R^{6\prime\prime}$ represents a phenyl group.

Specific examples of cation moiety represented by general formula (I-2) include diphenyliodonium and bis(4-tert-butylphenyl)iodonium.

Further, a cation moiety represented by general formula (I-5) or (I-6) shown below can be preferably used.

[Chemical Formula 48]

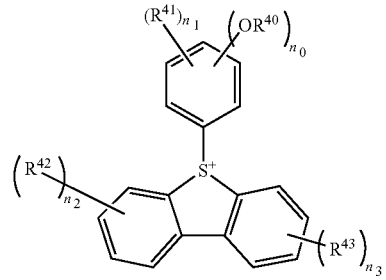

(I-5)

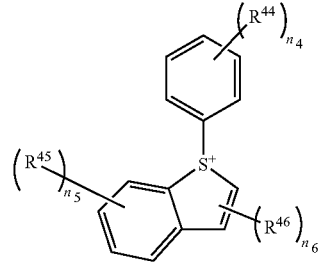

(I-6)

wherein $R^{40}$ represents a hydrogen atom or an alkyl group; $R^{41}$ represents an alkyl group, an acetyl group, a carboxy group or a hydroxyalkyl group; each of $R^{42}$ to $R^{46}$ independently represents an alkyl group, an acetyl group, an alkoxy group, a carboxy group, or a hydroxyalkyl group; each of $n_0$ to $n_5$ independently represents an integer of 0 to 3, with the proviso that $n_0+n_1$ is 5 or less; and $n_6$ represents an integer of 0 to 2.

In general formulas (I-5) and (I-6), with respect to $R^{40}$ to $R^{46}$, the alkyl group is preferably an alkyl group of 1 to 5 carbon atoms, more preferably a linear or branched alkyl group, and most preferably a methyl group, an ethyl group, a propyl group, an isopropyl group, an n-butyl group or a tert butyl group.

The alkoxy group is preferably an alkoxy group of 1 to 5 carbon atoms, more preferably a linear or branched alkoxy group, and most preferably a methoxy group or an ethoxy group.

The hydroxyalkyl group is preferably the aforementioned alkyl group in which one or more hydrogen atoms have been substituted with hydroxy groups, and examples thereof include a hydroxymethyl group, a hydroxyethyl group and a hydroxypropyl group.

If there are two or more of the $OR^{40}$ group, as indicated by the value of no, then the two or more of the $OR^{40}$ group may be the same or different from each other.

If there are two or more of an individual $R^{41}$ to $R^{46}$ group, as indicated by the corresponding value of $n_1$ to $n_6$, ten the two or more of the individual $R^{41}$ to $R^{46}$ group may be the same or different from each other.

$n_0$ is preferably 0 or 1.

$n_1$ is preferably 0 to 2.

It is preferable that each of $n_2$ and $n_3$ independently represent 0 or 1, and more preferably 0.

$n_4$ is preferably 0 to 2, and more preferably 0 or 1.

$n_5$ is preferably 0 or 1, and more preferably 0.

$n_6$ is preferably 0 or 1.

As $A^+$, a cation moiety represented by general formula (I-1) or (I-5) is preferable, and more preferably a cation moiety represented by any one of formulas (I-1-1) to (I-1-10) and (I-5-1) to (I-5-4) shown below. Among these, a cation moiety having a triphenyl skeleton, such as a cation moiety represented by any one of formulas (I-1-1) to (I-1-8) shown below is particularly desirable.

In formulas (I-1-9) and (I-1-10), each of $R^8$ and $R^9$ independently represents a phenyl group or naphthyl group which may have a substituent, an alkyl group of 1 to 5 carbon atoms, an alkoxy group or a hydroxy group.

u is an integer of 1 to 3, and most preferably 1 or 2.

[Chemical Formula 49]

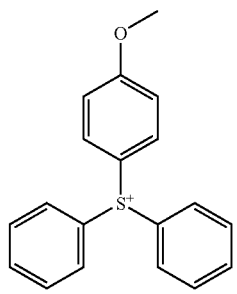

(I-1-1)

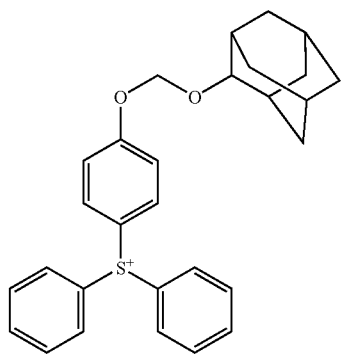

(I-1-2)

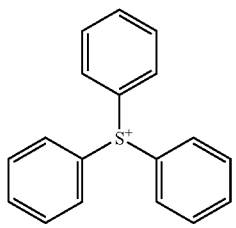

(I-1-3)

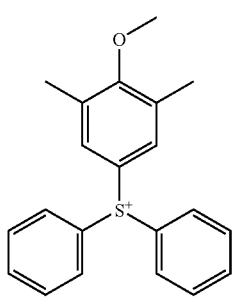

(I-1-4)

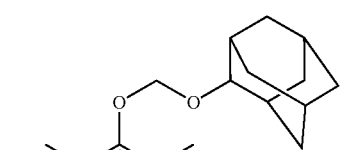

(I-1-5)

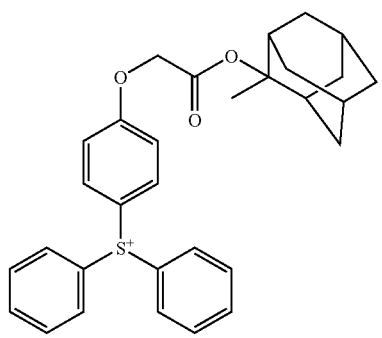

(I-1-6)

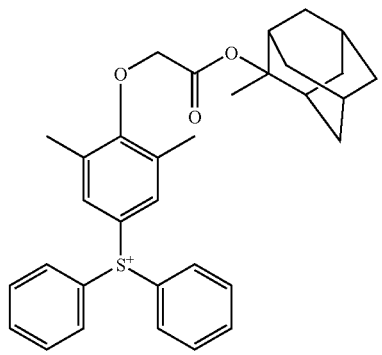

(I-1-7)

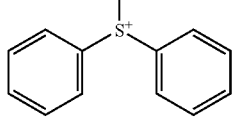

(I-1-8)

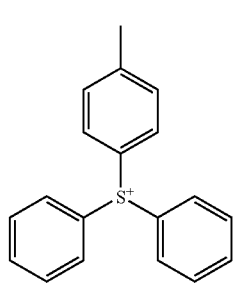

-continued

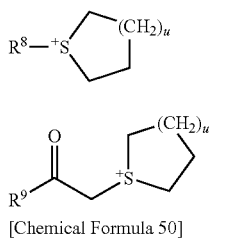

(I-1-9)

(I-1-10)

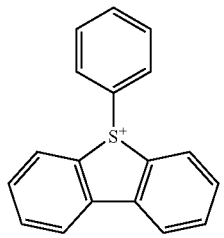

[Chemical Formula 50]

(I-5-1)

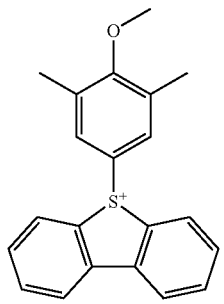

(I-5-2)

(I-5-3)

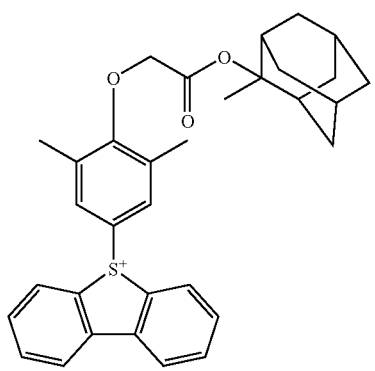

(I-5-4)

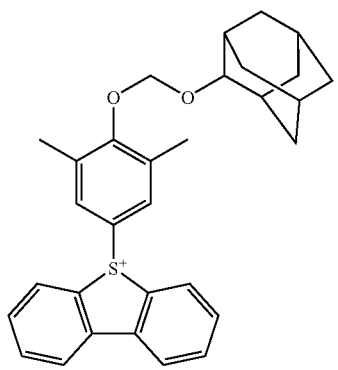

In the present invention, as the component (B1), a compound represented by general formula (b1-1) or (b1-2) shown below is preferable.

[Chemical Formula 51]

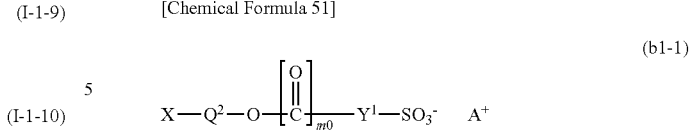

(b1-1)

wherein X, $Y^1$ and $A^+$ are as defined above; $Q^2$ represents a single bond or an alkylene group; and m0 represents 0 or 1.

In general formula (b1-1) above, as X, an aliphatic cyclic group which may have a substituent or an aromatic hydrocarbon group which may have a substituent is preferable. Of these, an aliphatic cyclic group which contains a hetero atom-containing substituent in the ring structure thereof is more preferable.

As the alkylene group for $Q^2$, the same alkylene groups as those described above for $Q^1$ can be used.

As $Q^2$, a single bond or a methylene group is particularly desirable. Especially, when X is an aliphatic cyclic group which may have a substituent, $Q^2$ is preferably a single bond. On the other hands when X is an aromatic hydrocarbon group, $Q^2$ is preferably a methylene group.

m0 may be either 0 or 1. When X is an aliphatic cyclic group which may have a substituent, m0 is preferably 1, On the other hand, when X is an aromatic hydrocarbon group, m0 is preferably 0.

[Chemical Formula 52]

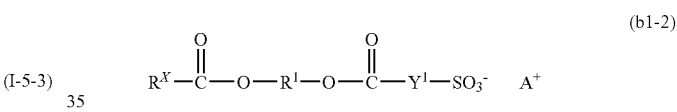

(b1-2)

wherein $R^x$ represents an aliphatic group which may have a substituent exclusive of a nitrogen atom; $R^1$ represents an alkylene group; and $Y^1$ and $A^+$ are as defined above.

In general formula (b1-2) above, $R^x$ represents an aliphatic group which may have a substituent exclusive of a nitrogen atom. Specific examples of $R^x$ include the same aliphatic cyclic groups which may have a substituent as those described above for $Q^2$ in general formula (b1-1) (excluding aliphatic cyclic groups having a substituent containing a nitrogen atom).

Examples of $R^1$ include the same alkylene groups as those described above for $Q^2$ in general formula (b1-1) above.

$Y^1$ and $A^+$ are respectively as defined for $Y^1$ and $A^+$ in general formula (b1-1) above.

As the component (B1), a compound represented by any one of general formulas (b1-1-1) to (b0-1-5) and (b1-2-1) to (01-2-3) shown below is particularly desirable.

[Chemical Formula 53]

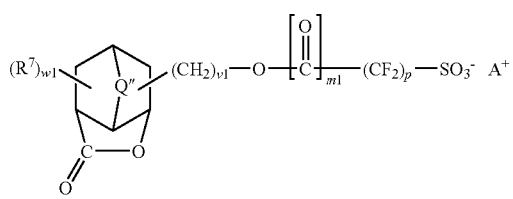

(b1-1-1)

-continued (b1-1-2)

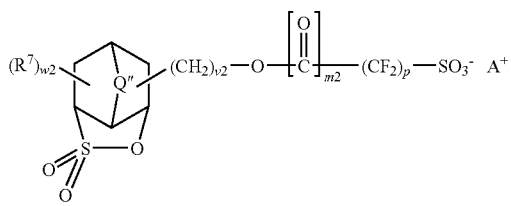

(b1-1-3)

(b1-1-4)

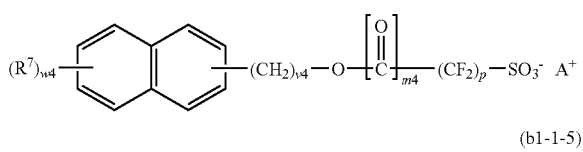

(b1-1-5)

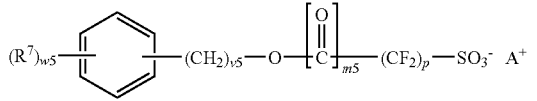

wherein Q" and $A^+$ are as defined above; p represents an integer of 1 to 3; each of m1 to m5 independently represents 0 or 1; each of v1 to v5 independently represents an integer of 0 to 3; each of w1 to w5 independently represents an integer of 0 to 3; and $R^7$ represents a substituent.

As the substituent for $R^7$, the same groups as those which the aforementioned aliphatic hydrocarbon group or aromatic hydrocarbon group may have as a substituent can be used.

If there are two or more of the $R^7$ group, as indicated by the values w1 to w5, then the two or more of the $R^7$ groups may be the same or different from each other.

As described above, $A^+$ is preferably a sulfonium ion or an iodonium ion, more preferably a cation moiety represented by general formula (I-1) or (I-5) above, and most preferably a cation moiety represented by general formula (I-1) above.

[Chemical Formula 54]

(b1-2-1)

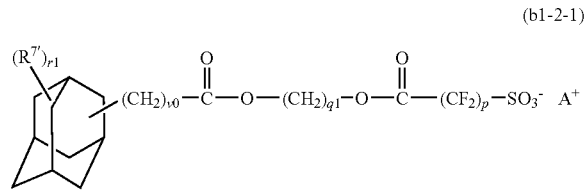

(b1-2-2)

-continued (b1-2-3)

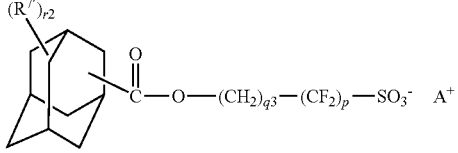

wherein $A^+$ is as defined above; p represents an integer of 1 to 3; each of q1, q2 and q3 independently represents an integer of 1 to 12; each of r1 and r2 independently represents an integer of 0 to 3; g represents an integer of 1 to 20; and $R^{7\prime}$ represents a substituent.

As the substituent for $R^{7\prime}$, the same groups as those which the aforementioned aliphatic hydrocarbon group or aromatic hydrocarbon group may have as a substituent can be used.

If there are two or more of the $R^{7\prime}$ group, as indicated by the value r1 or r2, then the two or more of the $R^{7\prime}$ groups may be the same or different from each other.

p is preferably 1 or 2.

It is preferable that each of q1, q2 and q3 independently represent 1 to 5, and more preferably 1 to 3.

It is preferable that each of r1 and r2 represent an integer of 0 to 2, and more preferably 0 or 1.

g is preferably 1 to 15, and more preferably 1 to 10.

As the component (B1), one type of acid generator may be used alone, or two or more types may be used in combination.

In the resist composition of the present invention, the amount of the component (B1) within the component (B) is preferably 50% by weight or more, more preferably 60% by weight or more, still more preferably 75% by weight or more, and most preferably 100% by weight. By ensuring that the amount of the component (B1) is at least as large as the lower limit of the above-mentioned range, the effects of the present invention can be improved.

The component (B1) can be produced by a conventional method.

As the component (B1), for example, a compound represented by general formula (b1-1) above and a compound represented by general formula (b1-2) above can be produced as follows.

[Production Method of Compound Represented by General Formula (b1-1)]

A compound represented by general formula (b1-1) above can be produced by a method including reacting a compound (b0-1) represented by general formula (b0-1) shown below with a compound (b0-2) represented by general formula (b0-2) shown below.

[Chemical Formula 55]

(b0-1)

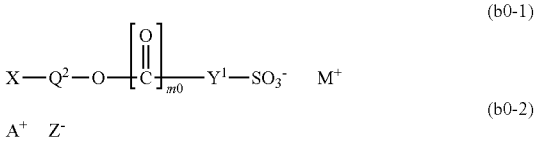

(b0-2)

$A^+$ $Z^-$ (b1-1)

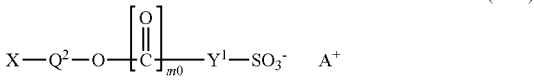

In general formulas (b0-1) and (b0-2) above, X, $Q^2$, m0, $Y^1$ and $A^+$ are respectively as defined for X, $Q^2$, m0, $Y^1$ and $A^+$ in general formula (b1-1) above.

M+ represents an alkali metal ion. Examples of alkali metal ions include a sodium ion, a lithium ion and a potassium ion, and a sodium ion or a lithium ion is preferable.

Z represents a non-nucleophilic ion.

Examples of non-nucleophilic ions include a halogen ion such as a bromine ion or a chlorine ion; an ion capable of forming an acid exhibiting a lower acidity tan the compound (b0-1); $BF_4^-$; $AsF_6^-$; $SbF_6^-$; $PF_6^-$; and $ClO_4^-$.

Examples of ions capable of forming an acid exhibiting a lower acidity than the compound (b0-1) include sulfonic acid ions such as a p-toluenesulfonate acid ion, a methanesulfonate acid ion, benzenesulfonate acid ion and a trifluoromethanesulfonate acid ion.

As the compound (b0-1) and the compound (b0-2), commercially available compounds may be used, or the compounds may be synthesized by a conventional method.

The method of producing the compound (b0-1) is not particularly limited. For example, a compound represented by general formula (b0-1-11) shown below can be dissolved in a solvent such a tetrahydrofuran or water, and the resulting solution can be subjected to a reaction in an aqueous solution of an alkali metal hydroxide such as sodium hydroxide or lithium hydroxide, thereby obtaining a compound represented by general formula (b0-1-12) shown below. Then, the compound represented by general formula (b0-1-12) can be subjected to a dehydration/condensation reaction with an alcohol represented by general formula (b0-1-13) shown below in an organic solvent such as benzene or dichloroethane in the presence of an acidic catalyst, thereby obtaining a compound represented by general formula (b0-1) above in which m0 is 1 (i.e., a compound represented by general formula (b0-1-1) shown below).

[Chemical Formula 56]

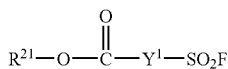
(b0-1-11)

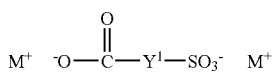
(b0-1-12)

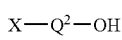
(b0-1-13)

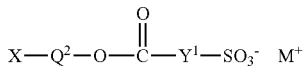
(b0-1-1)

wherein $R^{21}$ represents an alkyl group of 1 to 5 carbon atoms; and X, $Q^2$, $Y^1$ and M+ are respectively as defined for X, $Q^2$, $Y^1$ and M+ in general formula (b0-1) above.

Alternatively, for example, silver fluoride, a compound represented by general formula (b0-1-01) shown below and a compound represented by general formula (b0-1-02) shown below can be subjected to a reaction in an organic solvent such as diglyme anhydride to obtain a compound represented by general formula (b0-1-03) shown below. Then the compound represented by general formula (b0-1-03) can be reacted with an alkali metal hydroxide such as sodium hydroxide or lithium hydroxide in an organic solvent such as tetrahydrofuran, acetone or methyl ethyl ketone, thereby obtaining a compound represented by general formula (b0-1) above in which m0 is 0 (i.e., a compound represented by general formula (b0-1-0) shown below).

In general formula (b0-1-02), as the halogen atom for $X_h$, a bromine atom or a chlorine atom is preferable.

[Chemical Formula 57]

(b0-1-01)

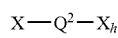
(b0-1-02)

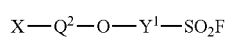
(b0-1-03)

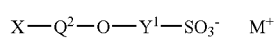
(b0-1-0)

wherein X, $Q^2$, $Y^1$ and M+ are respectively as defined for X, $Q^2$, $Y^1$ and M+ in general formula (b0-1) above; and $X_h$ represents a halogen atom.

The reaction between the compound (b0-1) and the compound (b0-2) can be effected by dissolving the compounds in a solvent such as water, dichloromethane, acetonitrile, methanol, chloroform or methylene chloride, followed by stirring.

The reaction temperature is preferably 0 to 150° C., and more preferably 0 to 100° C. The reaction time varies depending on the reactivity of the compound (b0-1) and the compound (b0-2), the reaction temperature, and the like. However, in general, the reaction temperature is preferably 0.5 to 10 hours, and more preferably 1 to 5 hours.

In general, the amount of the compound (b0-2) used in the reaction is preferably 0.5 to 2 moles, per 1 mole of the compound (b0-1).

[Production Method of Compound Represented by General Formula (b1-2)]

A compound represented by general formula (b1-2) above can be produced by a method including reacting a compound (b0-01) represented by general formula (b0-01) shown below with a compound (b0-02) represented by general formula (b0-02) shown below.

[Chemical Formula 58]

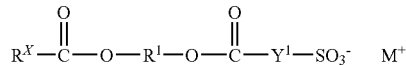
(b0-01)

(b0-02)

(b1-2)

wherein $R^x$ represents a hydrocarbon group which may have a substituent exclusive of a nitrogen atom; $R^1$ represents an alkylene group; $Y^1$ represents a fluorinated alkyl group of 1 to 4 carbon atoms; M+ represents an alkali metal ion; A+ represents an organic cation; and Z− represents a non-nucleophilic ion.

In the formulas above, $R^x$, $R^1$, $Y^1$, M+, A+ and Z− are as defined above.

The aforementioned compound (b0-01) can be synthesized, for example, by reacting a compound (1-3) represented by general formula (1-3) shown below with a compound (2-1) represented by general formula (2-1) shown below.

[Chemical Formula 59]

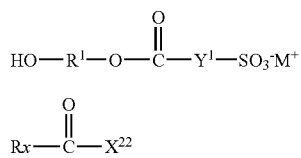

(1-3)

(2-1)

wherein $R^x$, $R^1$, $Y^1$ and $M^+$ are as defined above; and $X^{22}$ represents a halogen atom.

As the halogen atom for $X^{22}$, a bromine atom, a chlorine atom, an iodine atom and a fluorine atom can be used. In terms of reactivity, a bromine atom or a chlorine atom is preferable, and a chlorine atom is particularly desirable.

As the compounds (1-3) and (2-1), commercially available compounds may be used, or the compounds may be synthesized.

A preferable method of synthesizing the compound (1-3) includes reacting a compound (1-1) represented by general formula (1-1) shown below with a compound (1-2) represented by general formula (1-2) shown below, thereby obtaining a compound (1-3).

[Chemical Formula 60]

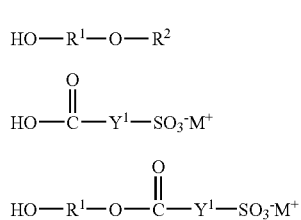

(1-1)

(1-2)

(1-3)

wherein $R^1$, $Y^1$ and $M^+$ are as defined above; $R^2$ represents an aliphatic group which may have an aromatic group as a substituent; and $M^+$ represents an alkali metal ion.

As $M^+$, the same alkali metal ions as those for $M^+$ above can be used.

In formula (1-1), $R^2$ represents an aliphatic group which may have an aromatic group as a substituent.

The aliphatic group may be either a saturated aliphatic group, or an unsaturated aliphatic group. Further, the aliphatic group may be linear, branched or cyclic, or a combination thereof.

The aliphatic group may be either an aliphatic hydrocarbon group consisting of carbon atoms and hydrogen atoms, a group in which a part of the carbon atoms constituting the aforementioned aliphatic hydrocarbon group have been substituted with a hetero atom-containing substituent, or a group in which a part or all of the hydrogen atoms constituting the aforementioned aliphatic hydrocarbon group have been substituted with a hetero atom-containing substituent.

As the hetero atom, there is no particular limitation as long as it is an atom other than a carbon atom and a hydrogen atom. Examples of hetero atoms include a halogen atom, an oxygen atom, a sulfur atom and a nitrogen atom. Examples of halogen atoms include a fluorine atom, a chlorine atom, an iodine atom and a bromine atom.

The hetero atom-containing substituent may consist of a hetero atom, or may be a group containing a group or atom other than a hetero atom.

Specific examples of the substituent group for substituting a part of the carbon atoms include —O—, —C(=O)—O—, —C(=O)—, —O—C(=O)—O—, —C(=O)—NH—, —NH— (wherein H may be substituted with a substituent such as an alkyl group or an acyl group), —S—, —S(=O)$_2$— and —S(=O)$_2$—O—. When the aliphatic hydrocarbon group contains a cyclic group, the aliphatic hydrocarbon group may contain these substituent groups in the ring structure of the cyclic group.

Examples of the substituent group for substituting a part or all of the hydrogen atoms include an alkoxy group, a halogen atom, a halogenated alkyl group, a hydroxyl group, an oxygen atom (=O), —COOR$^{96}$, —OC(=O)R$^{97}$ and a cyano group.

The aforementioned alkoxy group is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the aforementioned halogen atom include a fluorine atom, a chlorine atom, a bromine atom and an iodine atom, and a fluorine atom is preferable.

Example of the aforementioned halogenated alkyl group includes a group in which a part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

Each of $R^{96}$ and $R^{97}$ independently represents a hydrogen atom or a linear, branched or cyclic alkyl group of 1 to 15 carbon atoms.

When the alkyl group for $R^{96}$ and $R^{97}$ is a linear or branched alkyl group, it preferably has 1 to 10 carbon atoms, more preferably 1 to 5, and still more preferably 1 or 2. Specific examples of alkyl groups include the same groups as those for the linear or branched monovalent saturated hydrocarbon group described below.

When the alkyl group for $R^{96}$ and $R^{97}$ is a cyclic group, it may be either a monocyclic group or a polycyclic group. The cyclic group preferably has 3 to 15 carbon atoms, more preferably 4 to 12, and still more preferably 5 to 10. Specific examples of cyclic groups include the same groups as those for the cyclic monovalent saturated hydrocarbon group described below.

As the aliphatic hydrocarbon group, a linear or branched saturated hydrocarbon group of 1 to 30 carbon atoms, a linear or branched unsaturated hydrocarbon group of 2 to 10 carbon atoms, or a cyclic aliphatic hydrocarbon group (aliphatic cyclic group) of 3 to 30 carbon atoms is preferable.

The linear saturated hydrocarbon group preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched saturated hydrocarbon group preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The unsaturated hydrocarbon group preferably has 2 to 5 carbon atoms, more preferably 2 to 4, and most preferably 3. Examples of linear monovalent unsaturated hydrocarbon groups include a vinyl group, a propenyl group (an allyl group) and a butynyl group. Examples of branched monovalent unsaturated hydrocarbon groups include a 1-methylpropenyl group and a 2-methylpropenyl group.

Among the above-mentioned examples, as the unsaturated hydrocarbon group, a propenyl group is particularly desirable.

The aliphatic cyclic group may be either a monocyclic group or a polycyclic group. The aliphatic cyclic group preferably has 3 to 30 carbon atoms, more preferably 5 to 30, still more preferably 5 to 20, still more preferably 6 to 15, and most preferably 6 to 12. As the aliphatic cyclic group, a group in which one or more hydrogen atoms have been removed from a monocycloalkane or a polycycloalkane such as a bicycloalkane, tricycloalkane or tetracycloalkane can be used. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

The aliphatic group for $R^2$ in formula (1-1) above may have an aromatic group as a substituent.

Examples of aromatic groups include an aryl group which is an aromatic hydrocarbon ring having one hydrogen atom removed therefrom, such as a phenyl group, a biphenyl group, a fluorenyl group, a naphthyl group, an anthryl group or a phenanthryl group; and a heteroaryl group in which a part of the carbon atoms constituting the aforementioned aryl group has been substituted with a hetero atom such as an oxygen atom, a sulfur atom or a nitrogen atom.

The aromatic group may have a substituent such as an alkyl group of 1 to 10 carbon atoms, a halogenated alkyl group, an alkoxy group, a hydroxyl group or a halogen atom. The alkyl group or halogenated alkyl group as a substituent preferably has 1 to 8 carbon atoms, and more preferably 1 to 4 carbon atoms. Further, the halogenated alkyl group is preferably a fluorinated alkyl group. Examples halogen atoms include a fluorine atom, a chlorine atom, an iodine atom and a bromine atom, and a fluorine atom is preferable.

If the $R^2$ group in the compound (1-1) represents an aromatic group, i.e., when the oxygen atom adjacent to the $R^2$ group is directly bonded to an aromatic ring without interposing an aliphatic group, the reaction between the compound (1-1) and the compound (1-2) does not proceed, such that the compound (1-3) cannot be obtained.

As the compounds (1-1) and (1-2), commercially available compounds may be used, or the compounds may be synthesized by a conventional method.

For example, a method including heating a compound (0-1) represented by general formula (0-1) shown below in the presence of an alkali, and neutralizing the resultant, thereby obtaining a compound (0-2) represented by general formula (0-2) shown below (hereafter, this step is referred to as "salt-formation step"); and heating the compound (0-2) in the presence of an acid having an acid strength stronger than that of the compound (1-2), thereby obtaining the compound (1-2) (hereafter, this step is referred to as "carboxylic acid-generation step") can be used.

[Chemical Formula 61]

wherein $R^{01}$ represents an alkyl group; and $Y^1$ and $M^+$ are as defined above.

As the alkyl group for $R^{01}$, a linear or branched alkyl group is preferable, and specific examples include a methyl group, an ethyl group, a propyl group, an isopropyl group, an n-butyl group, an isobutyl group, a tert-butyl group, a pentyl group, an isopentyl group and a neopentyl group.

Among these, an alkyl group of 1 to 4 carbon atoms is preferable, and a methyl group is particularly desirable.

As the compound (0-1), a commercially available compound can be used.

The salt-formation step can be performed, for example, by dissolving the compound (0-1) in a solvent, and adding an alkali to the resulting solution, followed by heating.

As the solvent, any solvent which is capable of dissolving the compound (0-1) can be used. Examples of such a solvent include water and tetrahydrofuran.

As the alkali, an alkali corresponding to $M^+$ in formula (0-2) is used. Examples of such an alkali include alkali metal hydroxides such as sodium hydroxide, potassium hydroxide and lithium hydroxide.

The amount of the alkali used is preferably 1 to 5 moles, more preferably 2 to 4 moles, per 1 mole of the compound (0-1).

The heating temperature is preferably 20 to 120° C., and more preferably 50 to 100° C. The heating time depends on the heating temperature and the like, but in general, the heating time is preferably 0.5 to 12 hours, and more preferably 1 to 5 hours.

The neutralization following the heating can be conducted by adding an acid such as hydrochloric acid, sulfuric acid or p-toluenesulfonic acid to the reaction mixture following the heating.

It is preferable to conduct the neutralization so that the pH of the reaction mixture (25° C.) after addition of an acid falls within the range of 6 to 8. Further, the temperature of the reaction mixture during the neutralization is preferably 20 to 30° C., and more preferably 23 to 27° C.

After the reaction, the compound (0-2) within the reaction mixture may be separated and purified. The separation and purification can be conducted by a conventional method. For example, any one of concentration, solvent extraction, distillation, crystallization, recrystallization and chromatography can be used alone, or two or more of these methods may be used in combination.

In the carboxylic acid-generation step, the compound (0-2) obtained in the salt-formation step is heated in the presence of an acid having an acid strength stronger than that of the compound (1-2), thereby obtaining the compound (1-2).

"An acid having an acid strength stronger than that of the compound (1-2)" (hereafter, frequently referred to simply as "strong acid") refers to an acid having a pKa value (25° C.) smaller than that of —COOH within the compound (1-2). By using such a strong acid, —COO⁻M⁺ within the compound (0-2) can be converted into —COOH, thereby obtaining the compound (1-2).

The strong acid can be appropriately selected from any conventional acids which exhibit a pKa value smaller than that of —COOH within the compound (1-2). The pKa value of —COOH within the compound (1-2) can be determined by a conventional titration method.

Specific examples of strong acids include a sulfonic acid, such as an arylsulfonic acid or an alkylsulfonic acid; sulfuric acid; and hydrochloric acid. An example of an arylsulfonic acid includes p-toluenesulfonic acid. Examples of alkylsulfonic acids include methanesulfonic acid and trifluoromethane sulfonic acid. In consideration of solubility in an organic solvent and ease in purification, p-toluenesulfonic acid is particularly desirable as the strong acid.

The carboxylic acid-generation step can be performed, for example, by dissolving the compound (0-2) in a solvent, and adding an acid to the resulting solution, followed by heating.

As the solvent any solvent which is capable of dissolving the compound (0-2) can be used. Examples of such solvents include acetonitrile and methyl ethyl ketone.

The amount of the strong acid used is preferably 0.5 to 3 moles, and more preferably 1 to 2 moles, per 1 mole of the compound (0-2).

The heating temperature is preferably 20 to 150° C., and more preferably 50 to 120° C. The heating time depends on the heating temperature and the like, but in general, the heating time is preferably 0.5 to 12 hours, and more preferably 1 to 5 hours.

After the reaction, the compound (1-2) within the reaction mixture may be separated and purified. The separation and purification can be conducted by a conventional method. For example, any one of concentration, solvent extraction, distillation, crystallization, recrystallization and chromatography can be used alone, or two or more of these methods may be used in combination.

The method of reacting the compound (1-3) with the compound (2-1) is not particularly limited, and can be performed, for example, by allowing the compound (1-3) to come in contact with the compound (2-1) in a reaction solvent. Such a method can be performed, for example, by adding the compound (2-1) to a solution obtained by dissolving the compound (1-3) in a reaction solvent, in the presence of a base.

As the reaction solvent, any solvent which is capable of dissolving the compound (1-3) and the compound (2-1) as the raw materials can be used. Specific examples of such solvents include tetrahydrofuran (THF), acetone, dimethylformamide (DMF), dimethylacetamide, dimethylsulfoxide (DMSO) and acetonitrile.

Examples of bases include organic bases such as triethylamine, 4-dimethylaminopyridine (DMAP) and pyridine, and inorganic bases such as $K_2CO_3$ and $Cs_2CO_3$.

The amount of the compound (2-1) is preferably 1 to 3 equivalents, and more preferably 1 to 2 equivalents, based on the amount of the compound (1-3).

The reaction temperature is preferably −20 to 40° C., and more preferably 0 to 30° C. The reaction time depends on the reactivity of the compound (1-3) and the compound (2-1), the reaction temperature, and the like, but in general, the reaction temperature is preferably 1 to 120 hours, and more preferably 1 to 48 hours.

The reaction between the compound (b0-01) and the compound (b0-02) can be conducted by a conventional salt substitution method. For example, the reaction may be conducted by dissolving the compound (b0-01) and the compound (b0-02) in a solvent such as water, dichloromethane, acetonitrile, methanol or chloroform, followed by stirring or the like.

The reaction temperature is preferably 0 to 150° C., and more preferably 0 to 100° C. The reaction time depends on the reactivity of the compound (b0-01) and the compound (b0-02), the reaction temperature, or the like, but in general, the reaction time is preferably 0.5 to 10 hours, more preferably 1 to 5 hours.

After the reaction, the compound (b1-1) within the reaction mixture may be separated and purified. The separation and purification can be conducted by a conventional method. For example, any one of concentration, solvent extraction, distillation, crystallization, recrystallization and chromatography can be used alone, or two or more of these methods may be used in combination.

The structure of the compound (b1-1) obtained in the above-described manner can be confirmed by a general organic analysis method such as $^1$H-nuclear magnetic resonance (NMR) spectrometry, $^{13}$C-NMR spectrometry, $^{19}$F-NMR spectrometry, infrared absorption (IR) spectrometry, mass spectrometry (MS), elementary analysis and X-ray diffraction analysis.

[Component (B2)]

In the resist composition of the present invention, if desired, the component (B) may further include an acid generator other than the component (B1) (hereafter, referred to as "component (B2)").

The component (B2) is not particularly limited as long it does not fall under the category of the component (B1), and any conventional acid generator can be used. Examples of these acid generators are numerous, and include onium salt-based acid generators which do not fall under the category of the component (B1); oxime sulfonate-based acid generators; diazomethane-based acid generators such as bisalkyl or bisaryl sulfonyl diazomethanes and poly(bis-sulfonyl)diazomethanes; nitrobenzylsulfonate-based acid generators; iminosulfonate-based acid generators; and disulfone-based acid generators.

However, the component (B2) does not include acid generators which fall under the category of the component (C) described below.

As an onium salt-based acid generator which does not fall under the category of the component (B1), a compound represented by general formula (b-1) or (b-2) shown below can be used.

[Chemical Formula 62]

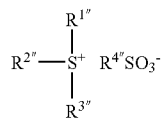

(b-1)

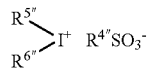

(b-2)

wherein in general formula (b-1), each of $R^{1\prime\prime}$ to $R^{3\prime\prime}$ independently represents an aryl group which may have a substituent or an alkyl group which may have a substituent, with the proviso that at least one of $R^{1\prime\prime}$ to $R^{3\prime\prime}$ represents an aryl group, and wherein two of $R^{1\prime\prime}$ to $R^{3\prime\prime}$ may be bonded to each other to form a ring with the sulfur atom; in general formula (b-2), each of $R^{5\prime\prime}$ to $R^{6\prime\prime}$ independently represents an aryl group which may have a substituent or an alkyl group which may have a substituent, with the proviso that and at least one of R⁵‴ and R⁶‴ represents an aryl group; and in general formulas (b-1) and (b-2), R⁴‴ represents a linear, branched or cyclic fluorinated alkyl group, with the proviso that the carbon atom adjacent to the sulfur atom within the $SO_3^-$ group has a fluorine atom bonded thereto.

In general formula (b-1), R¹‴ to R³‴ are respectively as defined for R¹‴ to R³‴ in general formula (I-1) above.

In general formula (b-2), R⁵‴ and R⁶‴ are respectively as defined for R⁵‴ and R⁶‴ in general formula (I-2) above.

R⁴‴ represents a linear, branched or cyclic alkyl or fluorinated alkyl group.

The linear or branched fluorinated alkyl group preferably has 1 to 10 carbon atoms, more preferably 1 to 8 carbon atoms, and most preferably 1 to 4 carbon atoms.

The cyclic fluorinated alkyl group preferably has 4 to 15 carbon atoms, more preferably 4 to 10 carbon atoms, and most preferably 6 to 10 carbon atoms. Specific examples include a cyclopentyl group and a cyclohexyl group.

As the fluorinated alkyl group, a linear, branched or cyclic alkyl group in which a part or all of the hydrogen atoms have been substituted with fluorine atoms can be used, with the proviso that the carbon atom adjacent to the sulfur atom within the $SO_3^-$ group has a fluorine atom bonded thereto.

The fluorination ratio of the fluorinated alkyl group (i.e., the percentage of the number of fluorine atoms within the alkyl group, based on the total number of hydrogen atoms and fluorine atoms within the alkyl group) is preferably from 10 to 100%, more preferably from 50 to 100%, and a fluorinated alkyl group in which all hydrogen atoms are substituted with fluorine atoms (i.e., a perfluoroalkyl group) is particularly desirable because the acid strength increases.

R⁴‴ is most preferably a linear or cyclic fluorinated alkyl group.

Specific examples of anions represented by the formula R⁴‴$SO_3^-$ include trifluoromethanesulfonate, heptafluoropropanesulfonate and nonafluorobutanesulfonate.

Further, onium salt-based acid generators in which the anion moiety in general formula (b-1) or (b-2) is replaced by an anion moiety represented by general formula (b-3) or (b-4) shown below (the cation moiety is the same as (b-1) or (b-2)) may be used.

[Chemical Formula 63]

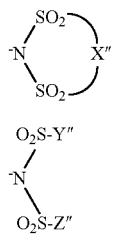

(b-3)

(b-4)

wherein X″ represents an alkylene group of 2 to 6 carbon atoms in which at least one hydrogen atom has been substituted with a fluorine atom; and Y″ and Z″ each independently represents an alkyl group of 1 to 10 carbon atoms in which at least one hydrogen atom has been substituted with a fluorine atom.

X″ represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Each of Y″ and Z″ independently represents a linear or branched alkyl group in which at least one hydrogen atom has been substituted with a fluorine atom, and the alkyl group has 1 to 10 carbon atoms, preferably 1 to 7 carbon atoms, and most preferably 1 to 3 carbon atoms.

The smaller the number of carbon atoms of the alkylene group for X″ or those of the alkyl group for Y″ and Z″ within the above-mentioned range of the number of carbon atoms, the more the solubility in a resist solvent is improved.

Further, in the alkylene group for X″ or the alkyl group for Y″ and Z″, it is preferable that the number of hydrogen atoms substituted with fluorine atoms is as large as possible because the acid strength increases and the transparency to high energy radiation of 200 nm or less or electron beam is improved. The amount of fluorine atoms within the alkylene group or alkyl group, i.e., fluorination ratio, is preferably from 70 to 100%, more preferably from 90 to 100%, and it is particularly desirable that the alkylene group or alkyl group be a perfluoroalkylene or perfluoroalkyl group in which all hydrogen atoms are substituted with fluorine atoms.

Further, onium salts having a cation moiety represented by general formula (I-5) or (I-6) above, and having a fluorinated alkylsulfonate ion (e.g., the anion moiety (R⁴‴$SO_3^-$) in general formula (b-1) or (b-2) above) or an anion moiety represented by general formula (b-3) or (b-4) above as the anion moiety, can be used.

As an oximesulfonate-based acid generator, a compound having at least one group represented by general formula (B-1) shown below, and has a feature of generating acid by irradiation can be used. Such oximesulfonate-based acid generators are widely used for a chemically amplified resist composition, and can be appropriately selected.

[Chemical Formula 64]

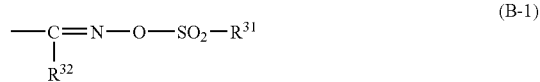

(B-1)

wherein $R^{31}$ and $R^{32}$ each independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The expression "having a substituent" means that some or all of the hydrogen atoms of the alkyl group or the aryl group are substituted with substituents.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which some of the hydrogen atoms are substituted with halogen atoms, and the "completely halogenated alkyl group" refers to an alkyl group in which all of the hydrogen atoms are substituted with halogen atoms. Examples of the halogen atom include a fluorine atom, a chlorine atom, a bromine atom and an iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which some of the hydrogen atoms are substituted with halogen atoms, and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, aryl group, or cyano group is preferable. Examples of the alkyl group and the aryl group for $R^{32}$ are the same as those of the alkyl group and the aryl group for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate-based acid generator include compounds represented by general formula (B-2) or (B-3) shown below.

[Chemical Formula 65]

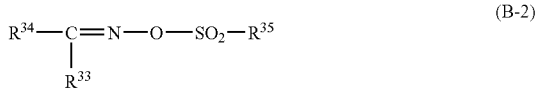

(B-2)

wherein $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 66]

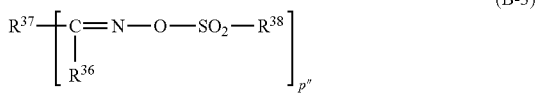

(B-3)

wherein $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenantryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. The halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (B-3), the alkyl group having no substituent and the halogenated alkyl group for $R^{36}$ are the same as the alkyl group having no substituent and the halogenated alkyl group for $R^{33}$.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxime sulfonate-based acid generators include α-p-toluenesulfonyloxyimino)-benzyl cyanide, α-p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(metylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 2004/074242A (Examples 1 to 40 described at pages 65 to 85) may be preferably used.

Furthermore, as preferable examples, the following can be used.

[Chemical Formula 67]

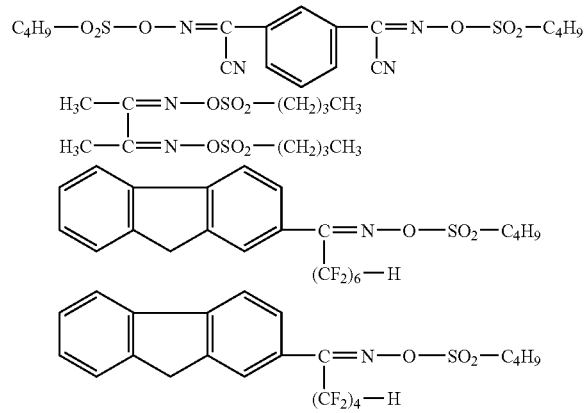

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as poly(bis-sulfonyldiazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsufonyl)propane, 1,6-bis(cyclohexylsulfonyldiazomethylsulfonyl)hexane, and 1,10-bis(cyclohexylsulfonyldiazomethylsulfonyl)decane, may be mentioned.

As the component (B2), one type of acid generator may be used, or two or more types may be used in combination.

The total amount of the component (B) within the resist composition of the present invention is preferably 0.5 to 30 parts by weight, and more preferably 1 to 20 parts by weight, relative to 100 parts by weight of the component (A). When the amount of the component (B) is within the above-mentioned range, formation of a resist pattern can be satisfactorily performed. Further, by virtue of the above-mentioned range, a uniform solution can be obtained and the storage stability becomes satisfactory.

<Component (C)>

The resist composition of the present invention further includes an organic compound (C) which generates an acid exhibiting a weaker acid strength than the acid generated from the acid generator (B1) upon exposure.

In the present description and claims, the expression "weak acid strength" means that the acid dissociation constant (pKa) as measured with respect to the conjugate acid in an aqueous solution at 25° C. is large.

The acid dissociation constant (pKa) can be measured, for example, in dimethyl sulfoxide (DMSO), using a pKa measuring apparatus (product name: pKa Analyzer Pro; manufactured by Advanced Analytical Technologies, Inc.).

As the component (C), any organic compound can be used which is capable of generating an acid exhibiting weaker acid strength than the acid generated from the component (B1) upon exposure.

For example, when the component (A) includes a resin component (A1) having the aforementioned structural unit (a1), the component (C) is preferably an organic compound which, upon exposure, generates an acid exhibiting acid strength such that the acid dissociable group within the structural unit (a1) is not dissociated by the acid. By virtue of using such an organic compound as the component (C), a resist pattern having an excellent shape can be formed, and the lithography properties are improved. Further, a good balance can be achieved with the component (B1).

Examples of the component (C) include an organic compound (C1) that generates a sulfonic acid (with the proviso that the carbon atom adjacent to the sulfur atom within the —$SO_3H$ group of the generated sulfonic acid has no fluorine atom bonded thereto) and an organic compound (C2) that generates a carboxylic acid.

Specifically, as the organic compound (C1) that generates a sulfonic acid (hereafter, referred to as "component (C1)"), any onium salt-based acid generators which have been proposed for use in chemically amplified resist compositions and have an anion moiety in which the carbon atom adjacent to the sulfur atom within the —$SO_3H$ group has no fluorine atom bonded thereto can be used.

Examples of such onium salt-based acid generators include the aforementioned onium salt-based acid generators for the component (B2) wherein the anion moiety ($R^{4'''}SO_3^-$) have been replaced with an anion in which the carbon atom adjacent to the sulfur atom within the —$SO_3H$ group has no fluorine atom bonded thereto.

Examples of such anions include sulfonate ions having a hydrocarbon group which may or may not have a substituent.

Among the aforementioned examples, as the component (C1), an organic compound represented by general formula (c1) shown below can be preferably used.

[Chemical Formula 68]

$$R^O\text{—}SO_3^-Z^+ \qquad (c1)$$

wherein $R^O$ represents a hydrocarbon group of 1 to 12 carbon atoms which may have a substituent, with the proviso that the carbon atom adjacent to the sulfur atom within the —SO$_3^-$ group has no fluorine atom bonded thereto; and Z$^+$ represents an organic cation.

In general formula (c1) above, the hydrocarbon group for R$^0$ may or may not have a substituent, with the proviso that the carbon atom adjacent to the sulfur atom within the —SO$_3^-$ group has no fluorine atom bonded thereto. Therefore, upon exposures the component (C1) generates a sulfonic acid exhibiting a weaker acid strength than the sulfonic acid generated from the component (B1). As a result, in the present invention, a resist pattern having an excellent shape can be formed, and the lithography properties can be improved.

The substituent preferably contains no fluorine atom, and examples thereof include a lower alkyl group of 1 to 5 carbon atoms and an oxygen atom (=O).

The hydrocarbon group of 1 to 12 carbon atoms for R$^0$ may be either an aliphatic hydrocarbon group or an aromatic hydrocarbon group. By virtue of using a hydrocarbon group of 1 to 12 carbon atoms, the rectangularity of the resist pattern is improved.

When the hydrocarbon group for R$^0$ is an aliphatic hydrocarbon group, the aliphatic hydrocarbon group may be either saturated or unsaturated, but in general, the aliphatic hydrocarbon group is preferably saturated.

Further, the aliphatic hydrocarbon group may be either a chain-like (linear or branched) hydrocarbon group, or a cyclic hydrocarbon group.

As the chain-like hydrocarbon group, a linear or branched alkyl group is preferable. The alkyl group preferably has 1 to 10 carbon atoms, more preferably 1 to 8, and still more preferably 3 to 8.

Specific examples of linear or branched alkyl groups include a methyl group, an ethyl group, an n-propyl group, an isopropyl group, an n-butyl group, an isobutyl group, a tert-butyl group, a pentyl group, an isopentyl group, a neopentyl group, an n-hexyl group, an n-heptyl group and an n-octyl group. Among these, a methyl group, an n-propyl group and an n-octyl group are preferable, and an n-octyl group is particularly desirable.

Specific examples of the component (C) having a sulfonate ion as the anion moiety in which R$^0$ is a linear or branched alkyl group include onium salts having a cation represented by general formula (I-1), (I-2), (I-5) or (I-6) above as the cation moiety, and a sulfonate ion represented by general formula (c1-1) shown below as the anion moiety.

[Chemical Formula 69]

C$_a$H$_{2a+1}$SO$_3^-$ (c1-1)

In general formula (c1-1) above, a represents an integer of 1 to 10, and preferably 1 to 8.

Specific examples of sulfonate ions represented by general formula (c1-1) above include a methanesulfonate ion, an ethanesulfonate ion, an n-propanesulfonate ion, an n-butanesulfonate ion and an n-octanesulfonate ion.

Examples of cyclic hydrocarbon groups as the hydrocarbon group for R$^0$ include an aliphatic cyclic group and a group in which at least one hydrogen atom within a chain-like hydrocarbon group have been substituted with an aliphatic cyclic group (aliphatic cyclic group-containing group).

As the "aliphatic cyclic group", the same aliphatic cyclic groups as those described above in connection with the acid dissociable, dissolution inhibiting group for the component (A) can be used. The aliphatic cyclic group preferably has 3 to 12 carbon atoms, and more preferably 4 to 10.

The aliphatic cyclic group may be either a polycyclic group or a monocyclic group.

As the monocyclic group, a group in which one hydrogen atom has been removed from a monocycloalkane of 3 to 6 carbon atoms is preferable, and specific examples thereof include a cyclopentyl group and a cyclohexyl group.

The polycyclic group preferably has 7 to 12 carbon atoms, and specific examples thereof include an adamantyl group, a norbornyl group, an isobornyl group, a tricyclodecanyl group and a tetracyclododecanyl group.

Among the aforementioned examples, a polycyclic group is preferable, and an adamantyl group, a norbornyl group or a tetracyclododecanyl group is preferable from industrial viewpoint.

As the aliphatic cyclic group within the "aliphatic cyclic group-containing group", the same groups as those described above can be used. As the chain-like hydrocarbon group to which the aliphatic cyclic group is bonded to form the "aliphatic cyclic group-containing group", a linear or branched alkyl group is preferable, and a lower alkyl group of 1 to 5 carbon atoms is more preferable. Specific examples thereof include a methyl group, an ethyl group, an n-propyl group, an isopropyl group, an n-butyl group, an isobutyl group, a tert-butyl group, a pentyl group, an isopentyl group and a neopentyl group. Among these, a linear alkyl group is preferable, and from industrial viewpoint, a methyl group or an ethyl group is more preferable.

Specific examples of sulfonate ions in which R$^0$ is a cyclic hydrocarbon group include sulfonate ions represented by formulas (c1-2-1) to (c1-2-7) shown below.

In the present invention, as the anion moiety of the component (C), the anion moiety represented by formula (c1-2-1) shown below is particularly desirable.

[Chemical Formula 70]

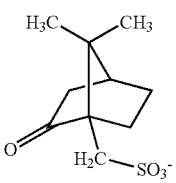

(c1-2-1)

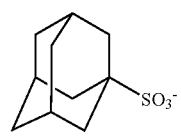

(C1-2-2)

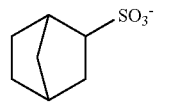

(c1-2-3)

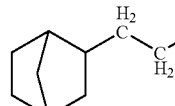

(c1-2-4)

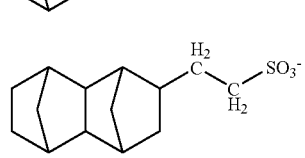

(c1-2-5)

-continued

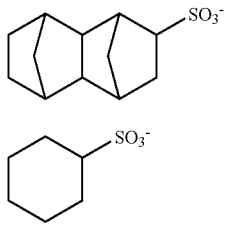

(c1-2-6)

(c1-2-7)

Examples of aromatic hydrocarbon groups as the hydrocarbon group for $R^0$ include a phenyl group, a tolyl group, a xylyl group, a mesityl group, a phenethyl group and a naphthyl group. As described above, the aromatic hydrocarbon group may or may not have a substituent.

Specific examples of aromatic hydrocarbon groups for $R^0$ include groups represented by general formula (c1-3-1) or (c1-3-2) shown below.

[Chemical Formula 71]

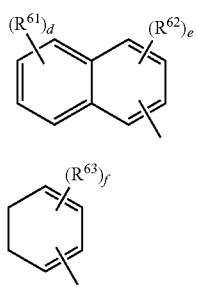

(c1-3-1)

(c1-3-2)

In general formula (c1-3-1) above, each of $R^{61}$ and $R^{62}$ independently represents an alkyl group of 1 to 5 carbon atoms or an alkoxy group of 1 to 5 carbon atoms.

Examples of alkyl groups for $R^{61}$ and $R^{62}$ include a methyl group, an ethyl group, an n-propyl group, an isopropyl group, an n-butyl group, an isobutyl group, a tert-butyl group, a pentyl group, an isopentyl group and a neopentyl group. Among these, a methyl group is particularly desirable.

Examples of alkoxy groups for $R^{61}$ and $R^{62}$ include a methoxy group, an ethoxy group, an n-propoxy group, an isopropoxy group, an n-butoxy group and a tert-butoxy group. Among these, a methoxy group or an ethoxy group is particularly desirable.

Each of d and e independently represents an integer of 0 to 4, preferably 0 to 2, and most preferably 0.

If there are two ore more of the $R^{61}$ group and/or the $R^{62}$ group, as indicated by the value d and/or e, then the two or more of the $R^{61}$ group and/or the $R^{62}$ group may be the same or different from each other.

In general formula (c1-3-2) above, $R^{63}$ represents an alkyl group of 1 to 5 carbon atoms or an alkoxy group of 1 to 5 carbon atoms.

Examples of alkyl groups for $R^{63}$ include a methyl group, an ethyl group, an n-propyl group, an isopropyl group, an n-butyl group, an isobutyl group, a text-butyl group, a pentyl group, an isopentyl group and a neopentyl group. Among these, a methyl group is particularly desirable.

Examples of alkoxy groups for $R^{63}$ include a methoxy group, an ethoxy group, an n-propoxy group, an isopropoxy group, an n-butoxy group and a tert-butoxy group. Among these, a methoxy group or an ethoxy group is particularly desirable.

f represents an integer of 0 to 3, preferably 1 or 2, and most preferably 1.

If there are two ore more of the $R^{63}$ group, as indicated by the value f, the two or more of $R^{63}$ may be the same or different from each other.

In general formula (c1) above, the organic cation for $Z^+$ is not particularly limited, and the same cations as those which have been proposed for the cation moiety of onium salt-based acid generators can be used. Examples of such cations include the same cations as those described above for the cation moiety of the component (B1). As the organic cation for $Z^+$, a cation represented by general formula (I-1), (I-2), (I-5) or (I-6) above is preferable, and a cation represented by general formula (I-1) above is particularly desirable.

As the organic compound (C2) that generates a carboxylic acid (hereafter, referred to as "component (C2)"), an organic compound represented by general formula (c2) shown below can be preferably used.

[Chemical Formula 72]

$$R^{02}\text{—COO}^-Z^+ \quad (c2)$$

wherein $R^{02}$ represents a hydrocarbon group of 1 to 12 carbon atoms which may have a substituent; and t represents an organic cation.

In general formula (c2) above, the hydrocarbon group for $R^{02}$ may or may not have a substituent. Examples of substituents include a lower alkyl group of 1 to 5 carbon atoms, an oxygen atom (=O) and a halogen atom (e.g., a fluorine atom, a chlorine atom, a bromine atom or an iodine atom).

The hydrocarbon group of 1 to 12 carbon atoms for $R^{02}$ may be either an aliphatic hydrocarbon group or an aromatic hydrocarbon group. By virtue of using a hydrocarbon group of 1 to 12 carbon atoms, the rectangularity of the resist pattern is improved.

When the hydrocarbon group for $R^{02}$ is an aliphatic hydrocarbon group, the aliphatic hydrocarbon group may be either saturated or unsaturated, but in general, the aliphatic hydrocarbon group is preferably saturated.

Further, the aliphatic hydrocarbon group may be either a chain-like (linear or branched) hydrocarbon group, or a cyclic hydrocarbon group.

As the chain-like hydrocarbon group, a linear or branched alkyl group which may have a substituent is preferable. The alkyl group preferably has 1 to 10 carbon atoms.

Specific examples of linear or branched alkyl groups include a methyl group, an ethyl group, an n-propyl group, an isopropyl group, an n-butyl group, an isobutyl group, a tert-butyl group, a pentyl group, an isopentyl group, a neopentyl group, an n-hexyl group, an n-heptyl group and an n-octyl group. Among these, a methyl group, an n-propyl group, an n-butyl group and an n-octyl group are preferable, and a methyl group or a trifluoromethyl group is particularly desirable.

Examples of cyclic hydrocarbon groups as the hydrocarbon group for $R^0$ include an aliphatic cyclic group and a group in which at least one hydrogen atom within a chain-like hydrocarbon group have been substituted with an aliphatic cyclic group (aliphatic cyclic group-containing group).

As the "aliphatic cyclic group", the same aliphatic cyclic groups as those described above in connection with the acid dissociable, dissolution inhibiting group for the component (A) can be used. The aliphatic cyclic group preferably has 3 to 12 carbon atoms, and more preferably 4 to 10.

The aliphatic cyclic group may be either a polycyclic group or a monocyclic group.

As the monocyclic group, a group in which one hydrogen atom has been removed from a monocycloalkane of 3 to 6 carbon atoms is preferable, and specific examples thereof include a cyclopentyl group and a cyclohexyl group.

The polycyclic group preferably has 7 to 12 carbon atoms, and specific examples thereof include an adamantyl group, a norbornyl group, an isobornyl group, a tricyclodecanyl group and a tetracyclododecanyl group.

Among the aforementioned examples, a polycyclic group is preferable, and an adamantyl group, a norbornyl group or a tetracyclododecanyl group is preferable from industrial viewpoint. Further, as described above, these aliphatic cyclic groups may or may not have a substituent.

As the aliphatic cyclic group within the "aliphatic cyclic group-containing group", the same groups as those described above can be used. As the chain-like hydrocarbon group to which the aliphatic cyclic group is bonded to form the "aliphatic cyclic group-containing group", a linear or branched alkyl group is preferable, and more preferably a lower alkyl group of 1 to 5 carbon atoms. Specific examples of lower alkyl groups of 1 to 5 carbon atoms include a methyl group, an ethyl group, an n-propyl group, an isopropyl group, an n-butyl group, an isobutyl group, a tert-butyl group, a pentyl group, an isopentyl group and a neopentyl group. Among these, a linear alkyl group is preferable, and from industrial viewpoint, a methyl group or an ethyl group is more preferable.

In general formula (c2) above, as the organic cation for $Z^+$, the same organic cations as those for $Z^+$ in general formula (c1) above can be used.

As the component (C), one type of organic compound may be used alone, or two or more types of organic compounds may be used in combination.

In the resist composition of the present invention, the amount of the component (C) relative to 100 parts by weight of the component (A) is preferably within the range of 0.01 to 10 parts by weight, more preferably 0.05 to 10 parts by weight, still more preferably 0.1 to 8 parts by weight and most preferably 0.5 to 6 parts by weight. By ensuring that the amount of the component (C) be at least as large as the lower limit of the above-mentioned range, a resist pattern having an excellent shape can be formed, and the lithography properties are improved. On the other hand, by ensuring that the amount of the component (C) be no more than the upper limit of the above-mentioned range, the storage stability becomes satisfactory.

<Optional Components>

[Component (D)]

In the resist composition of the present invention, for improving the resist pattern shape and the post exposure stability of the latent image formed by the pattern-wise exposure of the resist layer, a nitrogen-containing organic compound (D) (hereafter referred to as the component (D)) can be further added.

A multitude of these components (D) have already been proposed, and any of these known compounds may be used, although a cyclic amine or an aliphatic amine, and particularly a secondary aliphatic amine or tertiary aliphatic amine is preferable. An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of no more than 12 carbon atoms (i.e., alkylamines or alkylalcoholamines), and cyclic amines.

Specific examples of such aliphatic amines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, and tri-n-octanolamine.

Among these, alkylalcoholamines and trialkylamines are preferable, and alkylalcoholamines are particularly desirable. Among alkylalcoholamines, triethanolamine or triisopropanolamine is particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

These compounds can be used either alone, or in combinations of two or more different compounds.

The component (D) is typically used in an amount within a range from 0.01 to 5.0 parts by weight, relative to 100 parts by weight of the component (A).

[Component (E)]

Furthermore, in the resist composition of the present invention, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof can be added.

Examples of suitable organic carboxylic acids include acetic acid, malonic acid, citric acid, malic acid, succinic acid, benzoic acid, and salicylic acid.

Examples of phosphorus oxo acids or derivatives thereof include phosphoric acid, phosphonic acid and phosphinic acid. Among these, phosphonic acid is particularly desirable.

Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one type may be used alone, or two or more types may be used in combination.

As the component (E), an organic carboxylic acid is preferable, and salicylic acid is particularly desirable.

The component (E) is typically used in an amount within a range from 0.01 to 5.0 parts by weight, relative to 100 parts by weight of the component (A).

If desired, other miscible additives can also be added to the resist composition of the present invention. Examples of such miscible additives include additive resins for improving the performance of the resist film, surfactants for improving the applicability, dissolution inhibitors, plasticizers, stabilizers, colorants, halation prevention agents, and dyes.

[Component (S)]

The resist composition of the present invention can be prepared by dissolving the materials for the resist composition in an organic solvent (S) (hereafter frequently referred to as "component (S)").

The component (S) may be any organic solvent which can dissolve the respective components to give a uniform solution, and any one or more kinds of organic solvents can be appropriately selected from those which have been conventionally known as solvents for a chemically amplified resist.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

These solvents can be used individually, or in combination as a mixed solvent.

Among these, γ-butyrolactone, propylene glycol monomethyl ether acetate (PGMEA), propylene glycol monomethyl ether (PGME), and ethyl lactate (EL) are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the organic solvent is not particularly limited, and is appropriately adjusted to a concentration which enables coating of a coating solution to a substrate, depending on the thickness of the coating film. In genera, the organic solvent is used in an amount such that the solid content of the resist composition becomes within the range from 2 to 20% by weight, and preferably from 5 to 15% by weight.

The resist composition of the present invention is advantageous in that a resist pattern having an excellent shape can be formed, and excellent lithography properties can be achieved. The reasons why these effects can be achieved has not been elucidated yet, but are presumed as follows.

The resist composition of the present invention contains an acid generator (B1) consisting of a compound represented by general formula (b1) above, and an organic compound (C) which generates, upon exposure, an acid exhibiting a weaker acid strength than the acid generated from the acid generator (B1).

In the resist composition of the present invention, the acid strength of the acid generated from the component (C) upon exposure is weaker than that the acid generated from the component (B1). Therefore, it is presumed that during exposure in the formation of a resist pattern, a salt exchange reaction occurs between the acid generated from the component (C) and the acid generated from the component (B1). As a result, it is presumed that diffusion of the acid generated from the component (B) can be effectively suppressed by the component (C).

Further, the component (B1) has a substituent containing an oxygen atom in the anion moiety thereof. As a result, the anion moiety of such a component (B1) exhibits a high polarity and has a three-dimensionally bulky structure, as compared to a fluorinated alkylsulfonate ion which has been used as an anion moiety of a conventional acid generator. As a result, it is presumed that diffusion of the anion moiety (acid) within the resist film is chemically and physically suppressed, as compared to the anion moiety of a conventional acid generator.

Furthermore, when a resist film is formed, it is presumed that the component (B1) can be uniformly distributed within the resist film.

For the reasons as described above, when a resist film is formed using the resist composition of the present invention, diffusion of the acid generated in exposed regions to unexposed regions can be significantly suppressed. As a result, it is presumed that the difference in alkali solubility between the exposed regions and the unexposed regions (i.e., dissolution contrast) becomes remarkable, and hence, a resist pattern having an excellent shape can be formed, and the lithography properties can be improved.

Moreover; by using the resist composition of the present invention, a hole pattern having high circularity can be formed. Also, a hole pattern having no white band of unevenness around the periphery of the holes can be formed.

In addition, the uniformity (CDU) of the hole diameter (CD) is improved, and as a result, a resist pattern having an excellent shape and high circularity can be formed even with a narrow pitch.

<<Method of Forming a Resist Pattern>

The method of forming a resist pattern according to the second aspect of the present invention includes: using a resist composition according to the first aspect of the present invention to form a resist film; conducting exposure of the resist film; and alkali-developing the resist film to form a resist pattern.

More specifically, the method for forming a resist pattern according to the present invention can be performed, for example, as follows. Firstly, a resist composition of the present invention is applied onto a substrate using a spinner or the like, and a prebake (post applied bake (PAB)) is conducted under temperature conditions of 80 to 150° C. for 40 to 120 seconds, preferably 60 to 90 seconds to form a resist film.

Then, for example, using an ArF exposure apparatus or the like, the resist film is selectively exposed to an ArF excimer laser beam through a desired mask pattern, followed by post exposure bake (PEB) under temperature conditions of 80 to 150° C. for 40 to 120 seconds, preferably 60 to 90 seconds. Subsequently, alkali developing is conducted using an alkali developing solution such as a 0.1 to 10% by weight aqueous solution of tetramethylammonium hydroxide (TMAH), preferably followed by rinsing with pure water, and drying. If desired, bake treatment (post bake) can be conducted following the alkali developing In this manner, a resist pattern that is faithful to the mask pattern can be obtained.

The substrate is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) can be used.

The wavelength to be used for exposure is not particularly limited and the exposure can be conducted using radiations such as ArF excimer laser, KrF excimer laser, $F_2$ excimer laser, extreme ultraviolet rays (EUV), vacuum ultraviolet rays (VUV), electron beam (EB), X-rays, and soft X-rays. The positive resist composition of the present invention is effective to KrF excimer laser, ArF excimer laser, EB and EUV, and particularly effective to ArF excimer laser.

The exposure of the resist film can be either a general exposure (dry exposure) conducted in air or an inert gas such as nitrogen, or immersion exposure (immersion lithography).

In immersion lithography, exposure (immersion exposure) is conducted in a state where the region between the lens and the resist layer formed on a wafer (which was conventionally filled with air or an inert gas such as nitrogen) is filled with a solvent (a immersion medium) that has a larger refractive index than the refractive index of air.

More specifically, in immersion lithography, the region between the resist film formed in the above-described manner and lens at the lowermost portion of the exposure apparatus is filled with a solvent (a immersion medium) that has a larger refractive index than the refractive index of air, and in this state, the resist film is subjected to exposure (immersion exposure) through a desired mask pattern.

The immersion medium preferably exhibits a refractive index larger than the refractive index of air but smaller than the refractive index of the resist film to be subjected to immersion exposure. The refractive index of the immersion medium is not particularly limited as long at it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

EXAMPLES

As follows is a description of examples of the present inventions although the scope of the present invention is by no way limited by these examples.

<Base Component (A)—No. 1>

The resin (A)-1 used as the component (A) in Examples 1 to 4 and Comparative Examples 1 to 8 was copolymerized by a conventional dropwise polymerization method, using monomers (1) to (3) shown below.

[Chemical Formula 73]

Monomer (1)

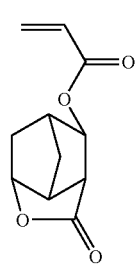

Monomer (2)

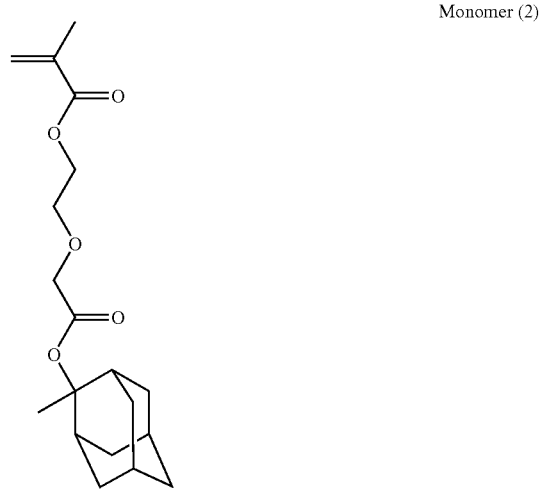

-continued

Monomer (3)

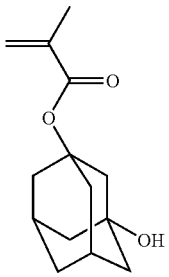

Synthesis Example 1

Synthesis of Resin (A)-1

Synthesis of Monomer (2)

4.8 g of sodium hydride (NaH) was charged into a 1 L tree-necked flask, While maintaining the temperature of the three-necked flask at 0° C. in an ice bath, 300 g of tetrahydrofuran (THF) was added, 124 g of a compound (i) was further added while stirring, and stirring was continued for 10 minutes. Then, 30 g of a compound (ii) was added while stirring, and a reaction was effected for 12 hours. After the completion of the reaction, the reaction mixture was subjected to suction filtration, and THF was removed from the obtained filtrate by concentration under reduced pressure. Then, water and ethyl acetate was added to the concentrated liquid, and extraction was conducted. The resulting ethyl acetate solution was concentrated under reduced pressure, and purified by column chromatography (SiO$_2$, heptane:ethyl acetate=8:2). The obtained fraction was concentrated and dried under reduced pressure, thereby obtaining 12 g of a compound (iii).

[Chemical Formula 74]

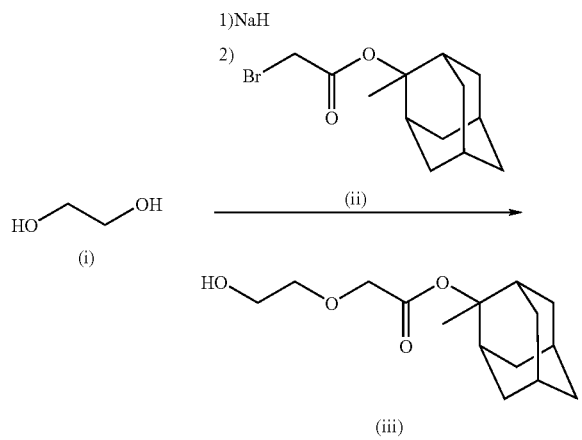

Subsequently, 5 g of the compound (iii), 3.04 g of triethylamine (Et$_3$N) and 10 g of THF were charged into a 300 mL three-necked flask, followed by stirring for 10 minutes. Then, 2.09 g of a compound (iv) and 10 g of THF were added to the tree-necked flask, and a reaction was effected at room temperature for 12 hours. After the completion of the reaction, the reaction mixture was subjected to suction filtration, and THF was removed from the obtained filtrate by concentration under reduced pressure. Then, water and ethyl acetate was added to the concentrated liquid, and extraction was conducted. The resulting ethyl acetate solution was concentrated under reduced pressure, and purified by column chromatography (SiO$_2$, heptane:ethyl acetate=8:2). The obtained fraction was concentrated and dried under reduced pressure, thereby obtaining 4.9 g of a compound (v).

[Chemical Formula 75]

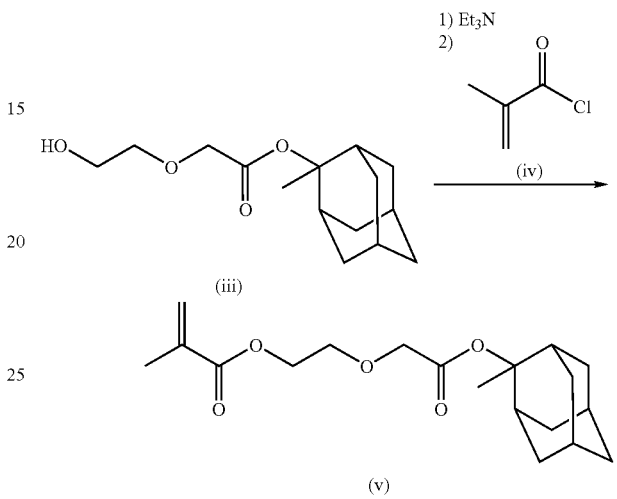

The obtained compound (v) was analyzed by $^1$H-NMR. The results are shown below.

$^1$H-NMR (solvent: CDCl$_3$, 400 MHz): δ(ppm)=6.15 (s, 1H(H$^a$)), 5.58 (s, 1H(H$^b$)), 4.35 (t, 2H(H$^c$)), 4.08 (s, 2H(H$^d$)), 3.80 (t, 2H(H$^e$)), 1.51-2.35 (m, 20H(H$^f$)).

From the results shown above, it was confirmed that the compound (v) had a structure shown below, i.e., it was confirmed that the obtained compound was the monomer (2).

[Chemical Formula 76]

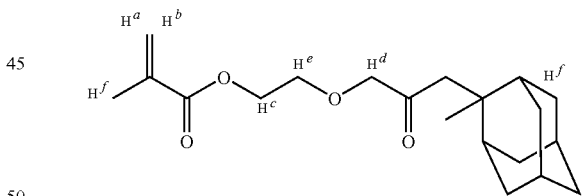

Synthesis of Resin (A)-1

6.19 g of the monomer (1), 10.00 g of the monomer (2) and 3.51 g of the monomer (3) were dissolved in 78.8 g of methyl ethyl ketone to obtain a solution. Then, 0.01 mmol of a polymerization initiator (product name: V-601, manufactured by Wako Pure Chemical Industries, Ltd.) was added and dissolved in the obtained solution. The resultant was dropwise added to 32.83 g of methyl ethyl ketone heated to 75° C. in a nitrogen atmosphere over 6 hours. The resulting reaction solution was heated while stirring for 1 hour, and then cooled to room temperature.

Thereafter, the reaction solution was dropwise added to an excess amount of a methanol/water mixed solvent to thereby precipitate a reaction product, and this operation was repeated to perform the operation three times in total. The resulting reaction product was dried at room temperature under reduced pressure, thereby obtaining a white powder.

The obtained reaction product was designated as "polymeric compound (1)". The structure thereof is shown below.

The polymeric compound (1) was analyzed by carbon 13 nuclear magnetic resonance spectroscopy at 600 MHz (600 MHz_$^{13}$C-NMR). As a result, it was found that the composition of the polymer (ratio (molar ratio) of the respective structural units within the structural formula) was a2/a1/a3=40.4/39.1/20.5.

Further, with respect to the polymeric compound (1), the weight average molecular weight and the dispersity were determined by the polystyrene equivalent value as measured by gel permeation chromatography (GPC). As a result, it was found that the weight average molecular weight was 8,700, and the dispersity was 2.18. As a result, it was confirmed that the obtained polymeric compound (1) was a copolymer of the aforementioned monomers (1), (2) and (3), i.e., the resin (A)-1.

[Chemical Formula 77]

Polymeric compound (1)

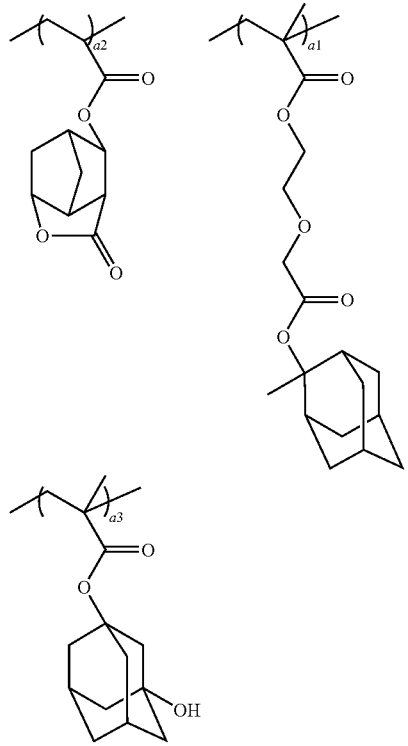

<Acid-Generator Component (B)—No. 1>

Acid generators (B)-1 to (B)-3 used as the component (B) in Examples 1 to 14 and Comparative Examples 1 to 10 were respectively synthesized in accordance with the following synthesis examples.

Synthesis Example 2

Synthesis of Acid Generator (B)-1

16.7 ml of tetrahydrofuran was added to 5.0 g of 2-naphthylmethyloxytetrafluoroehanesulfonylfluoride, and an aqueous solution obtained by dissolving 0.98 g of lithium hydroxide in 13.6 ml of pure water was dropwise added to the resulting solution in an ice bath. Then, the solution was stirred in the ice bath. As no absorption by —SO$_2$F was observed at −217.6 ppm by $^{19}$F-NMR, it was confirmed that all fluorinated sulfonyl groups were converted to lithium sulfonate. Thereafter, the reaction mixture was concentrated and dried to obtain a viscous white solid (crude product). The obtained crude product was dissolved in 14.2 ml of acetone, and filtered to remove the by-produced LiF. The filtrate was concentrated, thereby obtaining 5.50 g of a precursor compound (X).

[Chemical Formula 78]

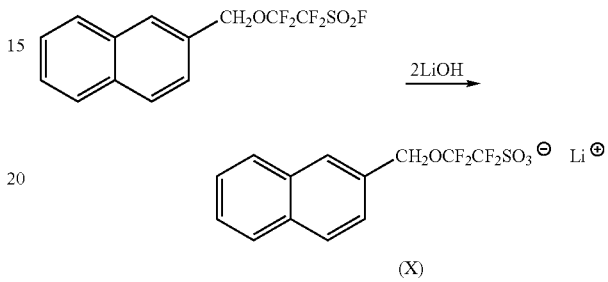

Subsequently, 6.99 g of triphenylsulfonium bromide was dissolved in 125 ml of pure water. 5.50 g of the precursor compound (X) was added to the resulting solution, and stirred at room temperature for 19 hours. Then, 125 g of dichloromethane was added thereto and stirred, and the organic phase was taken out by liquid separation. The organic phase was washed with 40 ml of pure water, and the organic phase was taken out by liquid separation. The obtained organic phase was concentrated and dried, thereby obtaining 7.09 g of an objective compound (XI) (yield: 75.2%).

[Chemical Formula 79]

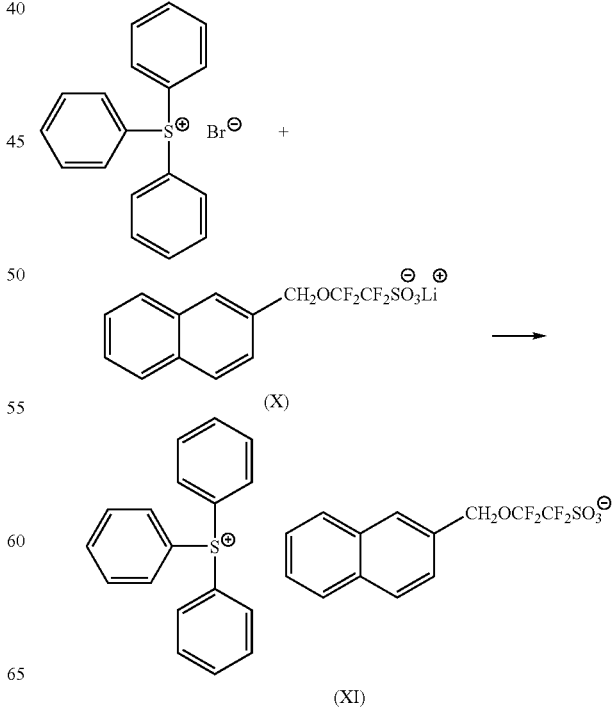

The compound (XI) was analyzed by NMR.

$^1$H-NMR (acetone-d6, 400 MHz): δ(ppm)=8.01-7.47 (m, 22H,H$^a$), 5.23 (s, 2H,H$^b$).

$^{19}$F-NMR (acetone-d6, 376 MHz): δ(ppm)=79.2, 111.8.

From the results shown above, it was confirmed that the compound (XI) had a structure shown below.

[Chemical Formula 80]

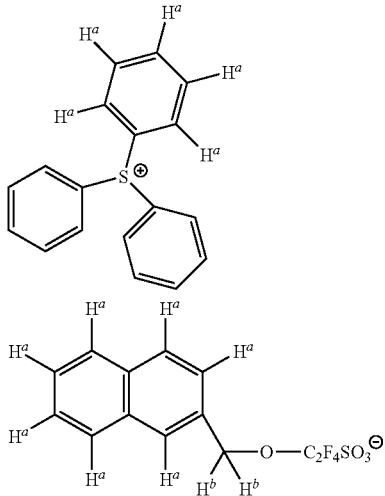

Synthesis Example 3

Synthesis of Acid Generator (B)-2

(i) 150 g of methyl fluorosulfonyl(difluoro)acetate and 375 g of pure water were maintained at 10° C. or lower in an ice bath, and 343.6 g of a 30% by weight aqueous solution of sodium hydroxide was dropwise added thereto. Then, the resultant was refluxed at 100° C. for 3 hours, followed by cooling and neutralizing with a concentrated hydrochloric acid. The resulting solution was dropwise added to 8,888 g of acetone, and the precipitate was collected by filtration and dried, thereby obtaining 184.5 g of a compound (I) in the form of a white solid (purity: 88.9%, yield: 95.5%),

[Chemical Formula 81]

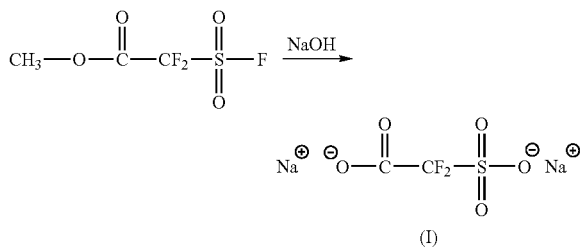

(ii) 56.2 g of the compound (I) and 562.2 g of acetonitrile were prepared, and 77.4 g of p-toluenesulfonic acid monohydrate was added thereto. The resultant was refluxed at 110° C. for 3 hours. Then, the reaction mixture was filtered, and the filtrate was concentrated and dried to obtain a solid. 900 g of t-butyl methyl ether was added to the obtained solid and stirred. Thereafter, the resultant was filtered, and the residue was dried, thereby obtaining 22.2 g of a compound (II) in the form of a white solid (purity: 91.0%, yield: 44.9%).

[Chemical Formula 82]

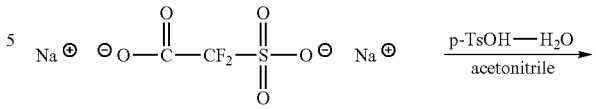

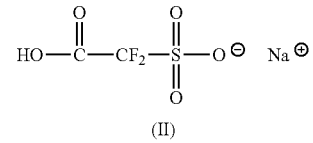

(iii) 17.7 g of the compound (II) obtained in step (ii) (purity: 91.0%), 13 g of a compound (II') represented by formula (II') shown below and 88.3 g of toluene were prepared, and 5.85 g of p-toluenesulfonic acid monohydrate was added thereto. The resultant was refluxed at 130° C. for 26 hours. Then, the reaction mixture was filtered, and 279.9 g of methyl ethyl ketone was added to the residue, followed by stirring. Thereafter, the resultant was filtered, and 84.0 g of methanol was added thereto, followed by stirring. The resultant was filtered, and the residue was dried, thereby obtaining 20.2 g of a compound (III) in the form of a white solid (purity: 99.9%, yield: 72.1%).

[Chemical Formula 83]

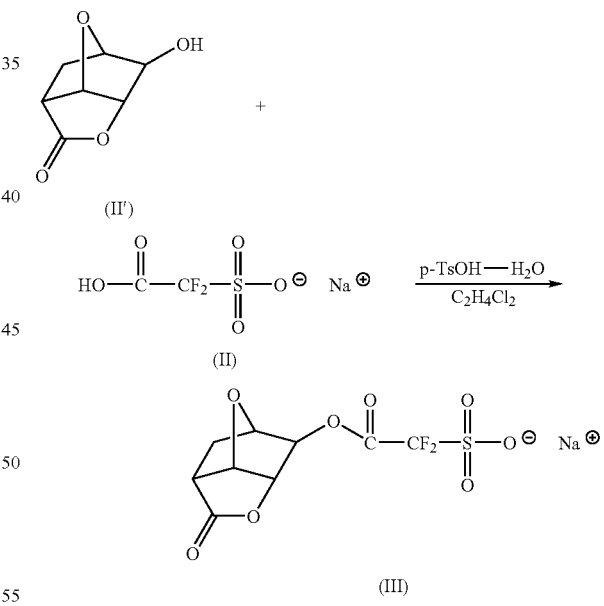

(iv) 15.0 g of the compound (III) obtained in step (iii) (purity: 99.9%) was dissolved in 66.4 g of pure water. To the resulting solution was added 13.3 g of 4-methyltriphenylsulfonium bromide dissolved in 132.8 g of dichloromethane, followed by stirring at room temperature for 3 hours. Thereafter, the resultant was subjected to liquid separation to take out the organic phase. The organic phase was washed with 66.4 g of pure water, and then the organic phase was concentrated and dried, thereby obtaining 20.2 g of an objective compound (IV) in the form of a colorless viscous liquid (yield: 88.1%).

[Chemical Formula 84]

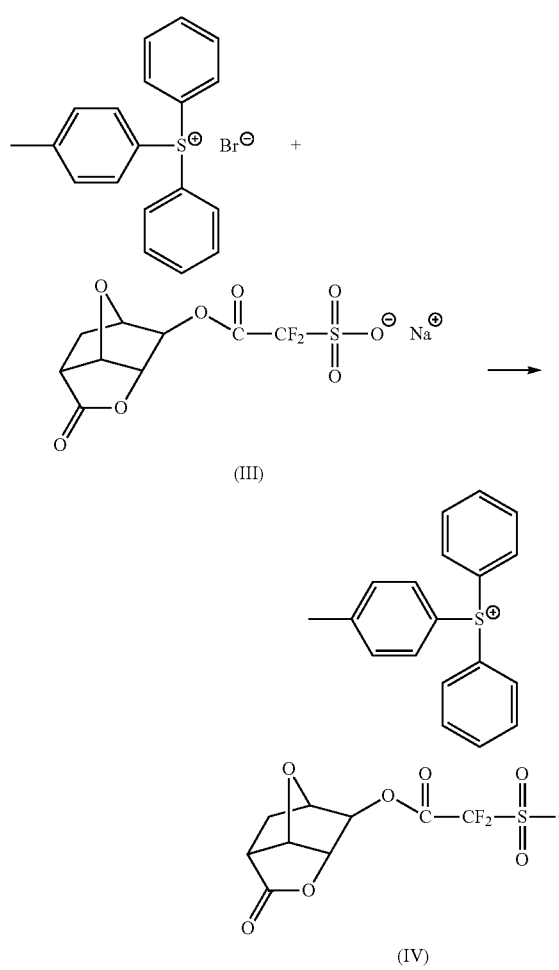

(III)

↓

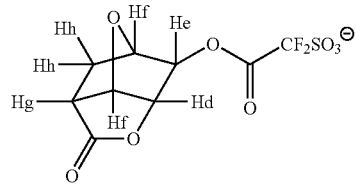

Synthesis Example 4

Synthesis of Acid Generator (B)-3

4.34 g of a compound (II) (purity: 94.1%), 3.14 g of 2-benzyloxyethanol and 43.4 g of toluene were prepared, 0.47 g of p-toluenesulfonic acid monohydrate was added thereto, and the resultant was refluxed at 105° C. for 20 hours. Then, the reaction mixture was filtered, and 20 g of hexane was added to the residue and stirred. Thereafter, the resultant was filtered, and the residue was dried, thereby obtaining 1.41 g of a compound (V) (yield: 43.1%).

[Chemical Formula 86]

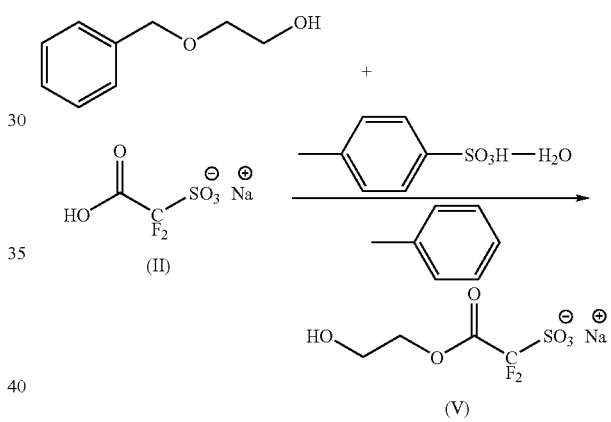

(IV)

The obtained compound (IV) was analyzed by NMR. The results are shown below.

$^1$H-NMR(DMSO, 400 MHz): δ(ppm)=7.86-7.58 (m, 14H, Ha+Hb), 5.48 (m, 1H,Hd), 4.98 (s, 1H,He), 4.73-4.58 (d, 2H,Hf): 2.71 (m, 1H,Hg), 2.43 (m, 3H,Hc), 2.12 (m, 2H,Hh).

$^{19}$F-NMR(DMSO, 376 MHz): δ(ppm)=−106.9.

From the results above, it was confirmed that the compound (IV) had a structure shown below.

The obtained compound (V) was analyzed by NMR.

$^1$H-NMR(DMSO-d6, 400 MHz): δ(ppm)=4.74-4.83 (t, 1H,OH), 4.18-4.22 (t, 2H,H$^a$), 3.59-3.64 (q, 2H,H$^b$).

$^{19}$F-NMR(DMSO-d6, 376 MHz): δ(ppm)=−106.6.

From the results above, it was confirmed that the compound (V) had a structure shown below.

[Chemical Formula 87]

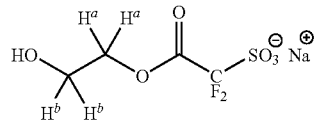

[Chemical Formula 85]

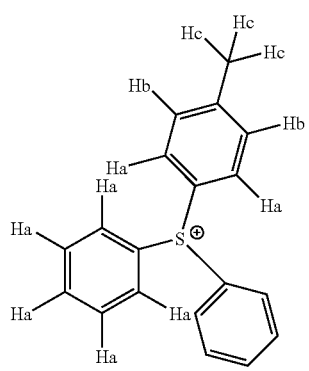

To 1.00 g of the compound (V) and 3.00 g of acetonitrile were dropwise added 0.82 g of 1-adamantanecarbonyl chloride and 0.397 g of triethylamine while cooling with ice. Then, the resultant was stirred at room temperature for 20 hours, followed by filtration. The filtrate was concentrated and dried, and dissolved in 30 g of dichloromethane, followed by washing with water three times. Thereafter, the organic phase was concentrated and dried, thereby obtaining 0.82 g of a compound (VI) (yield: 41%).

[Chemical Formula 88]

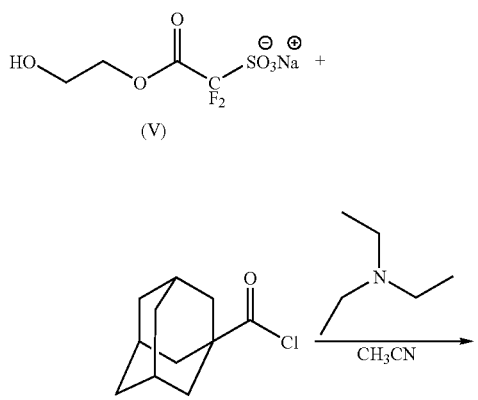

(V)

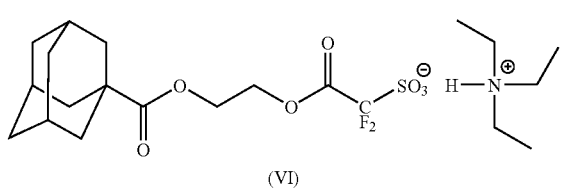

(VI)

The obtained compound (VI) was analyzed by NMR.

$^1$H-NMR(DMSO-d6, 400 MHz): δ(ppm)=8.81 (s, 1H,H$^c$), 4.37-4.44 (t, 2H,H$^d$), 4.17-4.26 (t, 2H,H$^e$), 3.03-3.15 (q, 6H,H$^b$), 1.61-1.98 (m, 15H,Adamantane), 1.10-1.24 (t, 9H,H$^a$).

$^{19}$F-NMR(DMSO-d6, 376 MHz): δ(ppm)=−106.61.

From the results above, it was confirmed that the compound (VI) had a structure shown below.

[Chemical Formula 89]

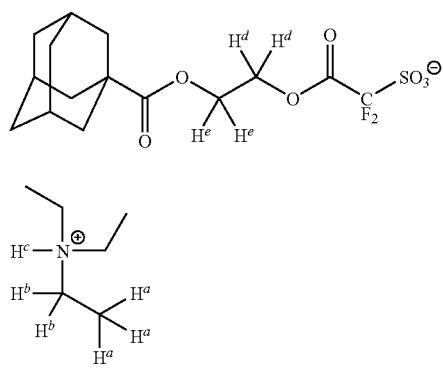

0.384 g of a compound (VII) was dissolved in 3.84 g of dichloromethane and 3.84 g of water, and 0.40 g of the compound (VI) was added thereto. The resultant was stirred for 1 hour, followed by liquid separation to collect the organic phase. The organic phase was washed with 3.84 g of water three times. Thereafter, the resulting organic phase was concentrated and dried, thereby obtaining 0.44 g of a compound (VIII) (yield: 81.5%).

[Chemical Formula 90]

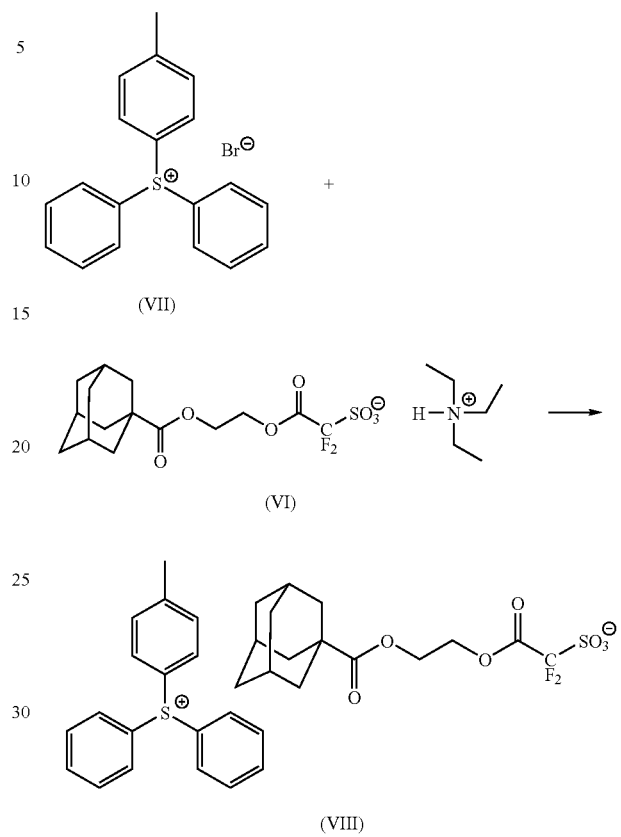

(VII)

(VI)

(VIII)

The obtained compound (VIII) was analyzed by NMR.

$^1$H-NMR(DMSO-d6, 400 MHz): δ(ppm)=7.57-7.87 (m, 14H,Phenyl), 4.40-4.42 (t, 2H,H$^b$), 4.15-4.22 (t, 2H,H$^a$), 2.43 (s, 3H,H$^c$), 1.60-1.93 (m, 15H,Adamantane).

$^{19}$F-NMR(DMSO-d6, 376 MHz): δ(ppm)=−106.7.

From the results above, it was confirmed that the compound (VIII) had a structure shown below.

[Chemical Formula 91]

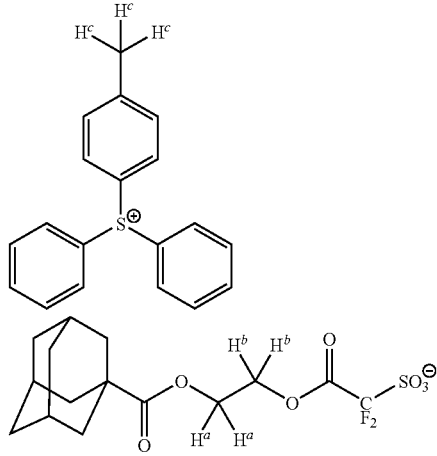

<Production of Resist Composition—No. 1>

The components shown in Tables 1 to 3 were mixed together and dissolved to obtain positive resist compositions.

TABLE 1

| | Component (A) | Component (B) | Component (C) | Component (D) | Component (S) |
|---|---|---|---|---|---|
| Comp. Ex. 1 | (A)-1 [100] | (B)-1 [4.87] | — | (D)-1 [0.1] | (S)-1 [2300] |
| Comp. Ex. 2 | (A)-1 [100] | (B)-1 [4.87] | — | (D)-1 [1.0] | (S)-1 [2300] |
| Comp. Ex. 3 | (A)-1 [100] | (B)-1 [4.87] | — | (D)-2 [0.05] | (S)-1 [2300] |
| Comp. Ex. 4 | (A)-1 [100] | (B)-1 [4.87] | — | (D)-2 [0.5] | (S)-1 [2300] |
| Ex. 1 | (A)-1 [100] | (B)-1 [4.87] | (C)-1 [0.1] | — | (S)-1 [2300] |
| Ex. 2 | (A)-1 [100] | (B)-1 [4.87] | (C)-1 [1.0] | — | (S)-1 [2300] |
| Comp. Ex. 5 | (A)-1 [100] | (B)-2 [4.79] | — | (D)-1 [0.1] | (S)-1 [2300] |
| Comp. Ex. 6 | (A)-1 [100] | (B)-2 [4.79] | — | (D)-1 [1.0] | (S)-1 [2300] |
| Comp. Ex. 7 | (A)-1 [100] | (B)-2 [4.79] | — | (D)-2 [0.05] | (S)-1 [2300] |
| Comp. Ex. 8 | (A)-1 [100] | (B)-2 [4.79] | — | (D)-2 [0.5] | (S)-1 [2300] |
| Ex. 3 | (A)-1 [100] | (B)-2 [4.79] | (C)-1 [1.0] | — | (S)-1 [2300] |
| Ex. 4 | (A)-1 [100] | (B)-3 [5.34] | (C)-1 [1.0] | — | (S)-1 [2300] |

TABLE 2

| | Component (A) | | Component (B) | Component (C) | Component (S) |
|---|---|---|---|---|---|
| Ex. 5 | (A)-2 [50] | (A)-3 [50] | (B)-3 [7.5] | (C)-1 [0.5] | (S)-1 [2300] |
| Ex. 6 | (A)-2 [50] | (A)-3 [50] | (B)-3 [7.5] | (C)-1 [1.0] | (S)-1 [2300] |

TABLE 3

| | Component (A) | | Component (B) | | Component (C) | Component (D) | | Component (E) | Component (S) | |
|---|---|---|---|---|---|---|---|---|---|---|
| Ex. 7 | (A)-4 [80] | (A)-5 [20] | (B)-3 [7.81] | — | (C)-1 [1.5] | (D)-1 [0.55] | (D)-3 [0.22] | (E)-1 [1.64] | (S)-1 [2300] | (S)-2 [10] |
| Ex. 8 | (A)-4 [80] | (A)-5 [20] | (B)-3 [7.81] | — | (C)-1 [1.0] | (D)-1 [0.55] | (D)-3 [0.22] | (E)-1 [1.64] | (S)-1 [2300] | (S)-2 [10] |
| Ex. 9 | (A)-4 [100] | — | (B)-3 [7.81] | — | (C)-1 [1.0] | (D)-1 [0.55] | (D)-3 [0.22] | (E)-1 [1.64] | (S)-1 [2300] | (S)-2 [10] |
| Ex. 10 | (A)-6 [100] | — | (B)-2 [6.0] | — | (C)-1 [5.15] | (D)-1 [1.0] | — | (E)-1 [1.22] | (S)-1 [2300] | (S)-2 [10] |
| Ex. 11 | (A)-4 [80] | (A)-5 [20] | (B)-3 [7.81] | — | (C)-1 [1.5] | (D)-1 [0.63] | (D)-3 [0.25] | (E)-1 [1.89] | (S)-1 [2300] | (S)-2 [10] |
| Ex. 12 | (A)-4 [80] | (A)-5 [20] | (B)-3 [7.81] | — | (C)-1 [1.0] | (D)-1 [0.63] | (D)-3 [0.25] | (E)-1 [1.89] | (S)-1 [2300] | (S)-2 [10] |
| Ex. 13 | (A)-4 [90] | (A)-5 [10] | (B)-3 [7.81] | — | (C)-1 [1.5] | (D)-1 [0.55] | (D)-3 [0.22] | (E)-1 [1.64] | (S)-1 [2300] | (S)-2 [10] |
| Ex. 14 | (A)-4 [90] | (A)-5 [10] | (B)-3 [7.81] | — | (C)-1 [1.0] | (D)-1 [0.55] | (D)-3 [0.22] | (E)-1 [1.64] | (S)-1 [2300] | (S)-2 [10] |
| Comp. Ex. 9 | (A)-4 [80] | (A)-5 [20] | (B)-3 [7.81] | (B)-4 [1.0] | — | (D)-1 [0.55] | (D)-3 [0.22] | (E)-1 [1.64] | (S)-1 [2300] | (S)-2 [10] |
| Comp. Ex. 10 | (A)-6 [100] | — | (B)-2 [6.0] | — | — | (D)-1 [1.0] | — | (E)-1 [1.22] | (S)-1 [2300] | (S)-2 [10] |

In Tables 1 to 3, the reference characters indicate the following. Further, the values in brackets [ ] indicate the amount (in terms of parts by weight) of the component added.

(A)-1: the aforementioned resin (A)-1

(A)-2: a resin (A)-2 represented by formula (A)-2 shown below (wherein a1/a2/a3=5/3/2 (molar ratio), Mw=8,000, and Mw/Mn=2.0)

(A)-3: a resin (A)-3 represented by formula (A)-3 shown below (wherein a1/a2/a3=4/4/2 (molar ratio), Mw=10,000, and Mw/Mn=2.0)

(A)-4: a resin (A)-4 represented by formula (A)-4 shown below (wherein a1/a2/a3=35/45/20 (molar ratio), Mw=7,000, and Mw/Mn=1.8)

(A)-5: a resin (A)-5 represented by formula (A)-5 shown below (wherein a1/a2/a3=35/45/20 (molar ratio), Mw=7,000, and Mw/Mn=1.8)

(A)-6: a resin (A)-6 represented by formula (A)-6 shown below (wherein a1/a2/a3=40/40/20 (molar ratio), Mw=10,000, and Mw/Mn=1.8)

[Chemical Formula 92]

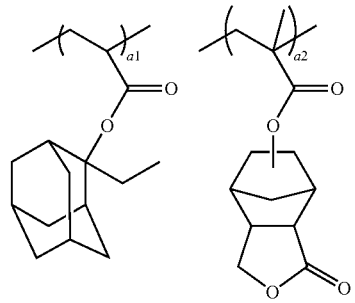

(A)-2

-continued
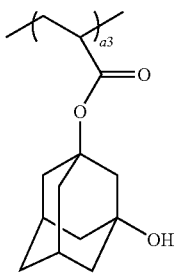
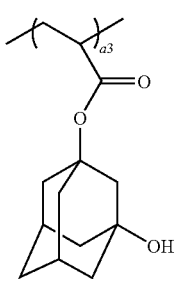
[Chemical Formula 93]
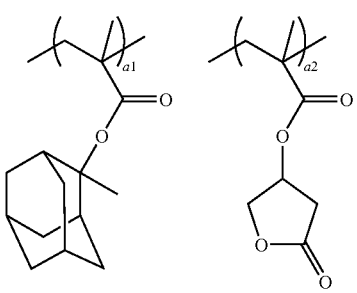
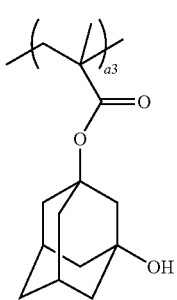
-continued
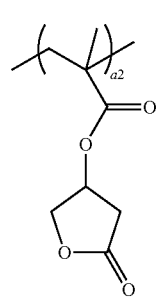
(A)-3
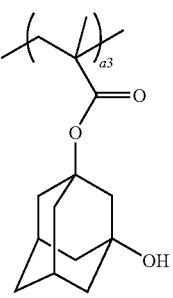
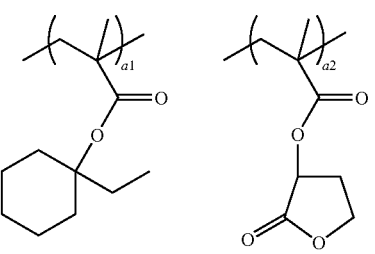
(A)-5
(A)-6
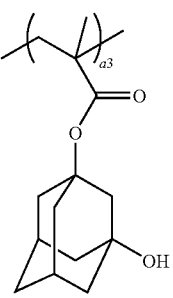
(A)-4
(B)-1: an acid generator represented by chemical formula (B1-1) shown below
(B)-2: an acid generator represented by chemical formula (B1-2) shown below
(B)-3: an acid generator represented by chemical formula (B1-3) shown below
(B)-4: bis(2,4-dimethylphenylsulfonyl)diazomethane

[Chemical Formula 94]

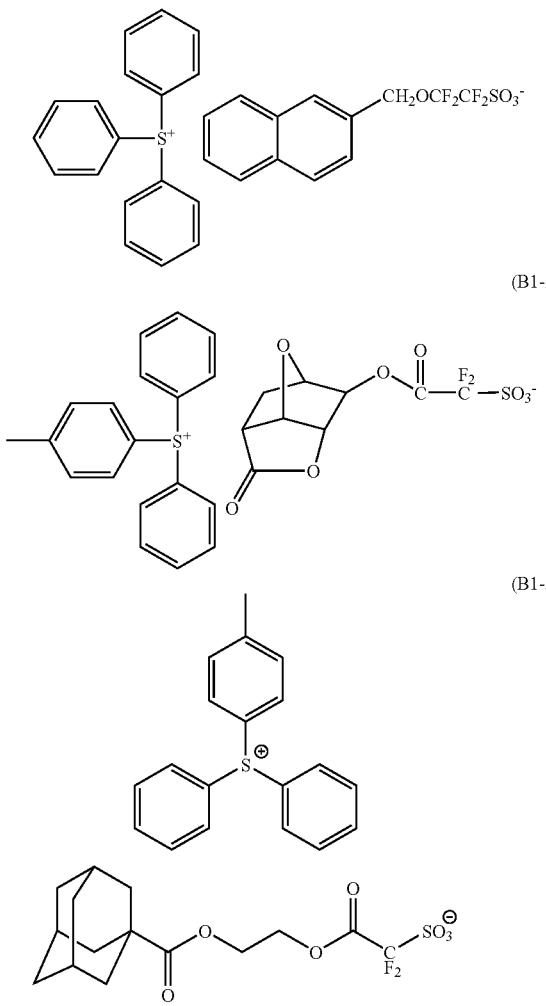

(C)-1: an organic compound represented by chemical formula (C1-1) shown below

[Chemical Formula 95]

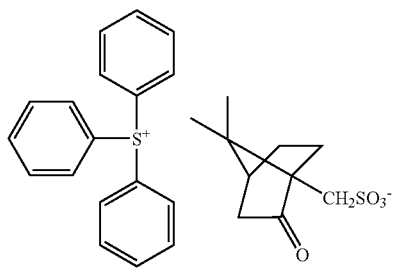

(D)-1: tri-n-pentylamine
(D)-2: diethanolamine
(D)-3: triethanolamine
(E)-1: salicylic acid
(S)-1: a mixed solvent of PGMEA/PGME=6/4 (weight ratio)
(S)-2, γ-butyrolactone <Evaluation of Resist Pattern—No. 1>

Using the obtained positive resist compositions, resist patterns were formed in the following manner, and the shape of the resist pattern and various lithography properties were evaluated.

Examples 1 to 4, Comparative Examples 1 to 8

[Formation of Resist Pattern (1)]

An organic anti-reflection film composition (product name: ARC29, manufactured by Brewer Science Ltd.) was applied onto an 8-inch silicon wafer using a spinner, and the composition was then baked at 205° C. for 60 seconds, thereby forming an organic anti-reflection film having a film thickness of 82 nm. Then, each of the positive resist compositions obtained in Examples 1 to 4 and Comparative Examples 1 to 8 was applied onto the anti-reflection film using a spinner, and was then prebaked (PAB) on a hotplate at 90° C. for 60 seconds and dried, thereby forming a resist film having a film thickness of 120 nm.

Subsequently, the resist film was selectively irradiated with an ArF excimer laser (193 nm) through a mask pattern (6% half tone), using an ArF exposure apparatus NSR-S302 (manufactured by Nikon Corporation, NA (numerical aperture)=0.60, 2/3 annular illumination).

Thereafter, a post exposure bake (PEB) treatment was conducted at 90° C. for 60 seconds, followed by alkali development for 30 seconds at 23° C. in a 2.38% by weight aqueous solution of tetramethylammonium hydroxide (TMAH) (product name: NMD-3; manufactured by Tokyo Ohka Kogyo Co., Ltd.). Then, the resist was washed for 30 seconds with pure water, followed by drying by shaking.

As a result, in each of the examples, a contact hole pattern in which holes having a diameter of 130 nm were equally spaced (pitch: 260 nm) was formed on the resist film.

The optimum exposure dose Eop (mJ/cm$^2$) with which a contact hole pattern having a hole diameter of 130 nm and a pitch of 260 nm was formed was determined. The results are shown in Table 4.

[Evaluation of Circularity]

Each of the contact hole patterns formed in the "formation of resist pattern (1)" above was observed from the upper side thereof using a scanning electron microscope (SEM), and the circularity was evaluated with the following criteria. The results are shown in Table 4.

A: extremely high circularity (no unevenness was observed at the circumferential portions of the hole pattern when the hole pattern was observed from the upper side thereof, and the shape of the pattern was excellent)

B: high circularity (although slight unevenness was observed at the circumferential portions of the hole pattern when the hole pattern was observed from the upper side thereof, the pattern as a whole had a high level of circularity)

C: low circularity (many uneven portions were observed at the circumferential portions of the hole pattern when the hole pattern was observed from the upper side thereof)

D: a pattern could no be resolved

TABLE 4

|  | PAB (° C.) | PEB (° C.) | Eop (mJ/cm$^2$) | Circularity |
|---|---|---|---|---|
| Comp. Ex. 1 | 90 | 90 | 17.9 | C |
| Comp. Ex. 2 | 90 | 90 | — | D |
| Comp. Ex. 3 | 90 | 90 | 15.1 | C |
| Comp. Ex. 4 | 90 | 90 | 47.0 | C |
| Ex. 1 | 90 | 90 | 12.3 | B |
| Ex. 2 | 90 | 90 | 38.0 | A |

TABLE 4-continued

|  | PAB (° C.) | PEB (° C.) | Eop (mJ/cm$^2$) | Circularity |
|---|---|---|---|---|
| Comp. Ex. 5 | 90 | 90 | 20.0 | C |
| Comp. Ex. 6 | 90 | 90 | — | D |
| Comp. Ex. 7 | 90 | 90 | 20.0 | C |
| Comp. Ex. 8 | 90 | 90 | 57.0 | C |
| Ex. 3 | 90 | 90 | 39.0 | A |
| Ex. 4 | 90 | 90 | 36.0 | A |

Examples 5 and 6

[Formation of Resist Pattern (2)]

An organic anti-reflection film composition (product name: ARC29, manufactured by Brewer Science Ltd.) was applied onto an 8-inch silicon wafer using a spinner, and the composition was then baked at 205° C. for 60 seconds, thereby forming an organic anti-reflection film having a film thickness of 70 nm. Then, each of the positive resist composition obtained in Examples 5 and 6 was applied onto the anti-reflection film using a spinner, and was then prebaked (PAB) on a hotplate at 110° C. for 60 seconds and dried, thereby forming a resist film having a film thickness of 170 nm.

Subsequently, the resist film was selectively irradiated with an ArF excimer laser (193 nm) through a mask pattern (6% half tone), using an ArF exposure apparatus NSR-S308F (manufactured by Nikon Corporation, NA (numerical aperture)=0.85, σ=0.95).

Thereafter, a post exposure bake (PEB) treatment was conducted at 90° C. for 60 seconds, followed by development for 30 seconds at 23° C. in a 2.38% by weight aqueous solution of tetramethylammonium hydroxide (TMAH) (product name: NMD-3; manufactured by Tokyo Ohka Kogyo Co., Ltd.). Then, the resist was washed for 30 seconds with pure water, followed by drying by shaking. Then, the resist was heated and dried at 100° C. for 45 seconds, thereby forming a contact hole pattern in which holes having a hole diameter of 110 nm were equally spaced (pitch: 210 nm) on the resist film (hereafter, this contact hole pattern is referred to as "Dense CH pattern").

Thereafter, using the optimum exposure dose (Eop; mJ/cm$^2$) with which the above Dense CH patterns were formed, a contact hole pattern in which holes having a hole diameter of 110 nm were equally spaced (pitch: 780 nm) was formed in each of the examples (hereafter, this contact hole pattern is referred to as "Iso CH pattern").

[Evaluation of Depth of Focus (DOF)]

The depth of focus (DOF) was evaluated with respect to Iso CH patterns having a hole diameter of 110 nm.

With the above-mentioned Eop, the focus was appropriately shifted up and down and resist patterns were formed in the same manner as in the "formation of resist pattern (2)" for Examples 5 and 6, and the depth of focus (DOF; unit: μm) with which an Iso CH pattern was formed within the range where the variation in the target size of the Iso CH pattern was ±5% (i.e., 104.5 to 115.5 nm) was determined. The results are shown in Table 5.

[Evaluation of Mask Error Factor (MEF)]

The mask error factor was evaluated with respect to Dense CH patterns having a hole diameter of 110 nm.

With the above Bop, Dense CH patterns having a pitch of 210 nm were formed using a mask pattern targeting a hole diameter of 115 to 125 nm (11 target sizes at intervals of 1 nm). The value of the mask error factor was determined as the gradient of a graph obtained by plotting the target size (nm) on the horizontal axis, and the actual hole diameter (nm) of the formed CH patterns on the vertical axis. The results are shown in Table 5.

A MEF value (gradient of the plotted line) closer to 1 indicates that a resist pattern faithful to the mask pattern was formed.

[Evaluation of Circularity]

Each of the Dense CH patterns and Iso CH patterns having a hole diameter of 110 nm which were formed with the above Eop was observed from the upper side thereof using a scanning electron microscope (SEM), and the circularity was evaluated with the above criteria (A, B C and D) The results are shown in Table 5.

TABLE 5

|  | PAB (° C.) | PEB (° C.) | Eop (mJ/cm$^2$) | DOF (μm) Iso | MEF Dense | Circularity Dense | Circularity Iso |
|---|---|---|---|---|---|---|---|
| Ex. 5 | 110 | 90 | 28.1 | 0.12 | 2.45 | A | A |
| Ex. 6 | 110 | 90 | 31.4 | 0.13 | 2.66 | A | A |

Examples 7 to 14, Comparative Examples 9 and 10

[Formation of Resist Pattern (3)]

An organic anti-reflection film composition (product name: ARC95, manufactured by Brewer Science Ltd.) was applied onto an 12-inch silicon wafer using a spinner, and the composition was then baked at 205° C. for 60 seconds, thereby forming an organic anti-reflection film having a film thickness of 82 nm. Then, each of the positive resist compositions obtained in Examples 7 to 14 and Comparative Examples 9 and 10 was applied onto the anti-reflection film using a spinner, and was then prebaked (PAB) on a hotplate at a temperature indicated in Table 6 for 60 seconds and dried, thereby forming a resist film having a film thickness of 120 nm.

Subsequently, a coating solution for forming a protection film (product name: TILC-035; manufactured by Tokyo Ohka Kogyo Co., Ltd.) was applied onto the resist film using a spinner, and then heated at 90° C. for 60 seconds, thereby forming a top coat with a film thickness of 90 nm.

Thereafter, using an ArF exposure apparatus for immersion lithography (product name: NSR-S609B, manufactured by Nikon Corporation, NA (numerical aperture)=1.07, σ0.97), the resist film having a top coat formed thereon was selectively irradiated with an ArF excimer laser (193 nm) through a mask pattern.

Next, a post exposure bake (PEB) treatment was conducted at a temperature indicated in Table 6 for 60 seconds, followed by development for 60 seconds at 23° C. in a 2.38% by weight aqueous solution of tetramethylammonium hydroxide (TMAH) (product name: NMD-3; manufactured by Tokyo Ohka Kogyo Co., Ltd.). Then, the resist film was rinsed for 30 seconds with pure water, followed by drying by shaking.

As a result, in each of the examples, a line and space pattern (hereafter, referred to as "LS pattern") having a line width of 50 nm and a pitch of 100 nm was formed.

The optimum exposure dose Eop (mJ/cm$^2$) with which the LS patterns having a line width of 50 nm were formed was determined as the sensitivity

[Evaluation of Resist Pattern Shape]

Each of the LS patterns having a line width of 50 nm and a pitch of 100 nm and formed with the above Fop was observed using a scanning electron microscope (SEM), and the cross-sectional shape of the LS pattern was evaluated with the following criteria. The results are shown in Table 6.

A: high rectangularity

B: low rectangularity

[Evaluation of EL Margin]

The exposure dose with which a LS pattern having a dimension of the target dimension (line width: 50 nm)±5% (i.e., 47.5 nm and 52.5 nm) was determined, and the EL margin (unit: %) was determined by the following formula. The results are shown in Table 6.

$$EL\ margin(\%)=(|E1-E2|/Eop)\times 100$$

wherein E1 represents the exposure dose (mJ/cm$^2$) for forming a LS pattern having a line width of 47.5 nm, and E2 represents the exposure dose (mJ/cm$^2$) for forming a LS pattern having a line width of 52.5 nm.

[Evaluation of Line Width Roughness (LWR)]

With respect to each of the LS patterns formed with the above Eop and having a line width of 50 nm and a pitch of 100 nm, the line width at 5 points in the lengthwise direction of the line were measured using a measuring scanning electron microscope (SEM) (product name: S-9220, manufactured by Hitachi, Ltd.), and from the results, the value of 3 times the standard deviation s (i.e., 3s) was calculated as a yardstick of LWR. The results are shown in Table 6.

The smaller this 3s value is, the lower the level of roughness of the line width, indicating that a LS pattern with a uniform width was obtained.

[Evaluation of Depth of Focus (DOF)]

With the above-mentioned Eop, the focus was appropriately shifted up and down, and the depth of focus (DOF; unit: nm) with which a LS pattern having a size within the range of the target size (50 nm)±10% (i.e., 45 to 55 nm) could be formed was determined. The results are shown in Table 6.

TABLE 6

| | PAB (°C.) | PEB (°C.) | Eop (mJ/cm$^2$) | Shape | EL margin (%) | LWR (nm) | DOF (μm) |
|---|---|---|---|---|---|---|---|
| Ex. 7 | 120 | 105 | 18.1 | A | 7.74 | 5.0 | 0.85 |
| Ex. 8 | 120 | 105 | 22.0 | A | 8.77 | 4.6 | 0.90 |
| Ex. 9 | 120 | 105 | 26.0 | A | 10.35 | 5.0 | 0.675 |
| Ex. 10 | 110 | 100 | 44.5 | A | 11.93 | 4.1 | 0.75 |
| Ex. 11 | 120 | 105 | 25.0 | A | 9.51 | 4.3 | 0.90 |
| Ex. 12 | 120 | 105 | 23.5 | A | 9.54 | 5.0 | 0.825 |
| Ex. 13 | 120 | 105 | 24.8 | A | 10.72 | 4.7 | 0.825 |
| Ex. 14 | 120 | 105 | 24.0 | A | 10.69 | 4.8 | 0.825 |
| Comp. Ex. 9 | 120 | 105 | 17.7 | B | 10.17 | 5.4 | 0.60 |
| Comp. Ex. 10 | 110 | 100 | 33.0 | A | 11.42 | 5.2 | 0.45 |

From the results shown above, it was confirmed that the resist compositions of Examples 1 to 14 according to the present invention were capable of forming a resist pattern having an excellent shape, and exhibited excellent lithography properties.

<Base Component (A)—No. 2>

The resin (A)-7 and resin (A)-8 used as the component (A) in Examples 15 to 19 and Comparative Examples 11 and 12 were copolymerized by a conventional dropwise polymerization method, using monomers (3) to (7) shown below.

[Chemical Formula 96]

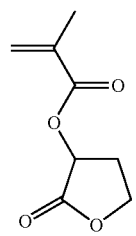

Monomer (4)

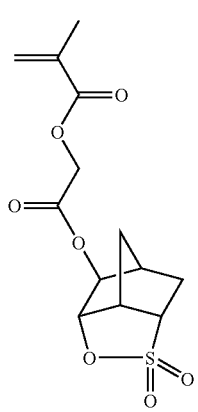

Monomer (5)

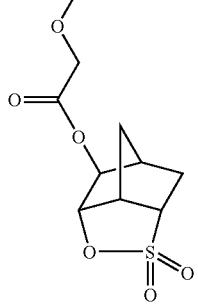

Monomer (6)

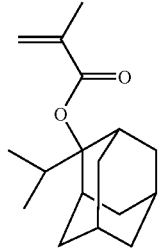

Monomer (7)

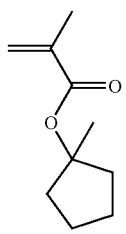

Monomer (3)

Synthesis Example 5

Synthesis of Resin (A)-8

Synthesis of Monomer (5)

The monomer (5) used in Synthesis Example 5 described below was synthesized as follows.

300 ml of a THF solution containing 20 g (105.14 mmol) of an alcohol (1), 30.23 g (157.71 mmol) of ethyldiisopropylaininocarbodiimide (EDCI) hydrochloride and 0.6 g (5 mmol) of dimethylaminopyridine was charged into a 500 ml three-necked flask in nitrogen atmosphere, and 16.67 g (115.66 mmol) of a precursor (1) was added thereto while cooling with ice (0° C.), followed by stirring at room temperature for 12 hours.

After conducting thin-layer chromatography to confirm that the raw materials had been consumed, 50 ml of water was added to stop the reaction. Then, the reaction solvent was concentrated under reduced pressure, and extraction was conducted with ethyl acetate tree times. The obtained organic phase was washed with water, saturated sodium hydrogencarbonate and 1N-$HCl_{aq}$ in this order. Thereafter, the solvent was distilled off under reduced pressure, and the resulting product was dried, thereby obtaining the monomer (5).

[Chemical Formula 97]

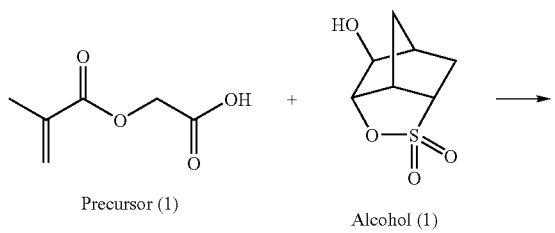

Precursor (1)       Alcohol (1)

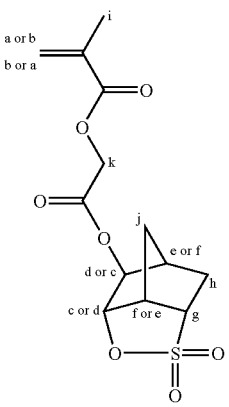

Monomer (5)

The results of instrumental analysis of the obtained monomer (5) were as follows.

$^1$H-NMR(CDCl$_3$, 400 MHz): δ(ppm)=6.22 (s, 1H,H$^a$), 5.70 (s, 1H,H$^b$), 4.71-4.85 (m, 2H,H$^{c,d}$), 4.67 (s, 2H,H$^k$), 3.40-3.60 (m, 2H,H$^{e,f}$), 2.58-2.70 (m, 1H,H$^g$), 2.11-2.21 (m, 2H,H$^h$), 2.00 (s, 3H,H$^j$), 1.76-2.09 (m, 2H,H$^i$), From the results above, it was confirmed that the monomer (5) had a structure as shown below.

[Chemical Formula 98]

Synthesis of Resin (A)-8

In a three-necked flask equipped with a thermometer and a reflux tube, 11.77 g (69.23 mmol) of a monomer (4), 15.00 g (47.47 mmol) of the monomer (5), 16.58 g (63.29 mmol) of a monomer (6), 4.65 g (27.69 mmol) of a monomer (7) and 3.27 g (13.85 mmol) of a monomer (3) were dissolved in 76.91 g of methyl ethyl ketone (MEK) to obtain a solution. Then, 22.1 mmol of dimethyl 2,2'-azobis(isobutyrate) (product name: V-601, manufactured by Wako Pure Chemical Industries, Ltd.) was added and dissolved in the obtained solution. The resultant was dropwise added to 42.72 g of MEK heated to 78° C. in a nitrogen atmosphere over 3 hours. The resulting reaction solution was heated while stirring for 4 hours, and then cooled to room temperature. The obtained reaction polymer solution was dropwise added to an excess amount of n-heptane, and an operation to deposit a polymer was conducted. Thereafter, the precipitated white powder was separated by filtration, followed by washing with a n-heptane/isopropylalcohol mixed solvent and drying, thereby obtaining 41 g of a resin (A)-8 as an objective compound.

With respect to the resin (A)-8, the weight average molecular weight and the dispersity were determined by the polystyrene equivalent value as measured by gel permeation chromatography (GPC). As a result, it was found that the weight average molecular weight was 7,900, and the dispersity was 1.78. Further, the resin (A)-8 was analyzed by carbon 13 nuclear magnetic resonance spectroscopy at 600 MHz (600 MHz_$^{13}$C-NMR). As a result, it was found that the composition of the copolymer (ratio (molar ratio) of the respective structural units within the structural formula) was a2/a0/a11/a12/a3=35/26/18/13/8.

[Chemical Formula 99]

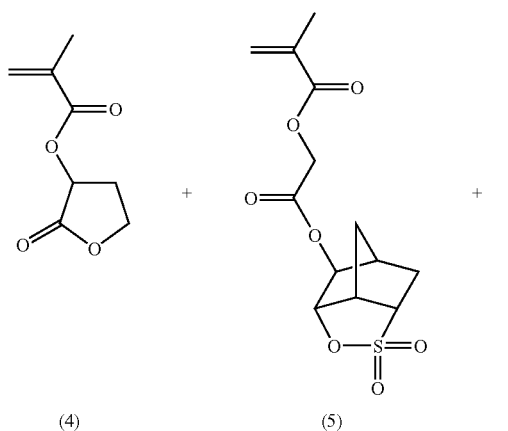

(4)    (5)

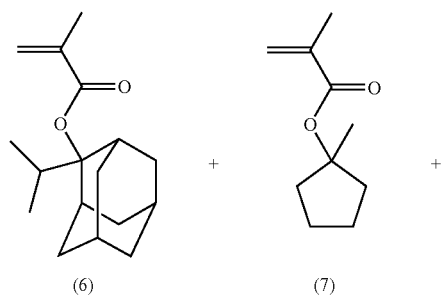

(6)    (7)

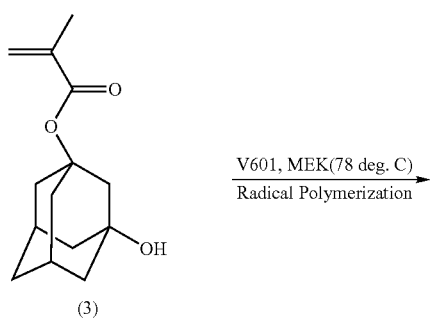

(3)

V601, MEK(78 deg. C)
───────────────────→
Radical Polymerization

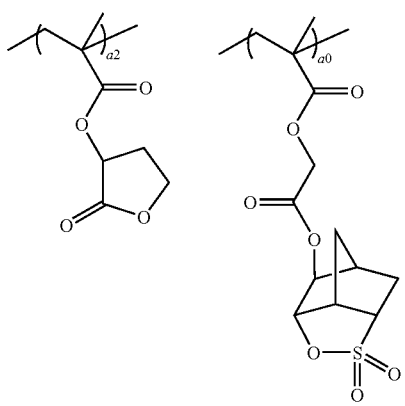

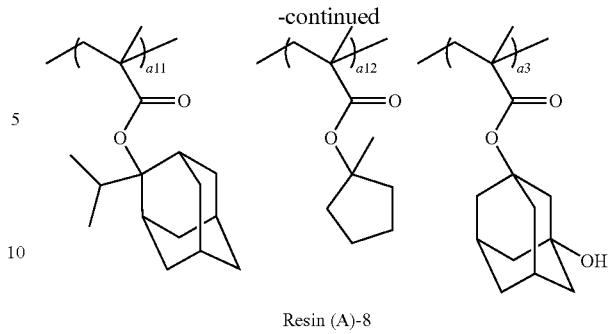

Resin (A)-8

Synthesis Example 6

Synthesis of Resin (A)-7

A resin (A)-7 was synthesized in substantially the same manner as in the synthesis of the resin (A)-8, except that the amounts of monomer (4), monomer (5), monomer (6), monomer (7) and monomer (3) used in terms of molar ratio were changed to monomer (4)/monomer (5)/monomer (6)/monomer (7)/monomer (3)=29.6/16.6/36.4/12/5.4.

With respect to the resin (A)-7, the weight average molecular weight and the dispersity were determined by the polystyrene equivalent value as measured by gel permeation chromatography (GPC). As a result, it was found that the weight average molecular weight was 7,900, and the dispersity was 1.78. Further; the resin (A)-7 was analyzed by carbon 13 nuclear magnetic resonance spectroscopy at 600 MHz (600 MHz_$^{13}$C-NMR). As a result, it was found that the composition of the copolymer (ratio (molar ratio) of the respective structural units within the structural formula) was a2/a0/a11/a12/a3=35/21/24/13/7.

The structure and reaction formula of the resin (A)-7 were the same as those of the resin (A)-8.

<Acid-Generator Component (B)—No. 2>

Acid generators (B)-6 to (B)-8 used as the component (B) in Examples 16 to 21 and Comparative Examples 12 and 13 were respectively synthesized in accordance with the following synthesis examples.

Synthesis Example 7

Synthesis of Acid Generator (B)-6

(i) Synthesis of Compound (d)

5.00 g of the compound (II), 5.68 g of sultone-OH (c) and 100 g of toluene were prepared, and 0.43 g of p-toluenesulfonic acid monohydrate was added thereto. The resultant was heated until toluene was refluxed, and a reaction was effected in this state for 65 hours Thereafter, the reaction mixture was filtered, and 100 g of toluene was added to the residue, followed by stirring at room temperature for 10 minutes. This filtration step was performed twice to obtain a black powder. The obtained powder was dried under reduced pressure for one night, and extraction was conducted twice using 100 g of acetone. Then, acetone was distilled off from the filtrate, and the resultant was dissolved in 30 g of acetone to obtain a solution. The obtained solution was gradually added to a mixture of 300 g of TBME and 300 g of methylene chloride in a dropwise manner, and the precipitated solid was collected by filtration and dried, thereby obtaining 6.88 g of a compound (d) in the form of a white powder (yield: 78.4%).

[Chemical Formula 100]

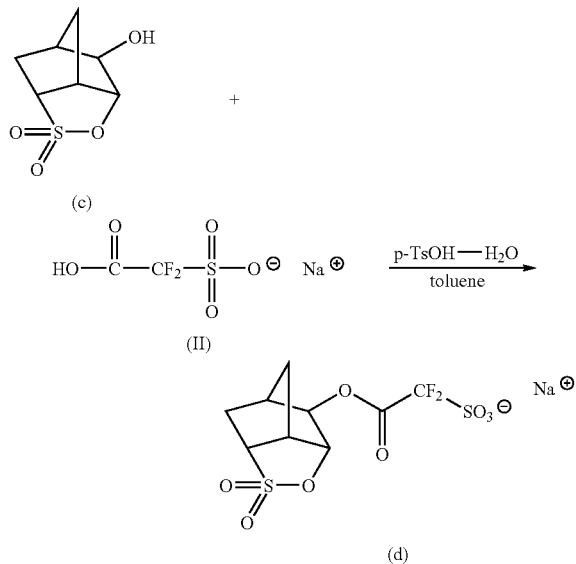

The obtained compound (d) was analyzed by $^1$H-NMR and $^{19}$F-NMR.

$^1$H-NMR(DMSO-d6, 400 MHz): δ(ppm) 1.73-2.49 (m, 4H,Ha,Hb), 2.49 (m, 1H,Hc), 3.48 (m, 1H,Hd), 3.88 (t, 1H,He), 4.66 (t, 1H,Hf), 4.78 (m, 1H,Hg).

$^{19}$F-NMR(DMSO-d6, 400 MHz): δ(ppm)−107.7 (m, 2F,Fa), (the peak of hexafluorobenzene was regarded as −160 ppm).

From the results above, it was confirmed that the compound (d) had a structure shown below.

[Chemical Formula 101]

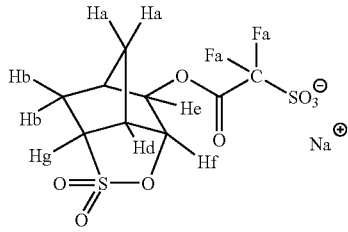

(ii) Synthesis of Intermediate Compound (f-01)

To 60.75 g of methanesulfonic acid controlled to 20° C. or lower was added 8.53 g of phosphorus oxide, 8.81 g of 2,6-dimethylphenol and 12.2 g of diphenylsulfoxide in small amounts. The resultant was matured for 30 minutes while maintaining the temperature at 15 to 20° C., followed by elevating the temperature to 40° C. and maturing for 2 hours. Then, the reaction mixture was dropwise added to 109.35 g of pure water cooled to 15° C. or lower. Thereafter, 54.68 g of dichloromethane was added and stirred, and the dichloromethane phase was collected. 386.86 g of hexane at a temperature of 20 to 25° C. was charged into a separate vessel, and the dichloromethane phase was dropwise added thereto. Then, the resultant was matured at 20 to 25° C. for 30 minutes, followed by filtration, thereby obtaining an intermediate compound (f-01) as an objective compound (yield: 70.9%).

The obtained intermediate compound (f-01) was analyzed by $^1$H-NMR.

$^1$H-NMR(DMSO-d6, 600 MHz): δ(ppm)=7.61-7.72 (m, 10H,phenyl), 7.14 (S, 2H,H$^c$), 3.12 (S, 3H,H$^b$), 2.22 (S, 6H,H$^a$).

From the results shown above, it was confirmed that the obtained intermediate compound (f-01) had a structure shown below.

[Chemical Formula 102]

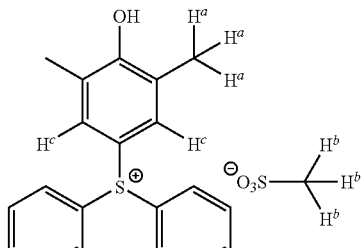

(iii) Synthesis of Compounds (f-1) to (f-3)

4 g of the intermediate compound (f-01) was dissolved in 79.8 g of dichloromethane. After confirming that the compound (i) had dissolved in dichloromethane, 6.87 g of potassium carbonate was added thereto, and 3.42 g of 2-methyl-2-adamantyl bromoacetate was further added. A reaction was effected under reflux for 24 hours, followed by filtration, washing with water, and crystallization with hexane. The resulting powder was dried under reduced pressure, thereby obtaining 3.98 g of an objective compound (yield: 66%).

The obtained objective compound was analyzed by $^1$H-NMR. The results are shown below.

$^1$H-NMR(CDCl$_3$, 600 MHz): δ(ppm)=7.83-7.86 (m, 4H,phenyl), 7.69-7.78 (m, 6H,phenyl), 7.51 (s, 2H,H$^d$), 4.46 (s, 2H,H$^c$), 2.39 (s, 6H,H$^a$), 2.33 (s, 2H,Adamantane), 2.17 (s, 2H,Adamantane), 1.71-1.976 (m, 11H,Adamantane), 1.68 (s, 3H,H$^b$), 1.57-1.61 (m, 2H,Adamantane).

From the results of the analysis shown above, it was confirmed that the objective compound contained a compound (f-1) having a structure shown below.

[Chemical Formula 103]

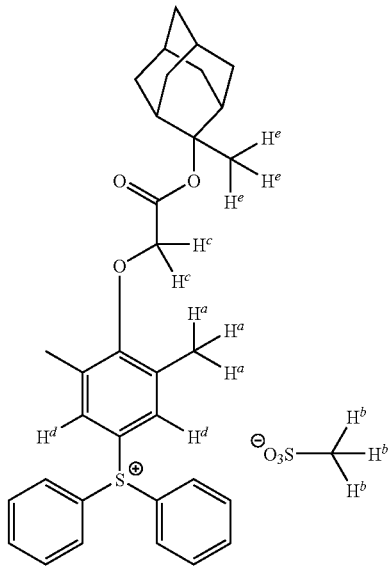

Further, as a result of an ion chromatography analysis, it was confirmed that the obtained objective compound also contained a compound (f-2) and a compound (f-3), both of which had the same NMR data for the cation moiety as that of the compound (f-1). The amounts of the compound (f-1), the compound (f-2) and the compound (f-3) were 21.4 mol %, 11.4 mol % and 67.2 mol %, respectively.

[Chemical Formula 104]

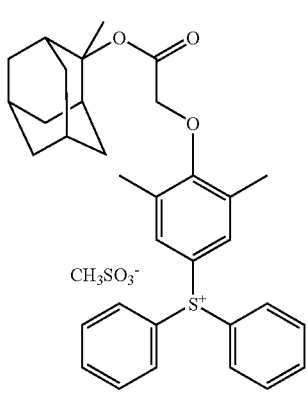

(f-1)

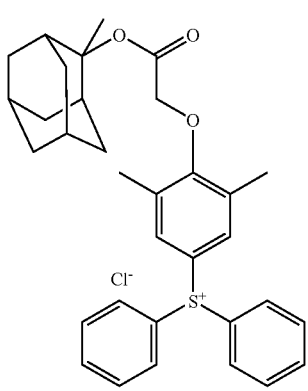

(f-2)

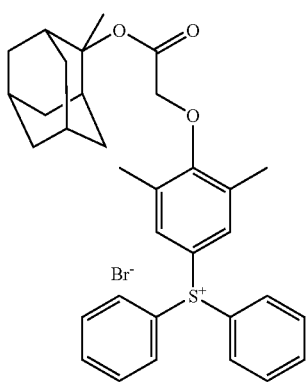

(f-3)

(iv) Synthesis of Compound (g) (Acid Generator (B)-6)

5.00 g of the compound (d) was dissolved in 50.0 g of pure water, and 6.19 g of the compound (f-3) and 50.0 g of methylene chloride were added thereto in this order, followed by stirring at room temperature for 10 hours. Then, the organic phase was collected from the resultant by liquid separation. Thereafter, the organic phase was washed three times with a 1% aqueous HCl solution, once with a 1% aqueous ammonia solution and four times with pure water, and the organic phase was concentrated, thereby obtaining 8.58 g of a compound (g) in the form of a white solid (90.4%).

[Chemical Formula 105]

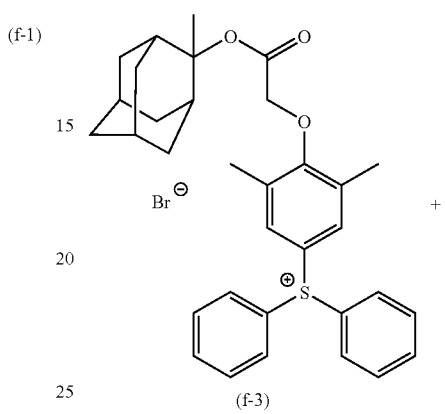

(f-3)

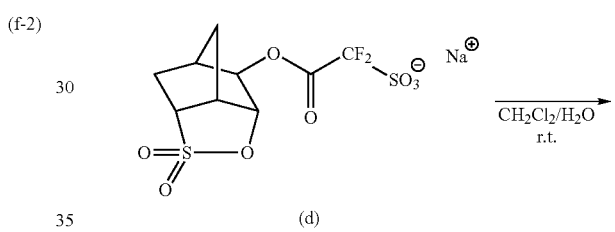

(d)

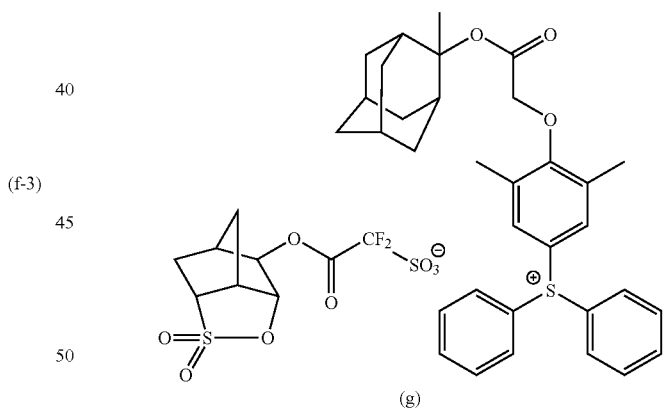

(g)

The obtained compound (g) was analyzed by $^1$H-NMR and $^{19}$F-NMR.

$^1$H-NMR(DMSO-d6, 400 MHz): δ(ppm)=1.47-1.95 (m, 15H,Ad,3H,anion), 2.13-2.16 (m, 2H,Ad,1H,anion), 2.30 (s, 6H,PhCH$_3$), 2.49 (m, 1H,anion), 3.48 (m, 1H,anion), 3.88 (t, 1H,anion), 4.58 (s, 2H,CH$_2$) 4.66 (t, 1H,anion), 4.78 (m, 1H,anion), 7.57 (m, 2H,Ph), 7.72-7.84 (m, 10H,Ph).

$^{19}$F-NMR(DMSO-d6, 400 MHz): δ(ppm)−107.8 (m, 2F,CF$_2$) (the peak of hexafluorobenzene was regarded as −160 ppm).

From the results above, it was confirmed that the compound (g) had a structure as shown in formula (g) above.

Synthesis Example 8

Synthesis of Acid Generator (B)-7

Synthesis of Compound (e) (Acid Generator (B)-7)

3.21 g of the compound (d) was added to 32.1 g of pure water, and 3.72 g of 4-methylphenyldiphenylsulfonium bromide and 32.1 g of methylene chloride were added thereto in this order, followed by stirring at room temperature for 1 hour. Then, the organic phase was collected from the resultant by liquid separation. Thereafter, the organic phase was washed three times with a 1% aqueous HCl solution, and four times with pure water, and the organic phase was concentrated, thereby obtaining 4.94 g of a compound (e) in the form of a white solid (86.8%).

[Chemical Formula 106]

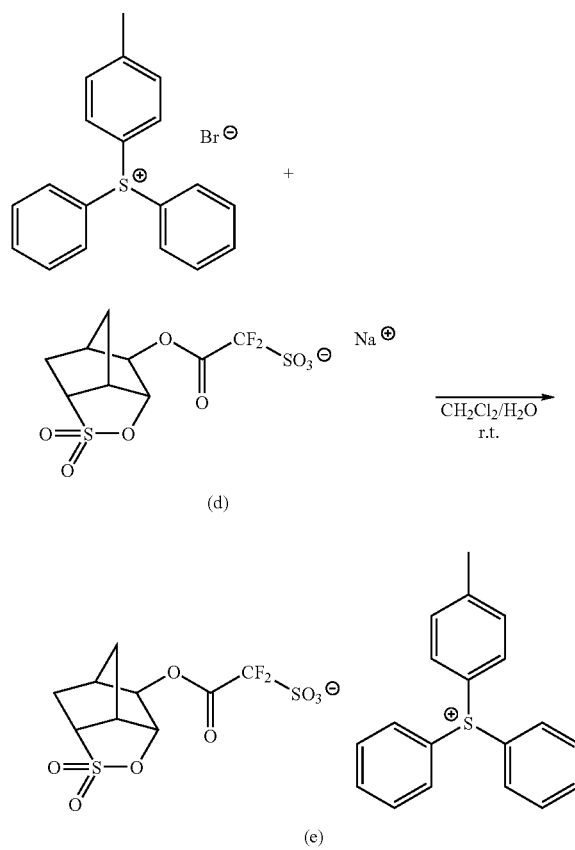

(d)

(e)

The obtained compound (e) was analyzed by $^1$H-NMR and $^{19}$F-NMR.

$^1$H-NMR(DMSO-d6,400 MHz): δ(ppm) 1.74-2.21 (m, 4H,anion), 2.41 (t, 3H,PhCH$_3$), 2.58 (m, 1H,ion), 3.48 (m, 1H,anion), 3.87 (t, 1H,anion), 4.66 (t, 1H,anion), 4.78 (m, 1H,anion), 7.58 (m, 2H,ph), 7.64-7.84 (m, 12H,ph).

$^{19}$F-NMR(DMSO-d6,400 MHz): δ(ppm)−107.6 (m, 2F,Fa), (the peak of hexafluorobenzene was regarded as −160 ppm).

From the results above, it was confirmed that the compound (e) had a structure as shown in formula (e) above.

Synthesis Example 9

Synthesis of Acid Generator (B)-8

(i) Synthesis of Compound (h)

4.34 g of a compound (II) (purity: 94.1%), 3.14 g of 2-benzyloxyethanol and 43.4 g of toluene were prepared, 0.47 g of p-toluenesulfonic acid monohydrate was added thereto, and the resultant was refluxed at 105° C. for 20 hours. Then, the reaction mixture was filtered, and 20 g of hexane was added to the residue and stirred. Thereafter, the resultant was filtered, and the residue was dried, thereby obtaining 1.41 g of a compound (h) (yield: 43.1%).

[Chemical Formula 107]

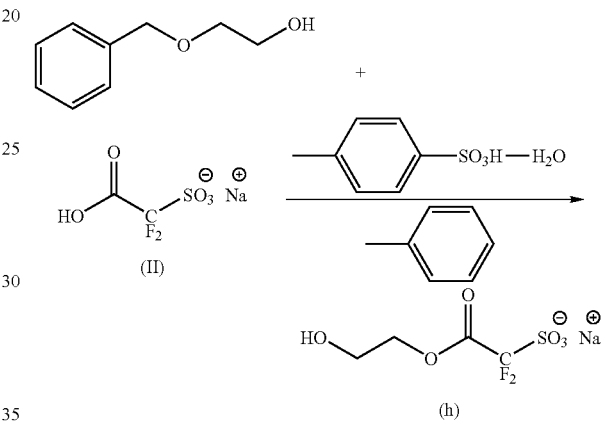

(h)

The obtained compound (h) was analyzed by $^1$H-NMR and $^{19}$F-NMR, $^1$H-NMR(DMSO-d6, 400 MHz): δ(ppm)=4.74-4.83 (t, 1H,OH), 4.18-4.22 (t, 2H,H$^a$), 3.59-3.64 (q, 2H9H$^b$).

$^{19}$F-NMR(DMSO-d6, 376 MHz): δ(ppm)=−106.6.

From the results above, it was confirmed that the compound (h) had a structure shown below.

[Chemical Formula 108]

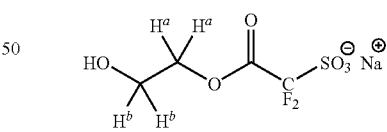

(ii) Synthesis of Compound (k)

To 2.42 g of the compound (h) and 7.26 g of acetonitrile were dropwise added 2.19 g of undecanoylcarbonyl chloride and 1.01 g of triethylamine while cooling with ice. Then, the resultant was stirred at room temperature for 20 hours, followed by filtration. The filtrate was concentrated and dried, and dissolved in 20 g of dichloromethane, followed by washing with water three times. Thereafter, the organic phase was concentrated and dried, thereby obtaining 3.41 g of a compound (k) (yield: 80.4%).

[Chemical Formula 109]

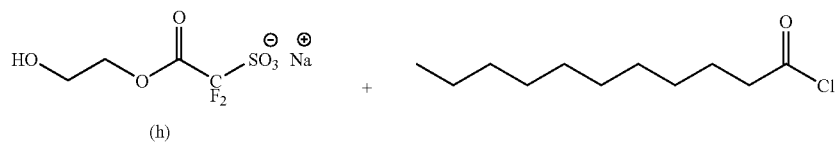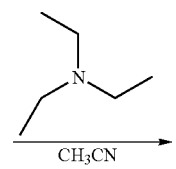

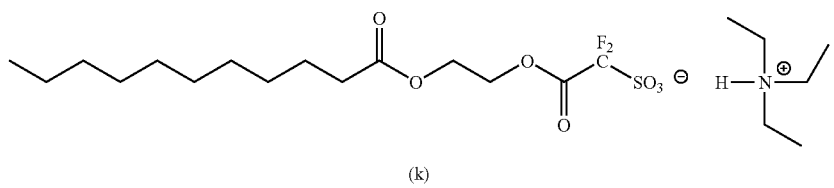

The obtained compound (k) was analyzed by NMR.

$^1$H-NMR(DMSO-d6, 400 MHz): δ(ppm)=8.81 (s, 1H,H$^f$), 4.39-4.41 (t, 2H,Hd), 4.23-4.39 (t, 2H,H$^e$), 3.06-3.10 (q, 6H,H$^h$), 2.24-2.29 (t, 2H,H$^c$), 1.09-1.51 (m, 25H,H$^b$+H$^g$), 0.83-0.89 (t, 3H,H$^a$).

$^{19}$F-NMR(DMSO-d6, 376 MHz): δ(ppm)=−106.8.

From the results above, it was confirmed that the compound (k) had a structure shown below,

[Chemical Formula 110]

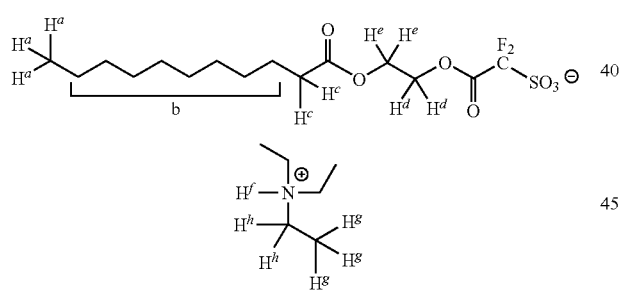

(iii) Synthesis of Compound (m) (Acid Generator (B)-8)

1.74 g of 4-methylphenyldiphenylsulfonium bromide was dissolved in 8.41 g of dichloromethane and 8.41 g of water, and 2.00 g of the compound (p) was added thereto, followed by stirring for 1 hour.

Thereafter, the organic phase was collected by liquid separation, and washed with 3.84 g of water three times. The resulting organic phase was concentrated and dried, thereby obtaining 2.15 g of a compound (m).

[Chemical Formula 111]

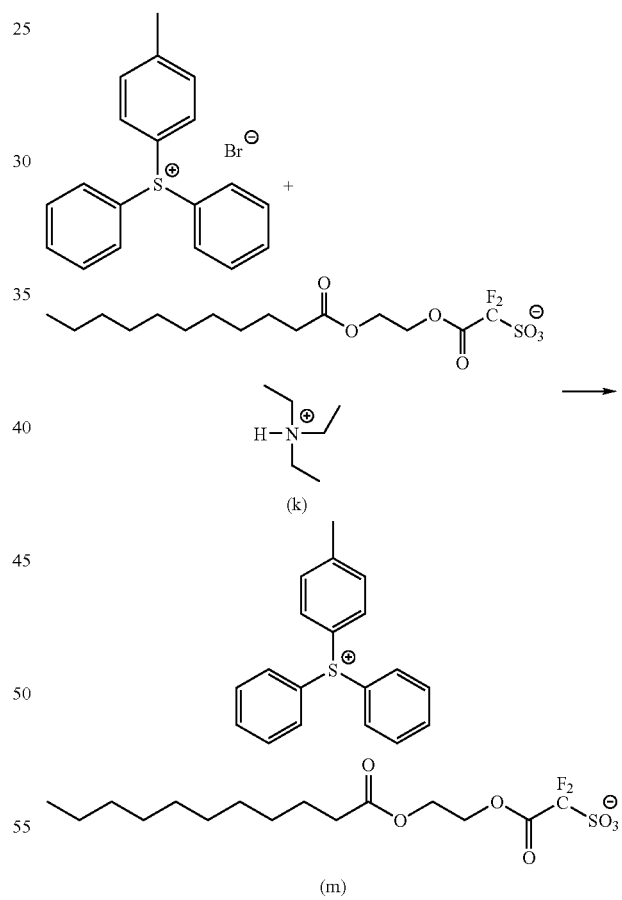

The obtained compound (m) was analyzed by $^1$H-NMR and $^{19}$F-NMR.

$^1$H-NMR(DMSO-d6, 400 MHz): δ(ppm)=7.74-7.90 (m, 14H,Phenyl), 4.39-4.42 (t, 2H,H$^g$), 4.21-4.24 (t, 2H,H$^d$), 2.25-2.89 (t, 5H,H$^c$+H$^f$), 1.17-1.50 (m, 16H,H$^b$), 0.79-0.88 (t, 3H,H$^a$).

$^{19}$F-NMR(DMSO-d6, 376 MHz): δ(ppm)=−106.8.

From the results above, it was confined that the compound (m) had a structure shown below.

[Chemical Formula 112]

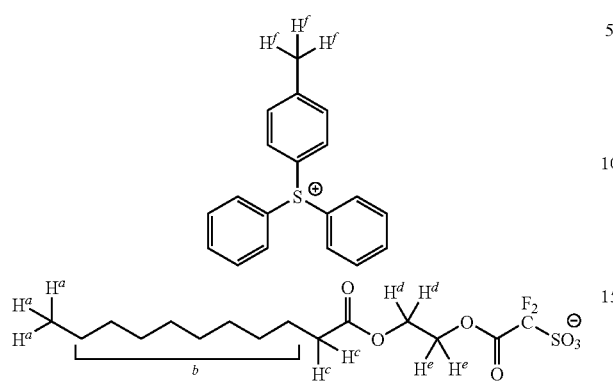

[Chemical Formula 113]

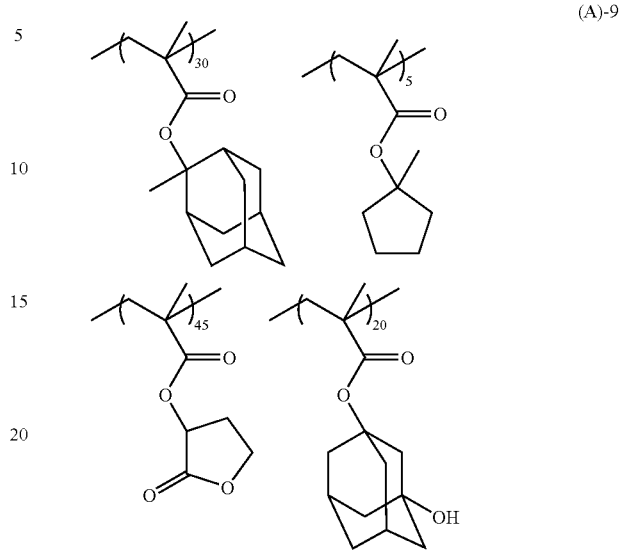

<Production of Resist Composition—No. 2>
The components shown in Table 7 were mixed together and dissolved to obtain positive resist compositions.

TABLE 7

|  | Component (A) | Component (B) | | Component (C) | Component (D) | Component (E) | Component (S) |
|---|---|---|---|---|---|---|---|
| Comp. Ex. 11 | (A)-7 [100] | (B)-5 [9.8] | — | — | (D)-1 [0.4] | — | (S)-1 [3200] |
| Ex. 15 | (A)-7 [100] | (B)-5 [9.8] | — | (C)-1 [1.3] | (D)-1 [0.2] | (E)-1 [0.4] | (S)-1 [3200] |
| Comp. Ex. 12 | (A)-7 [100] | (B)-6 [10.1] | — | — | (D)-1 [0.3] | (E)-1 [0.4] | (S)-1 [3200] |
| Ex. 16 | (A)-7 [100] | (B)-6 [10.1] | — | (C)-1 [1.3] | (D)-1 [0.15] | (E)-1 [0.4] | (S)-1 [3200] |
| Ex. 17 | (A)-7 [100] | (B)-7 [7.3] | — | (C)-1 [1.3] | (D)-1 [0.15] | (E)-1 [0.4] | (S)-1 [3200] |
| Ex. 18 | (A)-7 [100] | (B)-7 [6.35] | — | (C)-1 [2.6] | (D)-1 [0.15] | (E)-1 [0.4] | (S)-1 [3200] |
| Ex. 19 | (A)-8 [100] | (B)-7 [6.35] | — | (C)-1 [2.6] | (D)-1 [0.15] | (E)-1 [0.24] | (S)-1 [3200] |
| Comp. Ex. 13 | (A)-9 [100] | (B)-8 [1.0] | (B)-9 [10.0] | — | (D)-1 [1.8] | (E)-1 [3.28] | (S)-1 [3200] |
| Ex. 20 | (A)-9 [100] | (B)-8 [1.0] | (B)-9 [10.0] | (C)-1 [2.0] | (D)-1 [1.8] | (E)-1 [3.28] | (S)-1 [3200] |
| Ex. 21 | (A)-9 [100] | (B)-8 [1.0] | (B)-9 [7.0] | (C)-1 [3.0] | (D)-1 [1.5] | (E)-1 [2.73] | (S)-1 [3200] |

In Table 7, the reference characters indicate the following. Further, the values in brackets [ ] indicate the amount (in terms of parts by weight) of the component added.

(A)-7: the resin (A)-7

(A)-8: the resin (A)-8

(A)-9: a resin (A)-9 shown below Mw=7,000, Mw/Mn=1.8. In the structural formula shown below, each of the subscript numerals at the lower right of the brackets in formulas (A)-1 to (A)-3 indicate the amount (mol %) of the respective structural units, based on the total amount of all structural units constituting the resin (A)-9.

(B)-5: an acid generator represented by chemical formula (B1-5) shown below (B)-6: an acid generator represented by chemical formula (B1-6) shown below (B)-7: an acid generator represented by chemical formula (B1-7) shown below (B)-8: an acid generator represented by chemical formula (B1-8) shown below (B)-9: an acid generator represented by chemical formula (B1-9) shown below

[Chemical Formula 114]

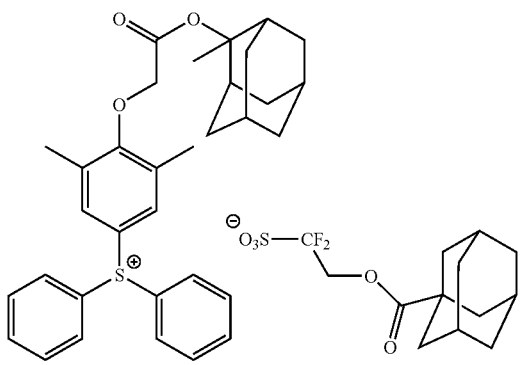
(B1-5)

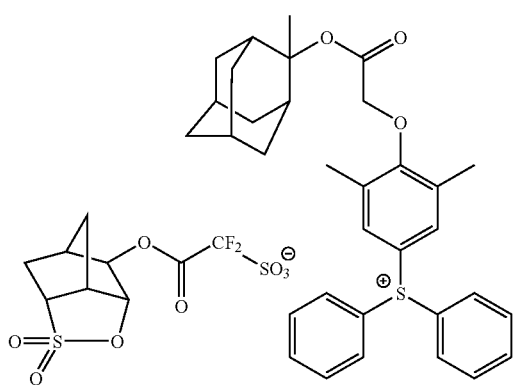
(B1-6)

(B1-7)

[Chemical Formula 115]

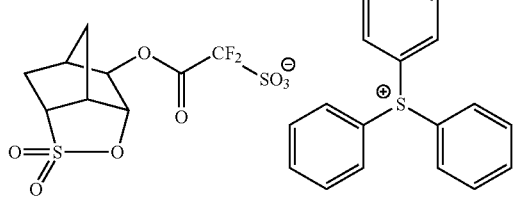
(B1-8)

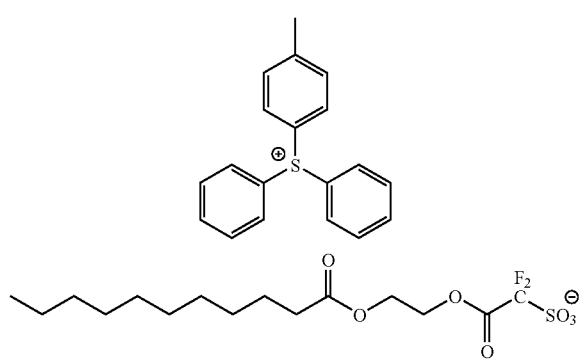

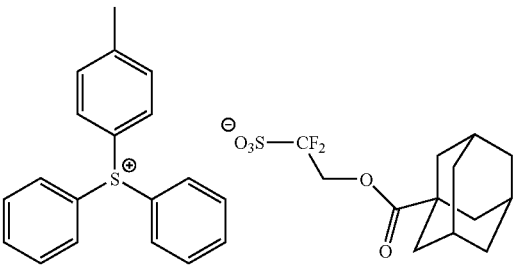
(B1-9)

(C)-1: an organic compound represented by chemical formula (C1-1) above (D)-1: tri-n-pentylamine (E)-1: salicylic acid (S)-1: a mixed solvent of PGMEA/PGME=6/4 (weight ratio)

<Evaluation of Resist Pattern—No. 2>

Using the obtained positive resist compositions, resist patterns were formed in the following manner, and the shape of the resist pattern and various lithography properties were evaluated.

Examples 15 to 19, Comparative Examples 11 and 12

[Formation of Resist Pattern (4)]

An organic anti-reflection film composition (product name: ARC29A, manufactured by Brewer Science Ltd.) was applied onto an 12-inch silicon wafer using a spinner, and the composition was then baked at 205° C. for 60 seconds, thereby forming an organic anti-reflection film having a film thickness of 89 nm. Then, each of the positive resist compositions obtained in Examples 15 to 19 and Comparative Examples 11 and 12 was applied onto the anti-reflection film using a spinner, and was ten prebaked (PAB) on a hotplate at a temperature indicated in Table 8 for 60 seconds and dried, thereby forming a resist film having a film thickness of 100 nm.

Subsequently, a coating solution for forming a protection film (product name: TILC-057; manufactured by Tokyo Ohka Kogyo Co., Ltd.) was applied onto the resist film using a spinner, and then heated at 90° C. for 60 seconds, thereby forming a top coat with a film thickness of 35 nm.

Thereafter, using an ArF exposure apparatus for immersion lithography product name: NSR-S609B, manufactured by Nikon Corporation, NA (numerical aperture)=1.07, σ0.97), the resist film having a top coat formed thereon was selectively irradiated with an ArF excimer laser (193 nm) through a mask pattern.

Next, a post exposure bake (PEB) treatment was conducted at a temperature indicated in Table 8 for 60 seconds, followed by development for 30 seconds at 23° C. in a 2.38% by weight aqueous solution of tetramethylammonium hydroxide (TMAH) (product name: NMD-3; manufactured by Tokyo Ohka Kogyo Con, Ltd.). Then, the resist film was rinsed for 30 seconds with pure water, followed by drying by shaking.

As a result, in each of the examples, a contact hole pattern in which holes having a diameter of 90 nm were equally spaced (pitch: 540 nm) was formed (hereinafter, this contact hole pattern is referred to as "Iso CH pattern").

Evaluation of Iso CH Pattern:

[Sensitivity]

The optimum exposure dose Eop (mJ/cm$^2$) with which the Iso CH patterns having a hole diameter of 90 nm and a pitch of 540 nm was formed in the "formation of resist pattern (4)" was determined. The results are shown in Table 8.

[Evaluation of CD Uniformity (CDU)]

With respect to each of the Iso CH patterns formed with the above Eop, the hole diameter (CD) of 25 holes were measured. From the results, the value of 3 times the standard deviation σ (i.e., 3σ) was calculated as a yardstick of CD uniformity (CDU). The results are shown in Table 8.

The smaller this 3σ value is, the higher the level of CDU of the holes formed in the resist film.

[Evaluation of Circularity]

Each of the Iso CH patterns formed with the above Eop was observed from the upper side thereof using a scanning electron microscope (product name: S-9220, manufactured by Hitachi, Ltd.), and with respect to each of 25 holes, the distance from the center of the hole to the outer periphery thereof was measured in 24 directions. From the results, the value of 3 times the standard deviation σ (i.e., 3σ) was calculated as a yardstick of circularity. The results are shown in Table 8.

The smaller this 3σ value is, the higher the level of circularity of the holes.

TABLE 8

| Iso | PAB (° C.) | PEB (° C.) | Eop (mJ/cm$^2$) | CDU | Circularity |
|---|---|---|---|---|---|
| Comp. Ex. 11 | 90 | 85 | 29.7 | 5.64 | 3.39 |
| Ex. 15 | 90 | 85 | 33.7 | 5.27 | 2.59 |
| Comp. Ex. 12 | 90 | 85 | 33.0 | 4.86 | 3.40 |
| Ex. 16 | 90 | 85 | 38.8 | 4.72 | 2.91 |
| Ex. 17 | 90 | 85 | 28.9 | 4.29 | 2.98 |
| Ex. 18 | 90 | 85 | 39.8 | 4.61 | 2.48 |
| Ex. 19 | 110 | 85 | 49.4 | 4.38 | 2.85 |

From the results shown in Table 8, it was confirmed that the resist compositions of Examples 15 to 19 according to the present invention were capable of forming a resist pattern having high circularity and excellent shape, as compared to a resist pattern formed using the resist compositions of Comparative Examples 11 and 12.

Examples 20 and 21, Comparative Example 13

[Formation of Resist Pattern (5)]

An organic anti-reflection film composition (product name: ARC145, manufactured by Brewer Science Ltd.) was applied onto an 12-inch silicon wafer using a spinner, and the composition was then baked at 205° C. for 60 seconds, thereby forming an organic anti-reflection film having a film thickness of 35 nm.

Then, another organic anti-reflection film composition (product name: ARC113, manufactured by Brewer Science Ltd.) was applied onto organic anti-reflection film using a spinner, followed by baking at 205° C. for 60 seconds, thereby forming an organic anti-reflection film having a film thickness of 40 nm.

Then, each of the positive resist compositions obtained in Examples 20 and 21 and Comparative Example 13 was applied onto the anti-reflection film using a spinner, and was then prebaked (PAB) on a hotplate at a temperature indicated in Table 9 for 60 seconds and dried, thereby forming a resist film having a film thickness of 100 nm.

Subsequently, a coating solution for forming a protection film (product name: TILC-057; manufactured by Tokyo Ohka Kogyo Co., Ltd.) was applied onto the resist film using a spinner, and then heated at 90° C. for 60 seconds, thereby forming a top coat with a film thickness of 35 nm.

Thereafter, using an ArF exposure apparatus for immersion lithography product name: NSR-S609B, manufactured by Nikon Corporation, NA (numerical aperture)=1.07, σ0.97), the resist film having a top coat formed thereon was selectively irradiated with an ArF excimer laser (193 nm) through a mask pattern.

Next, a post exposure bake (PEB) treatment was conducted at a temperature indicated in Table 9 for 60 seconds, followed by development for 30 seconds at 23° C. in a 2.38% by weight aqueous solution of tetramethylammonium hydroxide (TMAH) (product name: NMD-3; manufactured by Tokyo Ohka Kogyo Co., Ltd.). Then, the resist film was rinsed for 30 seconds with pure water, followed by drying by shaking.

As a result, in each of the examples, a line and space pattern (LS pattern) having a line width of 40 nm and a pitch of 124 nm was formed.

Evaluation of LS Pattern:

[Sensitivity]

The optimum exposure dose Eop (mJ/cm$^2$) with which the LS pattern having a line width of 40 nm and a pitch of 124 nm was formed in the "formation of resist pattern (5)" was determined. The results are shown in Table 9.

[Evaluation of Depth of Focus (DOF)]

The depth of focus (DOF) was evaluated with respect to the LS patterns having a line width of 40 nm and a pitch of 124 nm.

With the above-mentioned Eop, the focus was appropriately shifted up and down and resist patterns were formed in the same manner as in the "formation of resist pattern (5)", and the depth of focus (DOF; unit: μm) with which a LS pattern was formed within the range where the variation in the target size of the LS pattern was ±5% (i.e., 38 to 42 nm) was determined. The results are shown in Table 9.

[Evaluation of Line Width Roughness (LWR)]

With respect to each of the LS patterns formed with the above Eop, the line width at 5 points in the lengthwise direction of the line were measured using a measuring scanning electron microscope (SEM) (product name: S-9220, manufactured by Hitachi, Ltd.; acceleration voltage: 800V), and from the results, the value of 3 times the standard deviation s (i.e., 3s) was calculated as a yardstick of LWR. The results are shown in Table 9.

"LWR" refers to the non-uniformity of the line widths of a line pattern, and improvement in this characteristic becomes more important as the pattern becomes finer.

The smaller this 3s value is, the lower the level of roughness of the line width, indicating that a LS pattern with a uniform width was obtained.

TABLE 9

| | PAB (° C.) | PEB (° C.) | Eop (mJ/cm$^2$) | DOF (μm) | LWR (nm) |
|---|---|---|---|---|---|
| Comp. Ex. 13 | 115 | 110 | 20.5 | 0.15 | 5.80 |
| Ex. 20 | 115 | 110 | 22.5 | 0.30 | 5.33 |
| Ex. 21 | 115 | 110 | 31.8 | 0.20 | 5.24 |

As seen from the results shown in Table 9, the resist compositions of Examples 20 and 21 according to the present invention exhibited a large DOF value and a small LWR value, as compared to the resist composition of Comparative Example 13, and hence, it was confirmed that the resist compositions of Examples 20 and 21 according to the present invention exhibited excellent lithography properties.

What is claimed is:

1. A resist composition comprising a base component (A) which exhibits changed solubility in an alkali developing solution under action of acid and an acid-generator component (B) which generates acid upon exposure, said acid-generator component (B) comprising an acid generator (B1) consisting of a compound represented by any one of general formulae (b1-2), (b1-1-1), (b1-1-2), (b1-1-3), (b1-1-4), (b1-1-5) and (b1-2-3) shown below, and said resist composition further comprising an organic compound (C) which generates an acid exhibiting a weaker acid strength than the acid generated from said acid generator (B1) upon exposure

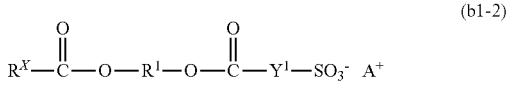
(b1-2)

wherein $R^X$ represents an aliphatic group which may have a substituent exclusive of a nitrogen atom; $R^1$ represents an alkylene group; $Y^1$ represents a fluorinated alkylene group of 1 to 4 carbon atoms which may have a substituent, with the proviso that the carbon atom adjacent to the sulfur atom within the $-SO_3^-$ group has a fluorine atom bonded thereto; and $A^+$ represents an organic cation;

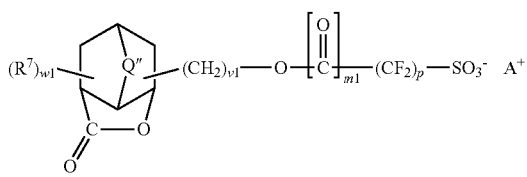
(b1-1-1)

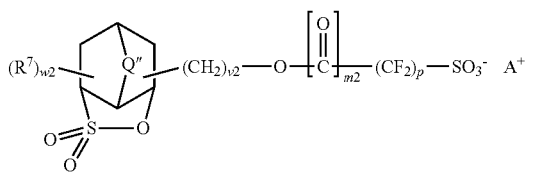
(b1-1-2)

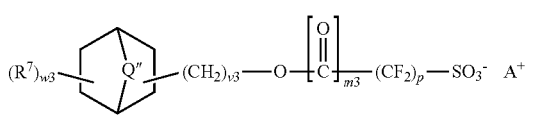
(b1-1-3)

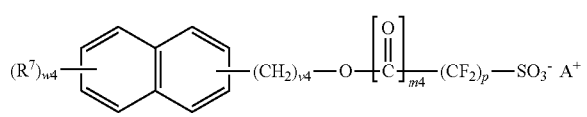
(b1-1-4)

(b1-1-5)

wherein Q" represents an alkylene group of 1 to 5 carbon atoms, $-O-$, $-S-$, $-O-R^{94}-$ or $-S-R^{95}-$, wherein each of $R^{94}$ and $R^{95}$ independently represents an alkylene group of 1 to 5 carbon atoms, provided that Q" does not represent an alkylene group of 1 to 5 carbon atoms in formula (b1-1-1); $A^+$ represents an organic cation; p represents an integer of 1 to 3; each of m1 to m5 independently represents 0 or 1; each of v1 to v5 independently represents an integer of 0 to 3; each of w1 to w5 independently represents an integer of 0 to 3; and $R^7$ represents a substituent; and

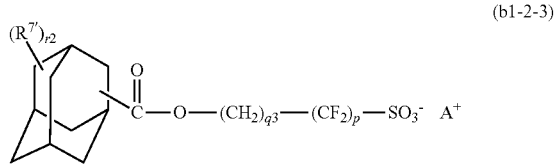
(b1-2-3)

wherein $A^+$ represents an organic cation; p represents an integer of 1 to 3; q3 represents an integer of 1 to 12; r2 represents an integer of 0 to 3; and $R^{7\prime}$ represents a substituent.

2. The resist composition according to claim 1, wherein said organic compound (C) comprises a compound represented by general formula (c1) shown below:

[Chemical Formula 2]

$$R^0-SO_3^-Z^+ \quad (c1)$$

wherein $R^0$ represents a hydrocarbon group of 1 to 12 carbon atoms which may have a substituent, with the proviso that the carbon atom adjacent to the sulfur atom within the $-SO_3^-$ group has no fluorine atom bonded thereto; and $Z^+$ represents an organic cation.

3. The resist composition according to claim 1, wherein the amount of said organic compound (C) within said resist composition, relative to 100 parts by weight of said base component (A) is within the range of 0.1 to 10 parts by weight.

4. The resist composition according to claim 1, wherein said base component (A) is a base component which exhibits increased solubility in an alkali developing solution under action of acid.

5. The resist composition according to claim 4, wherein said base component (A) comprises a resin component (A1) which exhibits increased solubility in an alkali developing solution under action of acid, and said resin component (A1) has a structural unit (a1) derived from an acrylate ester containing an acid dissociable, dissolution inhibiting group.

6. The resist composition according to claim 5, wherein said resin component (A1) further has a structural unit (a2) derived from an acrylate ester containing a lactone-containing cyclic group.

7. The resist composition according to claim 5, wherein said resin component (A1) further has a structural unit (a3) derived from an acrylate ester containing a polar group-containing aliphatic hydrocarbon group.

8. A method of forming a resist pattern, comprising: forming a resist film using a resist composition of any one of claims 1 to 7; conducting exposure of said resist film; and alkali-developing said resist film to form a resist pattern.

* * * * *

UNITED STATES PATENT AND TRADEMARK OFFICE
CERTIFICATE OF CORRECTION

PATENT NO. : 8,012,669 B2
APPLICATION NO. : 12/400203
DATED : September 6, 2011
INVENTOR(S) : Hiroaki Shimizu et al.

It is certified that error appears in the above-identified patent and that said Letters Patent is hereby corrected as shown below:

At Page 1, (Item 75) after inventors, please change "Utumi" to --Utsumi--.

At Page 1 (Item 57) Abstract, Line 20, Change "$X-Q^1-Y^1-SO_3^+A^+$" to --$X-Q^1-Y^1-SO_3^-A^+$--.

At Column 6, Line 41, Change "tis" to --this--.

At Column 6, Line 67, Change "ten-heptyl" to --tert-heptyl--.

At Column 12, Line 47, Change "groups" to --group,--.

At Column 14, Line 36, Change "groups" to --group,--.

At Column 57, Line 15, Change "group," to --group;--.

At Column 68, Line 20, Change "(a-3-9)" to --(a2-3-9)--.

At Column 68, Line 25, Change "(a)," to --(a2),--.

At Column 69, Line 13 (Approx.), Change "hands" to --hand,--.

At Column 70, Line 23, Change "ranges" to --range,--.

At Column 73, Line 23, Change "-[A-C(=O)—$O_q$]—B—," to -- -[A-C(=O)—O]$_q$—B—,--.

At Column 83, Line 25, Change "(ad)" to --(a4).--.

At Column 83, Line 52, Change "convention" to --conventional--.

At Column 84, Line 17-18, Change "N-hydroxytrisdimethylatninophosphonium" to --N-hydroxytrisdimethylaminophosphonium--.

At Column 86, Line 3, Change "anlkylene" to --alkylene--.

At Column 86, Line 15 (Approx.), Change "—$C(CH_3)(CH_2CH_2CH_3$—" to -- —$C(CH_3)(CH_2CH_2CH_3)$— --.

At Column 86, Line 61, Change "—$CH_2CF_2CF_2CF_2$," to -- —$CH_2CF_2CF_2CF_2$— --.

Signed and Sealed this
Thirteenth Day of March, 2012

David J. Kappos
*Director of the United States Patent and Trademark Office*

At Column 88, Line 33, Change "ten-butoxy" to --tert-butoxy--.

At Column 89, Line 25, Change "adamantane" to --adamantane,--.

At Column 90, Line 48, After "for" delete "and".

At Column 93, Line 38, Change "phenyldiphenylsulfonium," to --phenyl)diphenylsulfonium,--.

At Column 94, Line 63, Change "ten" to --then--.

At Column 98, Line 23, Change "hands" to --hand,--.

At Column 98, Line 53, Change "(b0-1-5)" to --(b1-1-5)--.

At Column 98, Line 54, Change "(01-2-3)" to --(b1-2-3)--.

At Column 100, Line 14, Change "$R^7$," to --$R^7$--.

At Column 101, Line 4, Change "Z" to --$Z^-$--.

At Column 101, Line 7, Change "tan" to --than--.

At Column 101, Line 58, Change "Then" to --Then,--.

At Column 103, Line 7-10 (Structure 2-1) Change " 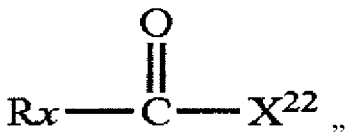 "

to -- 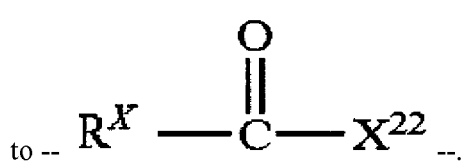 --.

At Column 107, Line 21, Change "solvent" to --solvent,--.

At Column 108, Line 11 (Approx.), Change "method" to --method.--.

At Column 112, Line 1, Change "phenantryl" to --phenanthryl--.

At Column 112, Line 38, Change "α-p-toluenesulfonyloxyimino)" to --α-(p-toluenesulfonyloxyimino)--.

At Column 112, Line 39, Change "α-p-chlorobenzenesulfonyloxyimino)" to --α-(p-chlorobenzenesulfonyloxyimino)--.

At Column 113, Line 4, Change "α-(metylsulfonyloxyimino)" to --α-(methylsulfonyloxyimino)--.

At Column 113, Line 8, Change "α-propylsulfonyloxyimino)" to --α-(propylsulfonyloxyimino)--.

At Column 113, Line 15 (Approx.), Change "WO 2004/074242A" to --WO 2004/074242A2--.

At Column 113, Line 54 (Approx.), Change "poly(bis-sulfonylzdiazomethanes," to --poly(bis-sulfonyl)diazomethanes,--.

CERTIFICATE OF CORRECTION (continued)
U.S. Pat. No. 8,012,669 B2

At Column 115, Line 8, Change "exposures" to --exposure,--.

At Column 117, Line 51, Change "ore" to --or--.

At Column 118, Line 3, Change "ore" to --or--.

At Column 118, Line 25, Change "t" to --$Z^+$--.

At Column 119, Line 37, Change "weight" to --weight,--.

At Column 120, Line 7, Change "tri-n-decanylamine," to --tri-n-decylamine,--.

At Column 121, Line 10 (Approx.), Change "(hereafter" to --(hereafter,--.

At Column 121, Line 66, Change "genera," to --general,--.

At Column 122, Line 46, Change "Moreover;" to --Moreover,--.

At Column 123, Line 11, Change "developing" to --developing.--.

At Column 123, Line 58, Change "at" to --as--.

At Column 124, Line 24, Change "inventions" to --invention,--.

At Column 125, Line 23, Change "tree-necked flask," to --three-necked flask.--.

At Column 125, Line 64, Change "tree-necked" to --three-necked--.

At Column 129, Line 44, Change "95.5%)," to --95.5%).--.

At Column 140, Line 56, Change "no" to --not--.

At Column 141, Line 64, Change "Bop," to --Eop,--.

At Column 142, Line 13, Change "(A, B C and D)" to --(A, B, C and D).--.

At Column 142, Line 64, After "sensitivity" insert --.--.

At Column 142, Line 67, Change "Fop" to --Eop--.

At Column 145, Line 10-11, Change "ethyldiisopropylaininocarbodiimide" to --ethyldiisopropylaminocarbodiimide--.

At Column 145, Line 20 (Approx.), Change "tree" to --three--.

At Column 146, Line 2, Change "(m, 2H,$H^j$)," to --(m, 2H,$H^J$).--.

At Column 148, Line 31, Change "Further;" to --Further,--.

At Column 148, Line 55, Change "hours" to --hours.--.

At Column 153, Line 59 (Approx.), Change "(m, 1H,ion)," to --(m, 1H,anion),--.

At Column 154, Line 39, Change "$^{19}$F-NMR," to --$^{19}$F-NMR.--.

At Column 154, Line 41, Change "(q, 2H9$H^b$)." to --(q, 2H,$H^b$).--.

At Column 155, Line 31, Change "below," to --below.--.

At Column 155, Line 60, Change "(p)" to --(k)--.

At Column 156, Line 66, Change "confined" to --confirmed--.

At Column 157, Line 61, After "below" insert --.--.

At Column 160, Line 42, Change "ten" to --then--.

At Column 160, Line 52, Change "product" to --(product--.

At Column 162, Line 5, Change "product" to --(product--.